US008674972B2

(12) United States Patent
Kurokawa et al.

(10) Patent No.: US 8,674,972 B2
(45) Date of Patent: Mar. 18, 2014

(54) SEMICONDUCTOR DEVICE

(75) Inventors: Yoshiyuki Kurokawa, Kanagawa (JP); Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 242 days.

(21) Appl. No.: 13/224,569

(22) Filed: Sep. 2, 2011

(65) Prior Publication Data

US 2012/0056861 A1    Mar. 8, 2012

(30) Foreign Application Priority Data

Sep. 8, 2010 (JP) .................................. 2010-200897
May 13, 2011 (JP) .................................. 2011-108192

(51) Int. Cl.
*G06F 3/038* (2013.01)
*G09G 5/00* (2006.01)

(52) U.S. Cl.
USPC ................. 345/207; 345/87; 257/43; 257/57; 257/59

(58) Field of Classification Search
USPC .................. 345/207, 87; 257/43, 57; 250/200
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Kevin M Nguyen
*Assistant Examiner* — Kenneth B Lee, Jr.
(74) *Attorney, Agent, or Firm* — Fish & Richardson P.C.

(57) ABSTRACT

The semiconductor device includes a plurality of photosensors arranged in matrix. The photosensors each include a photoelectric conversion element and an amplifier circuit. A backlight is turned on, an object to be detected is irradiated with light, and the photosensor in a p-th row performs the reset operation and the storage operation. After that, the backlight is turned off, and the photosensor in a (p+1)th row performs the reset operation and the storage operation. Then, the photosensors in all the rows sequentially perform the selection operation. A difference between output signals obtained from the photosensors in adjacent rows is obtained. Using the difference, a captured image of the object is generated and a region where the object exists is detected. The amplifier circuit includes a transistor for holding stored electric charge, in which a channel is formed in an oxide semiconductor layer.

20 Claims, 36 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,271,835 B2 | 9/2007 | Iizuka et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,523 B2 | 4/2009 | Yamazaki et al. |
| 7,663,165 B2 | 2/2010 | Mouli |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0157760 A1 | 7/2006 | Hayashi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018075 A1 | 1/2007 | Cazaux et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117991 A1 | 5/2010 | Koyama et al. |
| 2010/0182282 A1 | 7/2010 | Kurokawa et al. |
| 2010/0321356 A1* | 12/2010 | Brown et al. ............ 345/207 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-065239 A | 3/2007 |
| JP | 2009-187342 A | 8/2009 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED" AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kohei Tanaka et al.; "45.5: A System LCD with Optical Input Function using InfraRed Backlight Subtraction Scheme"; SID Digest '10: SID International Symposium Digest of Technical Papers; 2010; pp. 680-683.

Sanghun Jeon et al.; "180nm Gate Length Amorphous InGaZnO Thin Film Transistor for High Density Image Sensor Applications"; IEDM '10: Technical Digest of International Electron Devices Meeting; Dec. 6, 2010; pp. 504-507.

\* cited by examiner

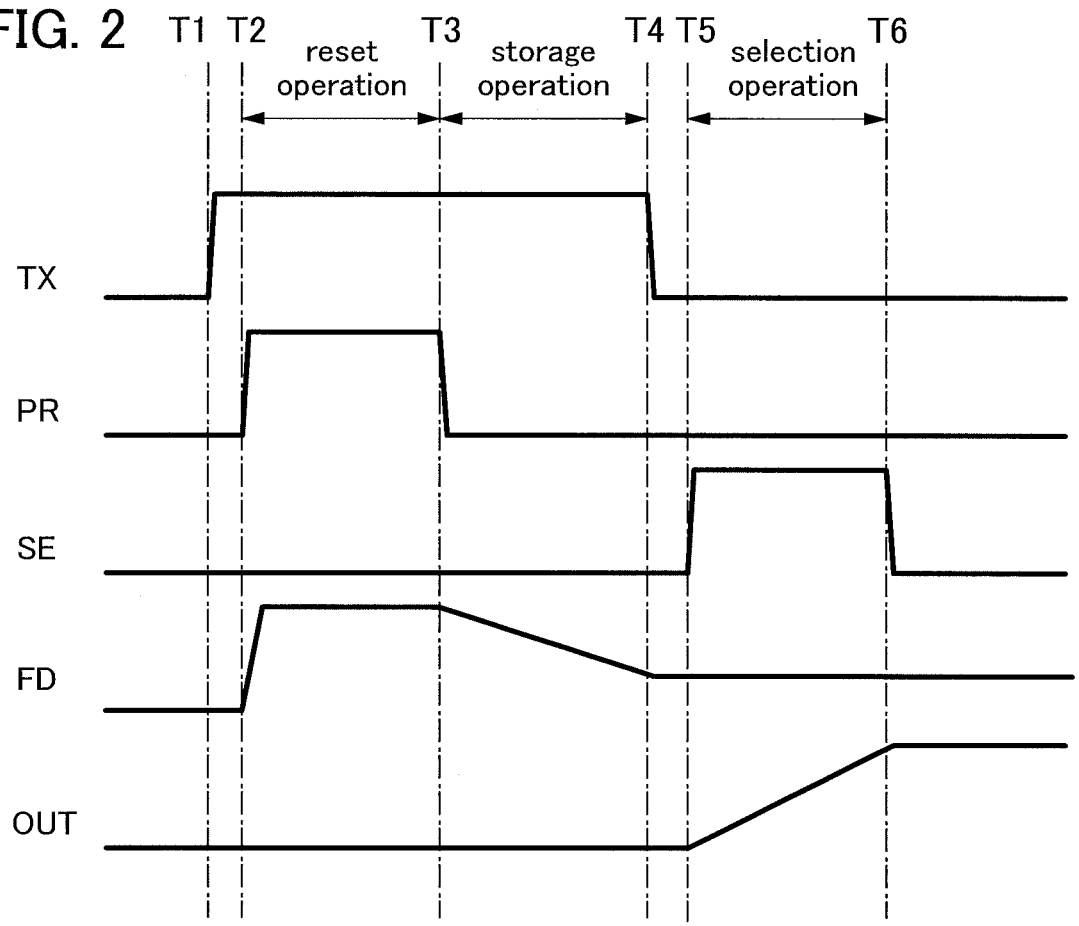

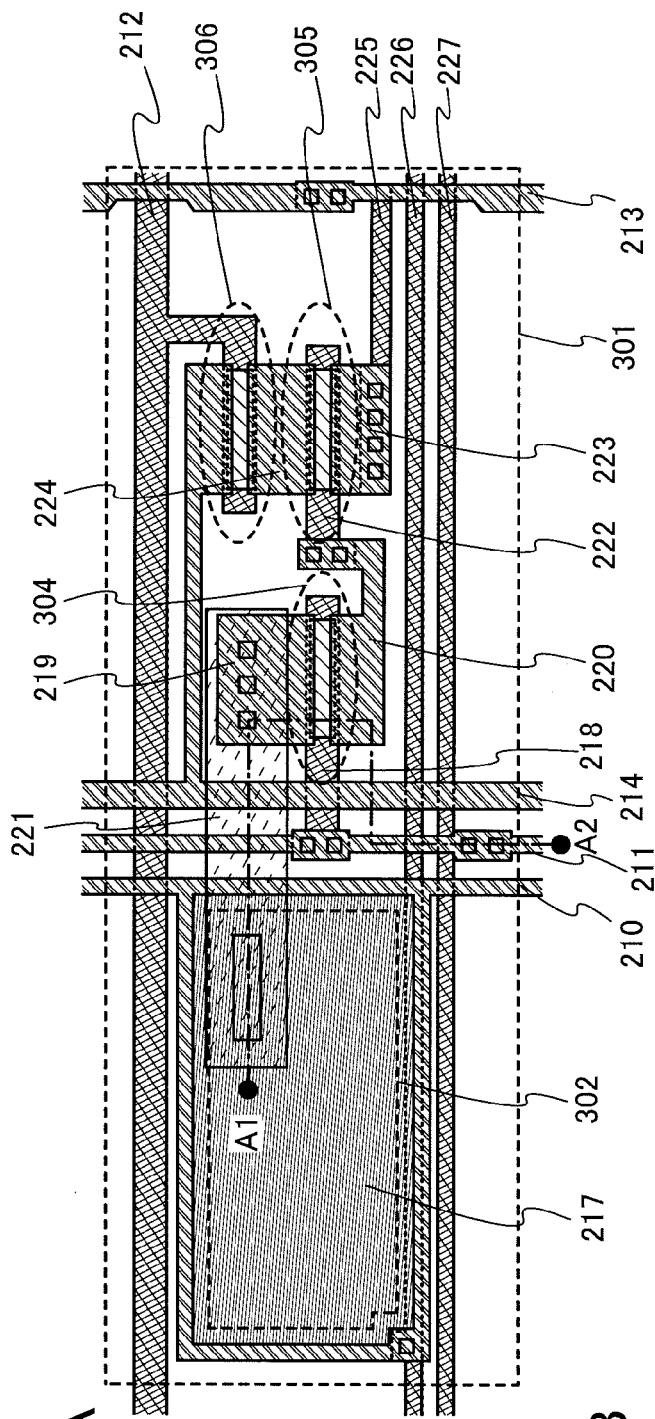
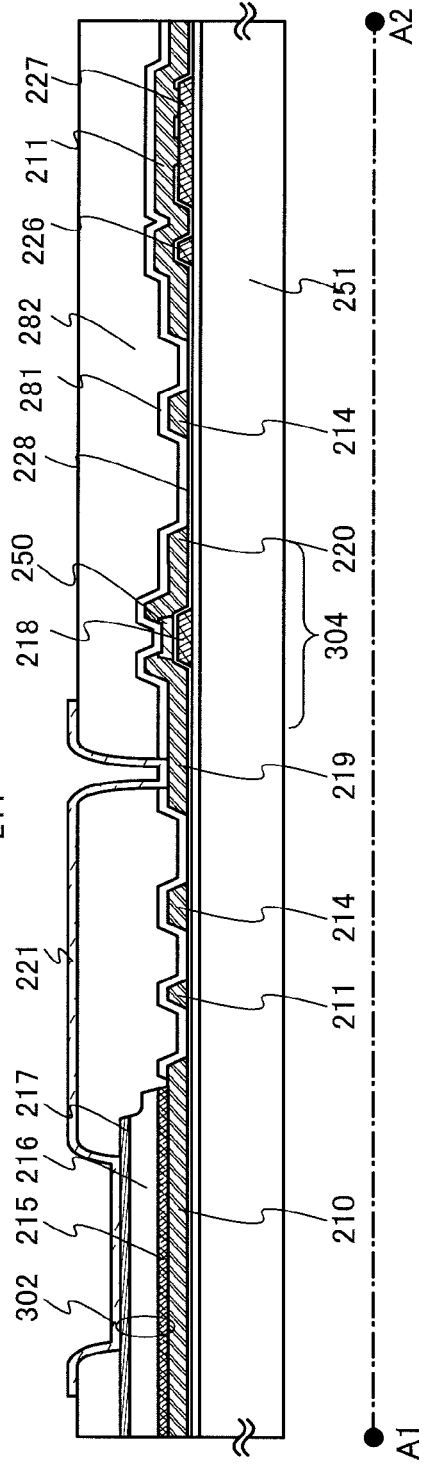
FIG. 10A
FIG. 10B

● In
☾ Sn
⌒ Zn
• O

- In
- Ga
- Zn
- O

SEMICONDUCTOR DEVICE

BACKGROUND OF THE INVENTION

1. Field of the Invention

The present invention relates to a semiconductor device including a photosensor. The present invention also relates to a semiconductor device including a photosensor and a display element. Further, the present invention relates to an electronic device including a semiconductor device.

2. Description of the Related Art

An example of a semiconductor device including a sensor that detects light (also referred to as a photosensor or an optical sensor) is a solid-state imaging device (also referred to as an image sensor) used in electronic devices such as digital still cameras and mobile phones.

In particular, a semiconductor device including a display element in addition to a photosensor is called a touch panel, a touchscreen, and the like (hereinafter simply referred to as a touch panel). In a semiconductor device including a photosensor and a display element, a display screen also serves as a data input region.

Examples of photosensors are a CMOS sensor and a CCD sensor. A CMOS sensor includes a photoelectric conversion element such as a photodiode and an amplifier circuit including a MOS transistor. The amount of photocurrent flowing through the photoelectric conversion element is determined by the intensity of light with which the photoelectric conversion element is irradiated. The amplifier circuit stores electric charge corresponding to the amount of photocurrent and generates an output signal that includes the amount of the electric charge as data. The CMOS sensor detects the amount of light that enters the photoelectric conversion element by performing the following operations by the amplifier circuit including a MOS transistor: an operation of discharging electric charge stored in the amplifier circuit (hereinafter referred to as the reset operation); an operation of storing electric charge corresponding to the amount of photocurrent flowing through the photoelectric conversion element (hereinafter referred to as the storage operation); and an operation of reading an output signal including the amount of the electric charge as data (hereinafter referred to as the selection operation). CMOS sensors can be fabricated through a general CMOS process. Thus, in a semiconductor device including a CMOS sensor as a photosensor, production costs can be reduced, and a display element can be formed over a substrate where the photosensor is formed. In addition, a CMOS sensor needs lower driving voltage than a CCD sensor; therefore, power consumption of the semiconductor device can be suppressed.

In a semiconductor device including photosensors, light is generated from the semiconductor device first. When an object to be detected exists, the light is blocked by the object and partly reflected. In the semiconductor device, the photosensors are arranged in matrix and detect the amount of light reflected from the object. In such a manner, the semiconductor device captures an image of an object to be detected and detects a region where the object exists.

In the above semiconductor device, noise due to external light needs to be reduced in order to detect a region where the object exists with high accuracy and to capture an image of the object with high accuracy. When noise due to external light is large, the S/N ratio at the time of detecting the amount of light reflected from the object is decreased; thus, the accuracy of detecting a region where the object exists is lowered, and the quality of a captured image is degraded. In particular, in the case where a display screen of a touch panel is used as a data input region, error and failure of input detection are caused.

In order to solve such a problem, a method disclosed in Non-Patent Document 1 is proposed. Non-Patent Document 1 discloses a semiconductor device including CMOS sensors arrange in matrix.

In the semiconductor device in Non-Patent Document 1, a backlight is turned on and an object to be detected is irradiated with light, photosensors in odd-numbered rows perform the reset operation and the storage operation. Then, the backlight is turned off, and photosensors in even-numbered rows perform the reset operation and the storage operation. The time interval of blinking the backlight is short, and it can be considered that an object to be detected hardly moves between when the backlight is on and when the backlight is off. Then, photosensors in adjacent two rows simultaneously perform the selection operation, and by sequentially repeating such an operation, the selection operation for the photosensors in all the rows is performed. Thus, a difference between output signals obtained from photosensors in adjacent rows is obtained. The difference is a signal component whose S/N ratio is improved because noise due to external light is cancelled. Non-Patent Document 1 proposes that a captured image of an object to be detected is generated with the difference.

REFERENCE

Non-Patent Document 1: K. Tanaka, et al., "A System LCD with Optical Input Function using Infra-Red Backlight Subtraction Scheme", SID2010 Digest, pp. 680-683

SUMMARY OF THE INVENTION

However, in the method disclosed in Non-Patent Document 1, the length of a period after the storage operation is performed and before the selection operation is started varies depending on photosensors. For example, the timing of performing the selection operation is the same in the photosensors in the first row and the photosensors in the second row, but the timing of performing the reset operation and the storage operation is earlier in the photosensors in the first row. Therefore, the length of a period after the reset operation and storage operation are performed and before the selection operation is started varies between the photosensors in the first row and those in the second row. Here, a photosensor is much affected by leakage due to the off-state current of a transistor as a period after the reset operation and storage operation are performed and before the selection operation is started is longer. That is, leakage of electric charge stored by the storage operation is increased as a period after the reset operation and storage operation are performed and before the selection operation is started is longer. Therefore, although noise due to external light can be reduced in the semiconductor device disclosed in Non-Patent Document 1, the length of a period after the reset operation and storage operation are performed and before the selection operation is started varies depending on photosensors; thus, noise due to leakage by the off-state current of a transistor is additionally caused.

In view of the above, an object is to reduce noise due to external light in a semiconductor device including photosensors and also reduce noise due to leakage by the off-state current of a transistor.

(Structure 1)

One embodiment of the invention disclosed herein is a semiconductor device including a plurality of photosensors arranged in a matrix of m rows (m is a natural number of 2 or more) and n columns (n is a natural number). The plurality of photosensors each include a photoelectric conversion element and an amplifier circuit. The amplifier circuit performs a reset operation of discharging an electric charge stored in the amplifier circuit, a storage operation of storing an electric charge corresponding to the amount of a photocurrent flowing through the photoelectric conversion element, and a selection operation of reading an output signal including the amount of the electric charge as data. A backlight is turned on, an object to be detected is irradiated with light, and the photosensor in a p-th row (p is a natural number of m or less) performs the reset operation and the storage operation. After that, the backlight is turned off, and the photosensor in a (p+1)th row performs the reset operation and the storage operation. Then, the photosensors in all the rows sequentially perform the selection operation. A difference between output signals obtained from the photosensors in adjacent rows is obtained. Using the difference, a captured image of the object is generated and a region where the object exists is detected. The amplifier circuit includes a transistor for holding stored electric charge. A channel of the transistor is formed in an oxide semiconductor layer.

In Structure 1, the backlight is turned on, the object to be detected is irradiated with light, and the photosensor in the p-th row (p is a natural number of m or less) performs the reset operation and the storage operation. After that, the backlight is turned off, and the photosensor in the (p+1)th row performs the reset operation and the storage operation. Alternatively, a semiconductor device may have the following Structure 2 in which a backlight is turned on, an object to be detected is irradiated with light, and a photosensor in a q-th column (q is a natural number of n or less) performs the reset operation and the storage operation, and then the backlight is turned off and a photosensor in a (q+1)th column performs the reset operation and the storage operation.
(Structure 2)

One embodiment of the invention disclosed herein is a semiconductor device including a plurality of photosensors arranged in a matrix of m rows (m is a natural number) and n columns (n is a natural number of 2 or more). The plurality of photosensors each include a photoelectric conversion element and an amplifier circuit. The amplifier circuit performs a reset operation of discharging an electric charge stored in the amplifier circuit, a storage operation of storing an electric charge corresponding to the amount of a photocurrent flowing through the photoelectric conversion element, and a selection operation of reading an output signal including the amount of the electric charge as data. A backlight is turned on, an object to be detected is irradiated with light, and the photosensor in the q-th column (q is a natural number of n or less) performs the reset operation and the storage operation. Then, the backlight is turned off, and the photosensor in the (q+1)th column performs the reset operation and the storage operation. After that, the photosensors in all the rows sequentially perform the selection operation. A difference between output signals obtained from the photosensors in adjacent columns is obtained. Using the difference, a captured image of the object is generated and a region where the object exists is detected. The amplifier circuit includes a transistor for holding stored electric charge. A channel of the transistor is formed in an oxide semiconductor layer.

Note that in Structure 1 and Structure 2, the timing of turning on the backlight and the timing of turning off the backlight may be reversed.

In the following structure, the configuration of the amplifier circuit and the like in the above structures is further specified.

One embodiment of the invention disclosed herein is a semiconductor device including a plurality of photosensors arranged in a matrix of m rows (m is a natural number of 2 or more) and n columns (n is a natural number of 2 or more), a first wiring, a second wiring, a third wiring, a fourth wiring, and a fifth wiring. The plurality of photosensors each include a photoelectric conversion element and an amplifier circuit. The amplifier circuit includes a first transistor, a second transistor, and a third transistor. The second transistor and the third transistor are electrically connected in series with each other between the first wiring and the second wiring. A gate of the second transistor is electrically connected to one of a source and a drain of the first transistor. The other of the source and the drain of the first transistor is electrically connected to one of a pair of electrodes of the photoelectric conversion element. The other of the pair of electrodes of the photoelectric conversion element is electrically connected to the fourth wiring. A gate of the first transistor is electrically connected to the third wiring. A gate of the third transistor is electrically connected to the fifth wiring.

The amplifier circuit performs a reset operation of discharging an electric charge stored in the amplifier circuit, a storage operation of storing an electric charge corresponding to an amount of a photocurrent flowing through the photoelectric conversion element, and a selection operation of reading an output signal including an amount of the electric charge as data.

In the reset operation, an electric charge stored at the gate of the second transistor is discharged by tuning off the third transistor with a potential of the fifth wiring, turning on the first transistor with a potential of the third wiring, and changing a potential of the fourth wiring to apply a forward bias voltage to the photoelectric conversion element.

The storage operation starts, after the reset operation, by changing the potential of the fourth wiring and applying a reverse bias voltage to the photoelectric conversion element while the third transistor is kept off with the potential of the fifth wiring and the first transistor is kept on with the potential of the third wiring. The storage operation finishes by turning off the first transistor with the potential of the third wiring.

The selection operation is performed by turning on the third transistor with the potential of the fifth wiring while the first transistor is kept off with the potential of the third wiring, and an amount of change of a potential of the second wiring due to a current flowing through the second transistor and the third transistor is an output signal of the photosensor.

Note that before the selection operation, an operation of setting the potential of the second wiring to a predetermined potential (hereinafter referred to as a precharge operation) may be performed.

In the above structure (the structure in which the configuration of the amplifier circuit and the like is specified), the following Structure 3 or Structure 4 is employed.
(Structure 3)

The backlight is turned on, the object to be detected is irradiated with light, and the photosensor in the p-th row (p is a natural number of m or less) performs the reset operation and the storage operation. After that, the backlight is turned off, and the photosensor in the (p+1)th row performs the reset operation and the storage operation. Then, the photosensors in all the rows sequentially perform the selection operation. A difference between output signals obtained from the photosensors in adjacent rows is obtained. Using the difference, a captured image of the object is generated and a region where the object exists is detected. Here, a channel of the first transistor is formed in an oxide semiconductor layer.

(Structure 4)

The backlight is turned on, the object to be detected is irradiated with light, and the photosensor in the q-th column (q is a natural number of n or less) performs the reset operation and the storage operation. After that, the backlight is turned off, and the photosensor in the (q+1)th column performs the reset operation and the storage operation. Then, the photosensors in all the rows sequentially perform the selection operation. A difference between output signals obtained from the photosensors in adjacent columns is obtained. Using the difference, a captured image of the object is generated and a region where the object exists is detected. Here, a channel of the first transistor is formed in an oxide semiconductor layer.

Note that in Structure 3 and Structure 4, the timing of turning on the backlight and the timing of turning off the backlight may be reversed.

Note that the time interval of blinking the backlight is short, and it can be considered that the object to be detected hardly moves between when the backlight is on and when the backlight is off.

For the oxide semiconductor layer, it is possible to use any of the following oxides: In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide which are oxides of four metal elements; In—Ga—Zn-based oxide (also referred to as IGZO), In—Sn—Zn-based oxide, In—Al—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; indium oxide, tin oxide, and zinc oxide. For example, an In—Sn—Ga—Zn-based oxide means a metal oxide containing indium (In), tin (Sn), gallium (Ga), and zinc (Zn), and there is no particular limitation on the composition ratio thereof. The above oxide semiconductor may include silicon.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, an oxide semiconductor expressed by a chemical formula of $InMO_3(ZnO)_m$ (m>0, where m is not an integer) can be used for the oxide semiconductor layer. Here, M represents one or more metal elements selected from Ga, Al, Fe, Mn, and Co. Alternatively, as the oxide semiconductor, a material expressed by a chemical formula of $In_3SnO_5(ZnO)_n$ (n>0, where n is an integer) may be used.

As the oxide semiconductor layer, an oxide semiconductor layer that is highly purified by reduction of impurities such as moisture, hydrogen, and alkali metal elements (e.g., sodium or lithium), which serve as electron donors (donors), is used. The concentration of hydrogen in the highly purified oxide semiconductor layer, which is measured by secondary ion mass spectrometry (SIMS), is less than or equal to $5 \times 10^{19}/cm^3$, preferably less than or equal to $5 \times 10^{18}/cm^3$, further preferably less than or equal to $5 \times 10^{17}/cm^3$, still more preferably less than or equal to $1 \times 10^{16}/cm^3$. The measurement value of the concentration of Na is less than or equal to $5 \times 10^{16}$ atoms/cm$^3$, preferably less than or equal to $1 \times 10^{16}$ atoms/cm$^3$, further preferably less than or equal to $1 \times 10^{15}$ atoms/cm$^3$. The measurement value of the concentration of Li is less than or equal to $5 \times 10^{15}$ atoms/cm$^3$, preferably less than or equal to $1 \times 10^{15}$ atoms/cm$^3$. The measurement value of the concentration of K is less than or equal to $5 \times 10^{15}$ atoms/cm$^3$, preferably less than or equal to $1 \times 10^{15}$ atoms/cm$^3$. In addition, the carrier density of the oxide semiconductor layer, which is measured by Hall effect measurement, is lower than $1 \times 10^{14}/cm^3$, preferably lower than $1 \times 10^{12}/cm^3$, further preferably lower than $1 \times 10^{11}/cm^3$. Further, the band gap of the oxide semiconductor is 2 eV or more, preferably 2.5 eV or more, further preferably 3 eV or more.

It is known that it is difficult to accurately obtain data in the proximity of a surface of a sample or in the proximity of an interface between stacked layers formed using different materials in principle when the concentrations of alkali metal elements and hydrogen in the layer are measured with SIMS. Thus, in the case where distributions of the concentrations of alkali metal elements and hydrogen in the layer in the thickness direction are analyzed by SIMS, an average value in a region of the layer where the value is not greatly changed and almost the same value can be obtained is employed as the concentrations of alkali metal elements and hydrogen. Further, in the case where the thickness of the layer to be measured is small, a region where almost the same value can be obtained cannot be found in some cases because of the influence of the concentrations of alkali metal elements and hydrogen of the layers adjacent to each other. In that case, the maximum value or the minimum value of the concentrations of alkali metal elements and hydrogen of a region where the layers are provided is employed as the concentrations of alkali metal elements and hydrogen of the layer. Furthermore, in the case where a mountain-shaped peak having the maximum value and a valley-shaped peak having the minimum value do not exist in the region where the layers are provided, the value of the inflection point is employed as the concentrations of alkali metal elements and hydrogen.

The off-state current density of the transistor whose channel is formed in the oxide semiconductor layer can be less than or equal to 100 yA/μm, preferably less than or equal to 10 yA/μm, further preferably less than or equal to 1 yA/μm.

In Structure 3, the third wiring can be shared between the photosensors in one row. Further, in Structure 3, the fourth wiring can be shared between the photosensors in one row.

In Structure 4, the third wiring can be shared between the photosensors in one column. Furthermore, in Structure 4, the fourth wiring can be shared between the photosensors in one column.

In Structure 3 and Structure 4, the fifth wiring can be shared between the photosensors in one row.

In Structure 3 and Structure 4, the first wiring can be shared between the photosensors in one column. Alternatively, in Structure 3 and Structure 4, the first wiring can be shared between the photosensors in one row.

In Structure 3 and Structure 4, the second wiring and the fifth wiring may intersect with each other.

Photosensors per row may sequentially perform the selection operation, or photosensors in a plurality of rows may simultaneously perform the selection operation.

The photoelectric conversion element can be a photodiode or a phototransistor.

In the case where a photodiode is used as the photoelectric conversion element, one of a pair of electrodes of the photodiode, which is electrically connected to the fourth wiring, serves as an anode, and the other electrode electrically connected to the first transistor serves as a cathode, the potential of the fourth wiring is set at a second potential that is higher than a first potential in the reset operation, and is set at the first potential in the storage operation. In such a manner, a forward bias voltage is applied to the photodiode in the reset operation, and a reverse bias voltage is applied in the storage operation.

In the case where a photodiode is used as the photoelectric conversion element, one of a pair of electrodes of the photodiode, which is electrically connected to the fourth wiring, serves as a cathode, and the other electrode electrically connected to the first transistor serves as an anode, the potential of the fourth wiring is set at a second potential that is lower than a first potential in the reset operation, and is set at the first potential in the storage operation. In such a manner, a forward bias voltage is applied to the photodiode in the reset operation, and a reverse bias voltage is applied in the storage operation.

The semiconductor device may further include a plurality of display elements arranged in matrix. The density of the plurality of photosensors and that of the plurality of display elements may be the same or different. That is, one photosensor may be provided for one display element; one photosensor may be provided for two or more display elements; or one display element may be provided for two or more photosensors.

The backlight can include at least one of a light source that emits visible light and a light source that emits infrared light.

The display element can include a liquid crystal element. A plurality of liquid crystal elements arranged in matrix display images by controlling the transmittance of light from the backlight.

In addition, the display element may include a light-emitting element. A light-emitting element is an element whose luminance is controlled by current or voltage. Examples are a light-emitting diode and an organic light-emitting diode (OLED). In the case of using a light-emitting element for the display element, a plurality of light-emitting elements arranged in matrix may emit light to serve as a backlight.

A transistor whose channel is formed in an oxide semiconductor layer has an extremely low off-state current and high withstand voltage. Its off-state current is extremely lower than that of a transistor including silicon. In particular, an oxide semiconductor layer which is highly purified by reduction of impurities such as moisture, hydrogen, or alkali metal elements which serve as electron donors (donors) and in which oxygen vacancies are reduced is an i-type (intrinsic) semiconductor or a substantially i-type semiconductor. For that reason, the off-state current of the transistor whose channel is formed in the oxide semiconductor layer is extremely low.

In the present invention, a transistor whose channel is formed in an oxide semiconductor layer is used as the transistor (first transistor) which holds electric charge stored in the photosensor. Thus, noise due to leakage by the off-state current of the transistor can be reduced even in a semiconductor device including photosensors in which the period after the reset operation and storage operation are performed and before the selection operation is started varies in length in order to obtain a signal component whose S/N ratio is improved because noise due to external light is cancelled.

In a transistor including an oxide semiconductor layer with a reduced concentration of alkali metal and alkaline earth metal, deterioration of characteristics (e.g., normally-on state of the transistor (negative shift of the threshold voltage) and the decrease in mobility) or variations in characteristics are not much caused. This is because alkali metal and alkaline earth metal are adverse impurities in the oxide semiconductor layer. When an insulating film in contact with the oxide semiconductor layer is an oxide, an alkali metal, in particular, Na diffuses into the oxide and becomes Na$^+$. In addition, Na cuts the bond between a metal and oxygen or enters the bond in the oxide semiconductor layer, which causes deterioration of transistor characteristics (e.g., the transistor becomes normally on (the threshold voltage shifts negatively) or the mobility is decreased). In addition, this also causes variation in the characteristics. Such a problem is significant especially in the case where the hydrogen concentration in the oxide semiconductor layer is sufficiently low. Therefore, when the concentration of an alkali metal element is reduced to the above-described value in the case where the hydrogen concentration in the oxide semiconductor layer is lower than or equal to $5\times10^{19}$ atoms/cm$^3$, particularly lower than or equal to $5\times10^{18}$ atoms/cm$^3$, deterioration and variations in characteristics of a transistor whose channel is formed in the oxide semiconductor layer can be suppressed. By using a transistor whose channel is formed in such an oxide semiconductor layer as the transistor (first transistor) which holds electric charge stored in the photosensor, the reliability of the photosensor can be increased and thus the reliability of the semiconductor device can be increased.

Accordingly, in a semiconductor device including a photosensor, noise due to external light is reduced and noise due to leakage by the off-state current of a transistor is reduced, so that the reliability can be increased.

BRIEF DESCRIPTION OF THE DRAWINGS

In the accompanying drawings:

FIG. 2 is a timing chart illustrating the operations of a photosensor;

FIGS. 10A and 10B are a top view and a cross-sectional view of a photosensor;

DETAILED DESCRIPTION OF THE INVENTION

Figure 1A:
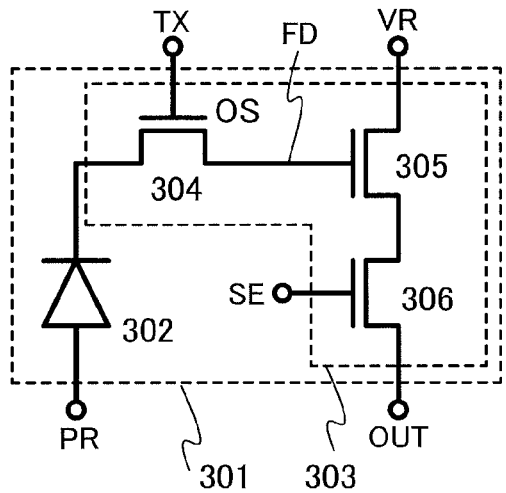
FIGS. 1A and 1B are each a circuit diagram of a photosensor.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

The "source electrode" and "drain electrode" of a transistor interchange with each other depending on the polarity of the transistor or difference between the levels of potentials applied to the electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. In the description below, one of a source electrode and a drain electrode is referred to as a first terminal and the other thereof is referred to as a second terminal.

Note that "electrical connection" in this specification corresponds to the state where current, voltage, or potential can be supplied or transmitted. Therefore, a state of electrical connection means not only a state of direct connection but also a state of indirect connection through a circuit element such as a wiring, a resistor, a diode, or a transistor, in which current, voltage, or a potential can be supplied or transmitted.

Even when a circuit diagram illustrates independent components that are connected to each other, there is a case where one conductive film has functions of a plurality of components, such as the case where part of a wiring functions as an electrode.

In this specification, a state in which transistors are electrically connected in series with each other means, for example, a state in which only one of a first terminal and a second terminal of one transistor is electrically connected to only one of a first terminal and a second terminal of another transistor. Further, a state in which transistors are electrically connected in parallel with each other means a state in which a first terminal of one transistor is electrically connected to a first terminal of another transistor and a second terminal of one transistor is electrically connected to a second terminal of another transistor.

Unless otherwise specified, in this specification, the off-state current of an n-channel transistor is a current that flows between a source electrode and a drain electrode when the potential of the drain electrode is higher than that of the source electrode and that of a gate electrode, in the case where the potential of the gate electrode is less than or equal to 0 when a reference potential is the potential of the source electrode. Moreover, in this specification, the off-state current of a p-channel transistor is a current that flows between a source electrode and a drain electrode when the potential of the drain electrode is lower than that of the source electrode and that of a gate electrode, in the case where the potential of the gate electrode is greater than or equal to 0 when a reference potential is the potential of the source electrode.

In circuit diagrams, "OS" is sometimes written beside a transistor whose channel is formed in an oxide semiconductor layer.

Embodiment 1

In this embodiment, a specific structure of a semiconductor device according to one embodiment of the present invention will be described.

FIG. 1A is an example of a circuit diagram illustrating a configuration of a photosensor 301 included in a semiconductor device. The photosensor 301 includes a photodiode 302 and an amplifier circuit 303. The photodiode 302 is a photoelectric conversion element that has properties of generating current when irradiated with light, and the amount of photocurrent flowing therethrough is decided by the intensity of irradiation light. The amplifier circuit 303 stores electric charge corresponding to the photocurrent, and generates an output signal that includes the amount of the electric charge as data.

The amplifier circuit 303 includes a transistor 304 that functions as a switching element for controlling supply of photocurrent in the amplifier circuit 303, a transistor 305 in which the current or the resistance between its first terminal and second terminal is determined in accordance with a potential applied to a second terminal of the transistor 304, and a transistor 306 that functions as a switching element for supplying a potential of an output signal determined by the current or the resistance to a wiring OUT. Note that the transistor 304 corresponds to a transistor that holds electric charge corresponding to photocurrent of the photodiode 302.

In FIG. 1A, an anode of the photodiode 302 is electrically connected to a wiring PR. A cathode of the photodiode 302 is electrically connected to a first terminal of the transistor 304.

The second terminal of the transistor 304 is electrically connected to a gate of the transistor 305. A gate of the transistor 304 is electrically connected to a wiring TX. The wiring TX is supplied with a potential of a signal for controlling switching of the transistor 304. The first terminal of the transistor 305 is electrically connected to a wiring VR. The wiring VR is supplied with a predetermined potential, for example, a high-level power supply potential VDD. The second terminal of the transistor 305 is electrically connected to a first terminal of the transistor 306. A second terminal of the transistor 306 is electrically connected to the wiring OUT. A gate of the transistor 306 is electrically connected to a wiring SE. The wiring SE is supplied with a potential of a signal for controlling switching of the transistor 306. The wiring OUT is supplied with a potential of an output signal that is output from the amplifier circuit 303.

Features of the present invention include a transistor whose channel is formed in an oxide semiconductor layer used as the transistor 304. That is, an oxide semiconductor film is used as an active layer of the transistor 304.

For the oxide semiconductor layer, it is possible to use any of the following oxides: In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide which are oxides of four metal elements; In—Ga—Zn-based oxide (also referred to as IGZO), In—Sn—Zn-based oxide, In—Al—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; indium oxide, tin oxide, and zinc oxide. For example, an In—Sn—Ga—Zn-based oxide means a metal oxide containing indium (In), tin (Sn), gallium (Ga), and zinc (Zn), and there is no particular limitation on the composition ratio thereof. The above oxide semiconductor may include silicon.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, an oxide semiconductor expressed by a chemical formula of $InMO_3(ZnO)_m$ (m>0, where m is not an integer) can be used for the oxide semiconductor layer. Here, M represents one or more metal elements selected from Ga, Al, Fe, Mn, and Co. Alternatively, as the oxide semiconductor, a material expressed by a chemical formula of $In_3SnO_5(ZnO)_n$ (n>0, where n is an integer) may be used.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions.

Without limitation to the above, an oxide semiconductor with an appropriate composition ratio can be used in accordance with desired semiconductor characteristics (e.g., mobility, threshold voltage, and variation). In order to obtain needed semiconductor characteristics, an oxide semiconductor preferably has appropriate carrier concentration, impurity concentration, defect density, atomic ratio of a metal element to oxygen, bond distance, density, or the like.

For example, high mobility can be relatively easily obtained with an In—Sn—Zn-based oxide. Even when an In—Ga—Zn-based oxide is used, the mobility can be increased by a reduction in bulk defect density.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \le r^2$, and r may be 0.05, for example. The same can be applied to other oxides.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained with relative ease. When a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by the following Formula 1.

$$Ra = \frac{1}{S_0} \int_{y_1}^{y_2} \int_{x_1}^{x_2} \left| f(x, y) - Z_0 \right| dx\, dy \quad \text{[Formula 1]}$$

Note that in Formula 1, $S_0$ represents the area of a measurement surface (a rectangular region defined by four points represented by the coordinates $(x_1,y_1)$, $(x_1,y_2)$, $(x_2,y_1)$, and $(x_2,y_2)$), and $Z_0$ represents average height of the measurement surface. Further, $R_a$ can be measured with an atomic force microscope (AFM).

As the oxide semiconductor layer, an oxide semiconductor layer that is highly purified by reduction of impurities such as moisture, hydrogen, and alkali metal elements (e.g., sodium or lithium), which serve as electron donors (donors), is used. The concentration of hydrogen in the highly purified oxide semiconductor layer, which is measured by secondary ion mass spectrometry (SIMS), is less than or equal to $5\times10^{19}/cm^3$, preferably less than or equal to $5\times10^{18}/cm^3$, further preferably less than or equal to $5\times10^{17}/cm^3$, still more preferably less than or equal to $1\times10^{16}/cm^3$. The measurement value of the concentration of Na is less than or equal to $5\times10^{16}$ atoms/cm$^3$, preferably less than or equal to $1 \times 10^{16}$ atoms/cm$^3$, further preferably less than or equal to $1 \times 10^{15}$ atoms/cm$^3$. The measurement value of the concentration of Li is less than or equal to $5 \times 10^{15}$ atoms/cm$^3$, preferably less than or equal to $1 \times 10^{15}$ atoms/cm$^3$. The measurement value of the concentration of K is less than or equal to $5 \times 10^{15}$ atoms/cm$^3$, preferably less than or equal to $1 \times 10^{15}$ atoms/cm$^3$. In addition, the carrier density of the oxide semiconductor layer, which is measured by Hall effect measurement, is lower than $1 \times 10^{14}$/cm$^3$, preferably lower than $1 \times 10^{12}$/cm$^3$, further preferably lower than $1 \times 10^{11}$/cm$^3$. Further, the band gap of the oxide semiconductor is 2 eV or more, preferably 2.5 eV or more, further preferably 3 eV or more.

Specifically, low off-state current of the transistor whose channel is formed in a highly purified oxide semiconductor layer can be proved by various experiments. For example, even when a transistor has a channel width of $1 \times 10^6$ μm and a channel length of 10 μm, the off-state current (drain current at the time when voltage between a gate electrode and a source electrode is 0 V or less) can be less than or equal to the measurement limit of a semiconductor parameter analyzer, that is, less than or equal to $1 \times 10^{-13}$ A with the voltage between the source electrode and a drain electrode (drain voltage) of 1 V to 10 V. In this case, it can be found that the off-state current density corresponding to a value obtained by dividing the off-state current by the channel width of the transistor is less than or equal to 100 zA/μm. In addition, a capacitor and a transistor are connected to each other and the off-state current density is measured with a circuit in which electric charge flowing into or from the capacitor is controlled by the transistor. In the measurement, a highly purified oxide semiconductor layer is used for a channel formation region of the transistor, and the off-state current density of the transistor is measured by a change in the amount of electric charge of the capacitor per unit time. As a result, it is found that in the case where the voltage between the source electrode and the drain electrode of the transistor is 3 V, a lower off-state current density of several tens of yoctoamperes per micrometer (yA/μm) can be obtained. The off-state current density of a transistor whose channel is formed in a highly purified oxide semiconductor layer can be less than or equal to 100 yA/μm, preferably less than or equal to 10 yA/μm, further preferably less than or equal to 1 yA/μm depending on the voltage between a source electrode and a drain electrode. Consequently, the transistor whose channel is formed in a highly purified oxide semiconductor layer has much lower off-state current than a transistor including crystalline silicon.

In such a manner, the off-state current of the transistor 304 can be extremely low. Since the transistor 304 serves as a switching element for holding electric charge stored in the photosensor 301, leakage of electric charge in a period after the storage operation is performed and before the selection operation is started (hereinafter also referred to as a charge retention period) can be suppressed. Furthermore, by using a transistor whose channel is formed in an oxide semiconductor layer as the transistor 304 instead of a transistor whose channel is formed in a layer of an amorphous semiconductor material, the mobility of the transistor 304 can be increased.

In FIG. 1A, the transistors 305 and 306 included in the amplifier circuit 303 may be a transistor whose channel is formed in an oxide semiconductor layer, or may be a transistor whose channel is formed in a layer or a substrate made of a semiconductor material other than an oxide semiconductor. Examples of a semiconductor material other than an oxide semiconductor are silicon and germanium. Note that a layer or a substrate made of a semiconductor material other than an oxide semiconductor may be amorphous, microcrystalline, polycrystalline, or single crystal.

The use of a transistor whose channel is formed in an oxide semiconductor layer as the transistor 305 can prevent an unnecessary potential from being output to the wiring OUT. Further, in that case, the mobility of the transistor 305 can be increased as compared to the case of using a transistor whose channel is formed in a layer of an amorphous semiconductor material as the transistor 305.

The use of a transistor whose channel is formed in an oxide semiconductor layer as the transistor 306 can prevent an unnecessary potential from being output to the wiring OUT. Further, in that case, the mobility of the transistor 306 can be increased as compared to the case of using a transistor whose channel is formed in a layer of an amorphous semiconductor material as the transistor 306.

Note that by using the same semiconductor material for active layers of all the transistors in the photosensor 301, the manufacturing process of a semiconductor device can be simplified. For example, by using an oxide semiconductor film for the active layers of all the transistors in the photosensor 301, the manufacturing process of a semiconductor device can be simplified.

When a semiconductor material capable of providing higher mobility than an oxide semiconductor, such as polycrystalline or single crystal silicon, is used for the active layers of the transistors 305 and 306, data can be read from the photosensor 301 at high speed.

Providing a capacitor for the wiring OUT is effective in stabilizing the potential of the wiring OUT.

Figure 1B:
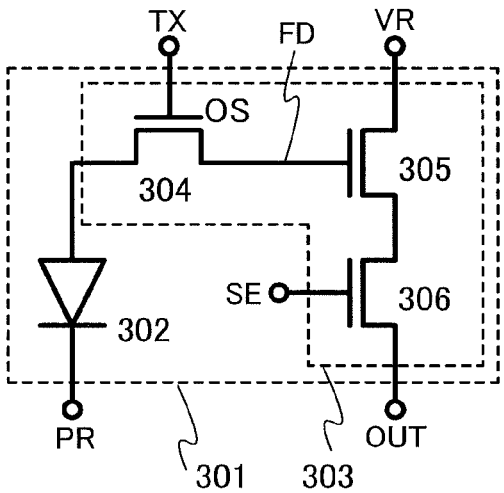

Note that FIG. 1A illustrates the structure in which the anode of the photodiode 302 is electrically connected to the wiring PR and the cathode of the photodiode 302 is electrically connected to the first terminal of the transistor 304; however, this embodiment is not limited to this structure. As illustrated in FIG. 1B, the cathode of the photodiode 302 may be electrically connected to the wiring PR and the anode of the photodiode 302 may be electrically connected to the first terminal of the transistor 304.

In addition, FIGS. 1A and 1B show the structure in which the transistor 305 and the transistor 306 are electrically connected in series in this order between the wiring VR and the wiring OUT. However, this embodiment is not limited to this structure, and the connection order of the transistors 305 and 306 may be reversed. That is, the transistor 306 and the transistor 305 may be electrically connected in series in this order between the wiring VR and the wiring OUT.

In FIGS. 1A and 1B, a node where the second terminal of the transistor 304 and the gate of the transistor 305 are electrically connected to each other is denoted by a node FD. The potential of the output signal of the amplifier circuit 303 is decided by the amount of electric charge stored at the node FD. In order to hold electric charge at the node FD more reliably, a capacitor may be electrically connected to the node FD.

Note that FIGS. 1A and 1B illustrate the case where the wiring PR, the wiring SE, the wiring TX, and the wiring OUT are connected to the photosensor 301; however, the number of wirings included in the photosensor 301 in one embodiment of the present invention is not limited to the number in this example. In addition to the above wirings, a wiring supplied with a potential of a signal for resetting the amount of electric charge held in the amplifier circuit 303, or the like may be connected to the photosensor 301.

Note that although FIGS. 1A and 1B illustrate the configuration of the photosensor 301 in which the amplifier circuit 303 includes only one transistor 304 functioning as a switching element, the present invention is not limited to this configuration. In one embodiment of the present invention, one transistor functions as one switching element; alternatively, a plurality of transistors may function as one switching element. In the case where a plurality of transistors function as one switching element, the plurality of transistors may be electrically connected to each other in parallel, in series, or in a combination of parallel and series connections.

FIGS. 1A and 1B illustrate the case where the transistor 304 includes a gate electrode on one side of the active layer. Alternatively, the transistor 304 may include a pair of gate electrodes with the active layer placed therebetween. In the case where the transistor 304 includes a pair of gate electrodes with the active layer placed therebetween, one of the gate electrodes can be supplied with a signal for controlling switching of the transistor 304, and the other of the gate electrodes can be supplied with a predetermined potential. In that case, potentials with the same level may be applied to the pair of gate electrodes, or a fixed potential such as a ground potential may be applied only to the other of the gate electrodes. By controlling the level of a potential applied to the other of the gate electrodes, the threshold voltage of the transistor 304 can be controlled. Note that the other of the gate electrodes may be in a floating state, which is an electrically insulated state, as long as the threshold voltage of the transistor 304 is not adversely affected.

The above is the description of the configuration of the photosensor 301.

Next, the operation of the photosensor 301 will be described. FIG. 2 is an example of a timing chart showing changes in potentials of the wirings (the wiring TX, the wiring PR, the wiring SE, and the wiring OUT) and the node FD illustrated in FIG. 1A.

Note that in the timing chart illustrated in FIG. 2, for easy understanding of the operation of the photosensor 301, it is assumed that the wiring TX, the wiring SE, and the wiring PR are supplied with a high-level potential or a low-level potential. Specifically, it is assumed that the wiring TX is supplied with a high-level potential HTX and a low-level potential LTX; the wiring SE, a high-level potential HSE and a low-level potential LSE; and the wiring PR, a high-level potential HPR and a low-level potential LPR.

Note that the case where all of the transistors 304, 305, and 306 are n-channel transistors is described. However, the present invention is not limited to this example, and one or more of the transistors 304, 305, and 306 may be p-channel transistors. In the case where one or more of the transistors 304, 305, and 306 are p-channel transistors, the potential of each wiring is set so that the on state and off state of the transistors are the same as in the following description.

First, at a time T1, the potential of the wiring TX is changed from the potential LTX to the potential HTX. When the potential of the wiring TX is changed to the potential HTX, the transistor 304 is turned on. Note that at the time T1, the wiring SE is supplied with the potential LSE, and the wiring PR is supplied with the potential LPR.

At a time T2, the potential of the wiring PR is changed from the potential LPR to the potential HPR. At the time T2, the potential of the wiring TX is kept at the potential HTX, and the potential of the wiring SE is kept at the potential LSE. A forward bias voltage is applied to the photodiode 302. Accordingly, the potential HPR of the wiring PR is supplied to the node FD; thus, the amount of electric charge held at the node FD is discharged.

At a time T3, the potential of the wiring PR is changed from the potential HPR to the potential LPR. Until shortly before the time T3, the potential of the node FD is kept at the potential HPR. Thus, when the potential of the wiring PR is changed to the potential LPR, a reverse bias voltage is applied to the photodiode 302. Then, when light (e.g., light reflected from an object to be detected) enters the photodiode 302 in a state where a reverse bias voltage is applied to the photodiode 302, a current (photocurrent) flows from the cathode toward the anode of the photodiode 302. The value of photocurrent varies in accordance with the intensity of incident light. That is, as the intensity of light entering the photodiode 302 is higher, the value of photocurrent is higher and the amount of electric charge transferred between the node FD and the photodiode 302 is larger. On the other hand, as the intensity of light entering the photodiode 302 is lower, the value of photocurrent is lower and the amount of electric charge transferred between the node FD and the photodiode 302 is smaller. Thus, the higher the intensity of light becomes, the larger the amount of change in the potential of the node FD becomes; the lower the intensity of light becomes, the smaller the amount of change becomes.

At a time T4, when the potential of the wiring TX is changed from the potential HTX to the potential LTX, the transistor 304 is turned off. Accordingly, the movement of electric charge between the node FD and the photodiode 302 is stopped, so that the potential of the node FD is decided.

At a time T5, when the potential of the wiring SE is changed from the potential LSE to the potential HSE, the transistor 306 is turned on. Then, electric charge is transferred between the wiring VR and the wiring OUT in accordance with the potential of the node FD.

Note that an operation of setting the potential of the wiring OUT to a predetermined potential (precharge operation) is completed before the time T5. FIG. 2 shows the case where the potential of the wiring OUT is precharged to a low-level potential before the time T5 and increased from the time T5 to a time T6 in accordance with the light intensity; however, the present invention is not limited to this case. The potential of the wiring OUT may be precharged to a high-level potential before the time T5 and decreased from the time T5 to the time T6 in accordance with the light intensity.

The precharge operation can be conducted in the following manner, for example: the wiring OUT and a wiring supplied with a predetermined potential are made electrically connected to each other through a switching element such as a transistor and the transistor is turned on. After the precharge operation is completed, the transistor is turned off.

At the time T6, when the potential of the wiring SE is changed from the potential HSE to the potential LSE, the movement of electric charge from the wiring VR to the wiring OUT is stopped and the potential of the wiring OUT is decided. The potential of the wiring OUT corresponds to the potential of the output signal of the photosensor 301. The potential of the output signal includes data on an object to be detected.

The above-described series of operations of the photosensor 301 can be classified into a reset operation, a storage operation, and a selection operation. In other words, the operation from the time T2 to the time T3 corresponds to the reset operation; the operation from the time T3 to the time T4, the storage operation; and the operation from the time T5 to the time T6, the read operation. Furthermore, a period after the storage operation is finished and before the selection operation is started, that is, a period from the time T4 to the time T5 corresponds to a charge retention period in which electric charge is held at the node FD.

Here, when the potential of the wiring TX is changed at the time T1 and the time T4, the potential of the node FD is changed by capacitive coupling between the wiring TX and the node FD. If the potential of the node FD is largely changed, the output signal cannot be correctly output. A reduction in the capacitance between the gate and source or between the gate and drain of the transistor 304 is effective in suppressing the change of the potential of the node FD at the time of changing the potential of the wiring TX. Moreover, it is effective to increase the gate capacitance of the transistor 305. Further, it is effective to electrically connect a capacitor to the node FD. Note that a change in the potential of the node FD at the time of changing the potential of the wiring TX is considered negligible in FIG. 2, for example, by taking these measures.

The above is the description of the operation of the photosensor 301.

Figure 1C:
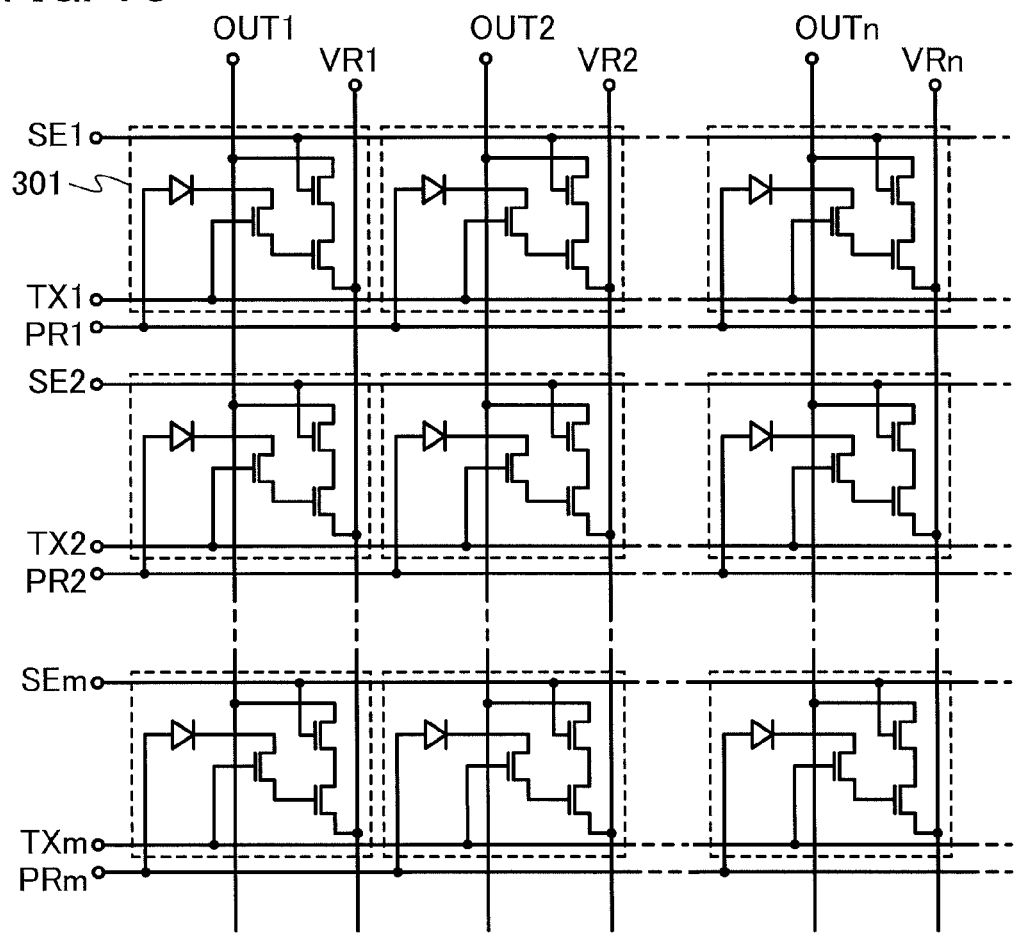
FIG. 1C is a circuit diagram of a plurality of photosensors arranged in matrix.

Next, FIG. 1C illustrates an example of a configuration of a semiconductor device including a matrix of a plurality of photosensors 301 shown in FIG. 1A.

In FIG. 1C, a plurality of photosensors 301 are arranged in a matrix of m rows (m is a natural number of 2 or more) and n columns (n is a natural number of 2 or more). The photosensors 301 in one row are electrically connected to one of a plurality of wirings PR (wirings PR1 to PRm), one of a plurality of wirings TX (wirings TX1 to TXm), and one of a plurality of wirings SE (wirings SE1 to SEm). The photosensors 301 in one column are electrically connected to one of a plurality of wirings OUT (wirings OUT1 to OUTn) and one of a plurality of wirings VR (wirings VR1 to VRn).

In FIG. 1C, the photosensors in one row share the wiring TX, the wiring PR, and the wiring SE. The photosensors in one column share the wiring OUT and the wiring VR. However, the present invention is not limited to this structure. Two or more wirings TX may be provided for one row and electrically connected to different photosensors 301. Two or more wirings PR may be provided for one row and electrically connected to different photosensors 301. Two or more wirings SE may be provided for one row and electrically connected to different photosensors 301. Two or more wirings OUT may be provided for one column and electrically connected to different photosensors 301. Two or more wirings VR may be provided for one column and electrically connected to different photosensors 301.

FIG. 1C shows the structure where the photosensors in one column share the wiring VR; however, the present invention is not limited to this structure. The wiring VR may be shared between the photosensors in one row.

Further, the wiring TX can be shared between photosensors that concurrently perform the reset operation and the storage operation among the photosensors 301 arranged in the matrix of M rows and n columns. The wiring PR can be shared between photosensors that concurrently perform the reset operation and the storage operation among the photosensors 301 arranged in the matrix of m rows and n columns.

As described above, wirings are shared between photosensors to reduce the number of wirings, whereby a driver circuit for driving the photosensors 301 arranged in the matrix of in rows and n columns can be simplified.

Next, an example of the operation of a semiconductor device including the photosensors 301 arranged in the matrix of m rows and n columns illustrated in FIG. 1C will be described with reference to FIG. 3.

Note that the operations of the photosensors 301 are the same as in the above description using FIG. 2. FIG. 3 illustrates the relation between the reset operation, storage operation, and selection operation of the photosensors 301 in different rows.

A backlight is turned on, an object to be detected is irradiated with light, and the photosensor in a p-th row (p is a natural number of m or less) performs the reset operation and the storage operation. Then, the backlight is turned off, and the photosensor in a (p+1)th row performs the reset operation and the storage operation. FIG. 3 typically shows the potentials of the wirings PR (PRp to PR(p+3)), the wirings TX (TXp to TX(p+3)), and the wirings SE (SEp to SE(p+3)) in the photosensors in the p-th row to (p+3)th row.

A period during which the photosensors in the p-th row and (p+2)th row perform the reset operation is denoted by TRp. A period during which the photosensors in the (p+1)th row and (p+3)th row perform the reset operation is denoted by TR(p+1). A period during which the photosensors in the p-th row and (p+2)th row perform the storage operation is denoted by TIp. A period during which the photosensors in the (p+1)th row and (p+3)th row perform the storage operation is denoted by TI(p+1). A period during which the photosensor in the p-th row performs the selection operation is denoted by TSp. A period during which the photosensor in the (p+1)th row performs the selection operation is denoted by TS(p+1).

Figure 3:
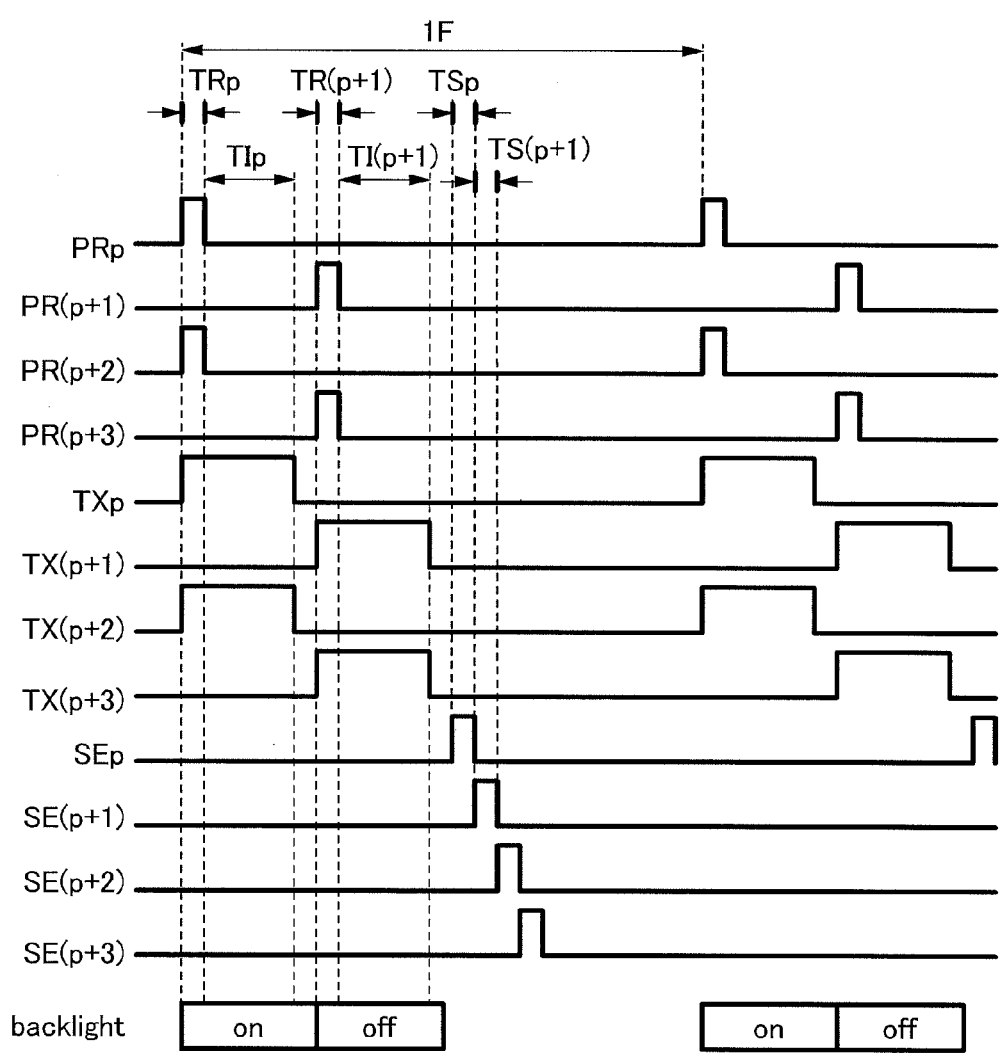
FIG. 3 is a timing chart illustrating the operations of a plurality of photosensors arranged in matrix.

The timing chart in FIG. 3 shows the example in which the photosensors in the p-th row and (p+2)th row concurrently perform the reset operation and the storage operation while the backlight is on and an object to be detected is irradiated with light, and the photosensors in the (p+1)th row and (p+3)th row concurrently perform the reset operation and the storage operation while the backlight is off. In general, for example, photosensors in odd-numbered rows can concurrently perform the reset operation and the storage operation while the backlight is on and an object to be detected is irradiated with light, and the photosensors in even-numbered rows can concurrently perform the reset operation and the storage operation while the backlight is off.

After that, the photosensors in all the rows sequentially perform the selection operation as in TSp and TS(p+1) in the timing chart in FIG. 3.

Note that photosensors per row may sequentially perform the selection operation, or photosensors in a plurality of rows may simultaneously perform the selection operation.

Then, a difference between output signals obtained from photosensors in adjacent rows is obtained. For example, a difference may be obtained by performing the selection operation in the adjacent rows at the same time. The difference is a signal component whose S/N ratio is improved because noise due to external light is cancelled. Using the difference, a captured image of an object to be detected is generated and a region where the object exists is detected.

Note that the time interval of blinking the backlight is short, and it can be considered that an object to be detected hardly moves between when the backlight is on and when the backlight is off. Consequently, the difference between the output signal of the photosensor in the p-th row and the output signal of the photosensor in the (p+1)th row is hardly affected by movement of the object.

Note that there is a difference corresponding to an interval between rows between the output signal of the photosensor in the p-th row and the output signal of the photosensor in the (p+1)th row. The decrease in the interval between rows can reduce the difference between the output signal of the photosensor in the p-th row and the output signal of the photosensor in the (p+1)th row.

The timing chart in FIG. 3 shows the example in which the photosensors in the p-th row and (p+2)th row concurrently perform the reset operation and the storage operation while the backlight is on and an object to be detected is irradiated with light, and the photosensors in the (p+1)th row and (p+3)th row concurrently perform the reset operation and the storage operation while the backlight is off. However, the present invention is not limited to this example. The timing of turning on and off the backlight may be changed. For example, the photosensors in the p-th row and (p+2)th row may concurrently perform the reset operation and the storage operation while the backlight is off, and the photosensors in the (p+1)th row and (p+3)th row may concurrently perform the reset operation and the storage operation while the backlight is on and an object to be detected is irradiated with light.

The timing chart in FIG. 3 shows the example in which the photosensors in the p-th row and (p+2)th row concurrently perform the reset operation and the storage operation, and the photosensors in the (p+1)th row and (p+3)th row concurrently perform the reset operation and the storage operation; however, the present invention is not limited to this example. In the photosensors arranged in the matrix of m rows and n columns, there may be rows whose timing of the reset operation and the storage operation is different from that in other rows, and the backlight may be turned on or off in the rows whose timing of the reset operation and the storage operation is different. For example, the photosensors in the p-th row and (p+3)th row may concurrently perform the reset operation and the storage operation, and the photosensors in the (p+1)th row and (p+2)th row may concurrently perform the reset operation and the storage operation. In that case, it is possible that the backlight is turned on and an object to be detected is irradiated with light when the photosensors in the p-th row and (p+3)th row perform the reset operation and the storage operation, and the backlight is turned off when the photosensors in the (p+1)th row and (p+2)th row perform the reset operation and the storage operation. Alternatively, it is possible that the backlight is turned off when the photosensors in the p-th row and (p+3)th row perform the reset operation and the storage operation, and the backlight is turned on and an object to be detected is irradiated with light when the photosensors in the (p+1)th row and (p+2)th row perform the reset operation and the storage operation.

The timing chart in FIG. 3 shows the example in which the on state or off state of the backlight is selected even in a period of performing the reset operation; the state of the backlight in a period of performing the reset operation can be any state.

In one embodiment of the present invention, a transistor whose channel is formed in an oxide semiconductor layer is used as the transistor 304 which holds electric charge stored in the photosensor. Thus, noise due to leakage by the off-state current of the transistor can be reduced even in a semiconductor device including photosensors in which the period after the reset operation and storage operation are performed and before the selection operation is started (the charge retention period) varies in length in order to obtain a signal component whose S/N ratio is improved because noise due to external light is cancelled.

In a transistor including an oxide semiconductor layer with a reduced concentration of alkali metal and alkaline earth metal, deterioration of characteristics (e.g., normally-on state of the transistor (negative shift of the threshold voltage) and the decrease in mobility) or variations in characteristics are not much caused. This is because alkali metal and alkaline earth metal are adverse impurities in the oxide semiconductor layer. When an insulating film in contact with the oxide semiconductor layer is an oxide, an alkali metal, in particular, Na diffuses into the oxide and becomes Na$^+$. In addition, Na cuts the bond between a metal and oxygen or enters the bond in the oxide semiconductor layer, which causes deterioration of transistor characteristics (e.g., the transistor becomes normally on (the threshold voltage shifts negatively) or the mobility is decreased). In addition, this also causes variation in the characteristics. Such a problem is significant especially in the case where the hydrogen concentration in the oxide semiconductor layer is sufficiently low. Therefore, when the concentration of an alkali metal element is reduced to the above-described value in the case where the hydrogen concentration in the oxide semiconductor layer is lower than or equal to $5 \times 10^{19}$ atoms/cm$^3$, particularly lower than or equal to $5 \times 10^{18}$ atoms/cm$^3$, deterioration and variations in characteristics of a transistor whose channel is formed in the oxide semiconductor layer can be suppressed. By using a transistor whose channel is formed in such an oxide semiconductor layer as the transistor (first transistor) which holds electric charge stored in the photosensor, the reliability of the photosensor can be increased and thus the reliability of the semiconductor device can be increased.

Accordingly, in a semiconductor device including a photosensor, noise due to external light is reduced and noise due to leakage by the off-state current of a transistor is reduced, so that the reliability can be increased.

Embodiment 2

In this embodiment, a structure of a semiconductor device according to one embodiment of the present invention will be described. This embodiment explains an example of a structure of a semiconductor device that includes a plurality of display elements arranged in matrix in addition to a plurality of photosensors arranged in matrix. Such a semiconductor device is called a touch panel or the like, and a display screen also serves as a data input region. Note that the configuration of the photosensor and the connection relation of the photosensors can be those illustrated in FIG. 1C. Further, the operations of the plurality of photosensors arranged in matrix can be similar to those illustrated in FIG. 3 in Embodiment 1.

Figure 4:
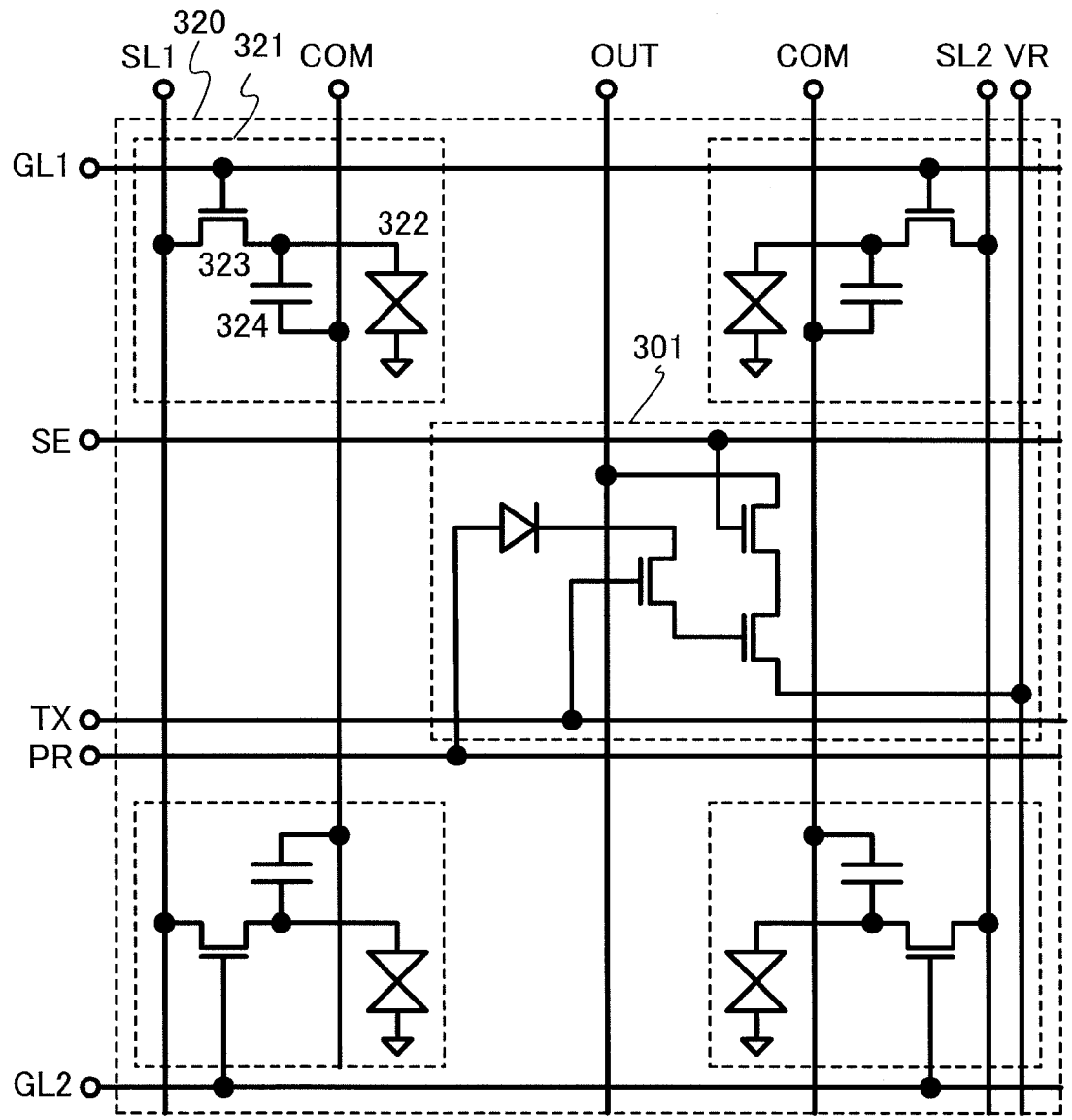
FIG. 4 is a circuit diagram of a semiconductor device including a photosensor and a liquid crystal element.

FIG. 4 is a circuit diagram of part of a structure of a semiconductor device. In FIG. 4, a pixel 320 includes four display elements 321 and one photosensor 301. Using the pixel 320 as a basic configuration, a plurality of pixels 320 are arranged in a matrix of m rows and n columns and form a display screen that also serves as a data input region. FIG. 4 illustrates the case where the photosensor 301 having the configuration in FIG. 1A is used in the pixel 320. Note that the number of display elements 321 and photosensors 301 included in each pixel is not limited to that illustrated in FIG. 4. The density of the plurality of photosensors and that of the plurality of display elements may be the same or different. That is, one photosensor may be provided for one display element; one photosensor may be provided for two or more display elements; or one display element may be provided for two or more photosensors.

FIG. 4 shows the configuration in which the display element 321 includes a liquid crystal element 322. The display element 321 includes the liquid crystal element 322 and a circuit element such as a transistor for controlling the operation of the liquid crystal element 322. Specifically, FIG. 4 illustrates an example in which the display element 321 includes the liquid crystal element 322, a transistor 323 functioning as a switching element, and a capacitor 324. The liquid crystal element 322 includes a pixel electrode, a counter electrode, and a liquid crystal layer to which a voltage is applied by the pixel electrode and the counter electrode.

A gate electrode of the transistor 323 is electrically connected to a scan line GL (GL1 or GL2). A first terminal of the transistor 323 is electrically connected to a signal line SL (SL1 or SL2). A second terminal of the transistor 323 is electrically connected to the pixel electrode of the liquid crystal element 322. One of a pair of electrodes of the capacitor 324 is electrically connected to the pixel electrode of the liquid crystal element 322, and the other thereof is electrically connected to a wiring COM supplied with a fixed potential. The signal line SL is supplied with a potential corresponding to an image to be displayed. When the transistor 323 is turned on with a signal of the scan line GL, the potential of the signal line SL is supplied to one of the pair of the electrodes of the capacitor 324 and the pixel electrode of the liquid crystal element 322. The capacitor 324 holds electric charge corresponding to a voltage applied to the liquid crystal layer. Contrast of light that transmits through the liquid crystal layer (i.e., the gray level) is controlled using a change in the polarization direction of the liquid crystal layer with voltage application, and images are displayed. As light that transmits through the liquid crystal layer, light emitted from the backlight is used.

In the configuration in FIG. 4, the operation of the display elements arranged in matrix can be the same as in a known display device.

Note that a transistor whose channel is formed in an oxide semiconductor layer, described in Embodiment 1, can be used as the transistor 323, in which case the capacitor 324 can be omitted since the off-state current of the transistor is extremely low.

The transistor 323 may be a transistor whose channel is formed in a layer or a substrate made of a semiconductor material other than an oxide semiconductor. Examples of a semiconductor material other than an oxide semiconductor are silicon and germanium. Note that a layer or a substrate made of a semiconductor material other than an oxide semiconductor may be amorphous, microcrystalline, polycrystalline, or single crystal.

Note that by using the same semiconductor material for active layers of all the transistors in the pixel 320, the manufacturing process of the semiconductor device can be simplified. For example, by using an oxide semiconductor film for the active layers of all the transistors in the display element 321 and the photosensor 301, the manufacturing process of the semiconductor device can be simplified.

When a semiconductor material capable of providing higher mobility than an oxide semiconductor, such as polycrystalline or single crystal silicon, is used for the active layer of the transistor 323, image data can be input to the display element 321 at higher speed.

Note that the display element 321 may further include another circuit element such as a transistor, a diode, a resistor, a capacitor, or an inductor as needed.

Note that although the case where the display element 321 includes the liquid crystal element 322 is described, the display element 321 may include a different element such as a light-emitting element. A light-emitting element is an element whose luminance is controlled by current or voltage. Specific examples are a light-emitting diode and an organic light-emitting diode (OLED). When the display element 321 includes a light-emitting element, the light-emitting element may emit light to serve as a backlight.

This embodiment can be freely combined with any of the other embodiments.

Embodiment 3

A structure of a semiconductor device including the photosensors 301 arranged in a matrix of in rows and n columns, which is different from the structure illustrated in FIG. 1C, will be described with reference to FIG. 5.

Figure 5:
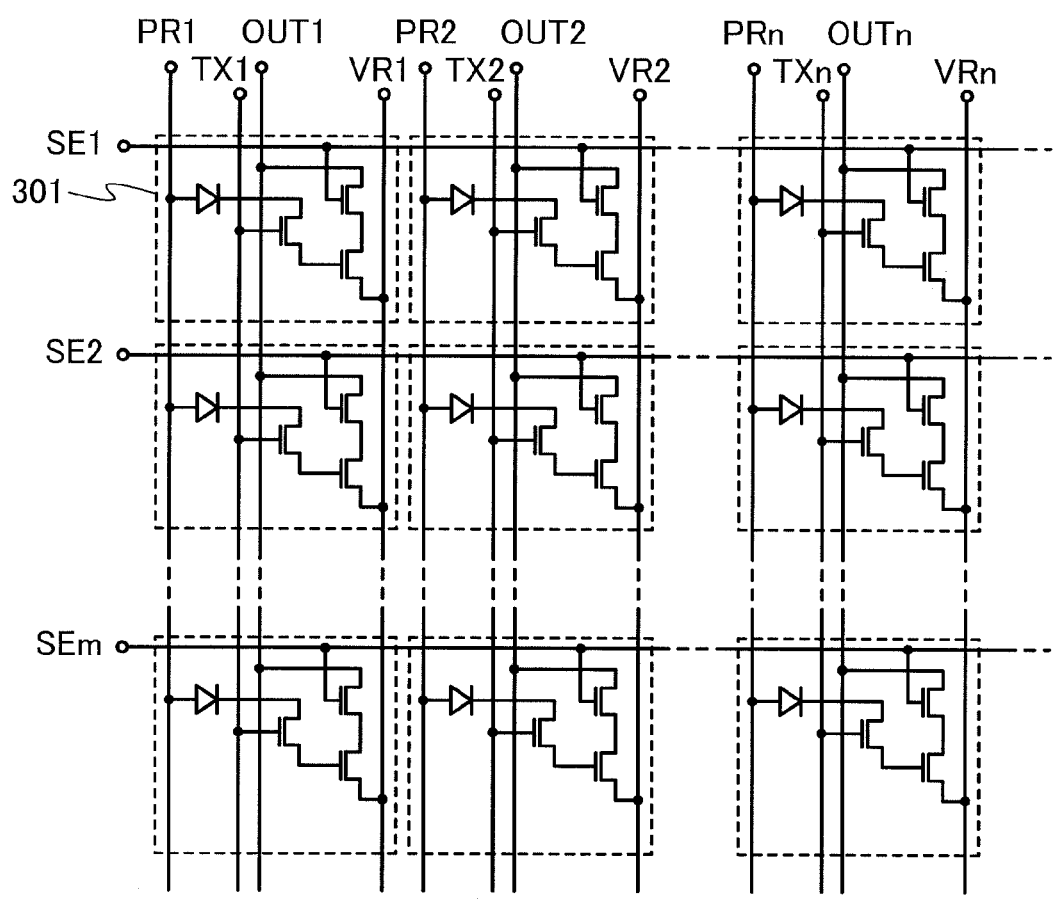
FIG. 5 is a circuit diagram of a plurality of photosensors arranged in matrix.

In FIG. 5, a plurality of photosensors 301 are arranged in a matrix of m rows and n columns. The photosensors 301 in one row are electrically connected to one of a plurality of wirings SE (wirings SE1 to SEm). The photosensors 301 in one column are electrically connected to one of a plurality of wirings PR (wirings PR1 to PRn), one of a plurality of wirings TX (wirings TX1 to TXn), one of a plurality of wirings OUT (wirings OUT1 to OUTn) and one of a plurality of wirings VR (wirings VR1 to VRn).

In FIG. 5, the photosensors in one row share the wiring SE. The photosensors in one column share the wiring PR, the wiring TX, the wiring OUT, and the wiring VR. However, the present invention is not limited to this structure. Two or more wirings SE may be provided for one row and electrically connected to different photosensors 301. Two or more wirings PR may be provided for one column and electrically connected to different photosensors 301. Two or more wirings TX may be provided for one column and electrically connected to different photosensors 301. Two or more wirings OUT may be provided for one column and electrically connected to different photosensors 301. Two or more wirings VR may be provided for one column and electrically connected to different photosensors 301.

FIG. 5 shows the structure where the photosensors in one column share the wiring VR; however, the present invention is not limited to this structure. The wiring VR may be shared between the photosensors in one row.

Further, the wiring TX can be shared between photosensors that concurrently perform the reset operation and the storage operation among the photosensors 301 arranged in the matrix of m rows and n columns. The wiring PR can be shared between photosensors that concurrently perform the reset operation and the storage operation among the photosensors 301 arranged in the matrix of m rows and n columns.

As described above, wirings are shared between photosensors to reduce the number of wirings, whereby a driver circuit for driving the photosensors 301 arranged in the matrix of m rows and n columns can be simplified.

Next, an example of the operation of a semiconductor device including the photosensors 301 arranged in the matrix of m rows and n columns illustrated in FIG. 5 will be described with reference to FIG. 6.

Note that the operations of the photosensors 301 are the same as those described using FIG. 2. FIG. 6 illustrates the relation between the reset operation, storage operation, and selection operation of the photosensors 301 in different rows.

A backlight is turned on, an object to be detected is irradiated with light, and the photosensor in a q-th row (q is a natural number of n or less) performs the reset operation and the storage operation. Then, the backlight is turned off, and the photosensor in a (q+1)th row performs the reset operation and the storage operation. FIG. 6 typically shows the potentials of the wirings PR (PRq to PR(q+3)), the wirings TX (TXq to TX(q+3)) in the photosensors in the q-th row to (q+3)th row, and the potentials of the wirings SE (SEp to SE(p+3)) (p is a natural number of m or less) in the photosensors in the p-th row to (p+3)th row.

A period during which the photosensors in the q-th column and (q+2)th column perform the reset operation is denoted by TRq. A period during which the photosensors in the (q+1)th column and (q+3)th column perform the reset operation is denoted by TR(q+1). A period during which the photosensors in the q-th column and (q+2)th column perform the storage operation is denoted by TIq. A period during which the photosensors in the (q+1)th column and (q+3)th column perform the storage operation is denoted by TI(q+1). A period during which the photosensor in the p-th row performs the selection operation is denoted by TSp. A period during which the photosensor in the (p+1)th row performs the selection operation is denoted by TS(p+1).

Figure 6:
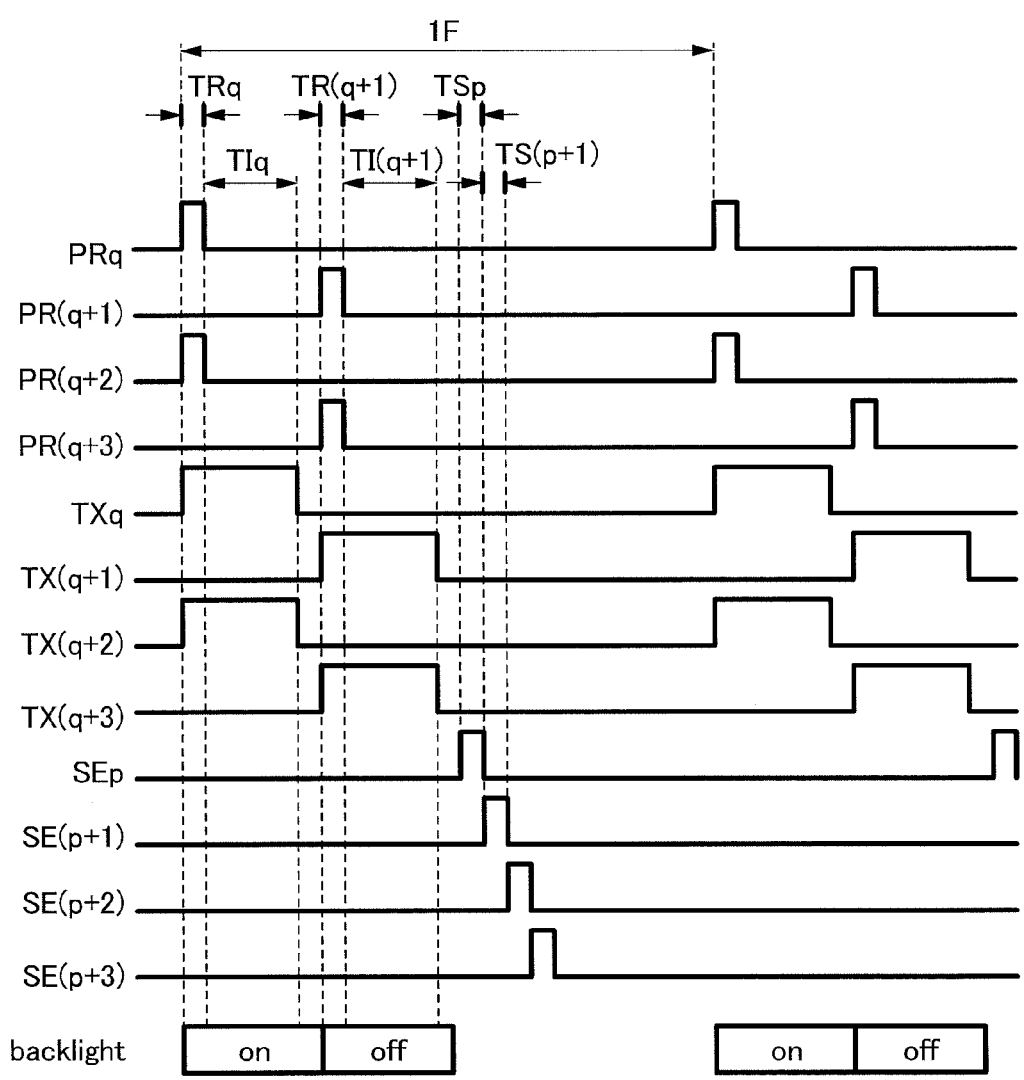
FIG. 6 is a timing chart illustrating the operations of a plurality of photosensors arranged in matrix.

The timing chart in FIG. 6 shows the example in which the photosensors in the q-th column and (q+2)th column concurrently perform the reset operation and the storage operation while the backlight is on and an object to be detected is irradiated with light, and the photosensors in the (q+1)th column and (q+3)th column concurrently perform the reset operation and the storage operation while the backlight is off. In general, for example, photosensors in odd-numbered columns can concurrently perform the reset operation and the storage operation while the backlight is on and an object to be detected is irradiated with light, and the photosensors in even-numbered columns can concurrently perform the reset operation and the storage operation while the backlight is off.

After that, the photosensors in all the rows sequentially perform the selection operation as in TSp and TS(p+1) in the timing chart in FIG. 6. Note that photosensors per row may sequentially perform the selection operation, or photosensors in a plurality of rows may simultaneously perform the selection operation.

Then, a difference between output signals obtained from photosensors in adjacent columns is obtained. The difference is a signal component whose S/N ratio is improved because noise due to external light is cancelled. Using the difference, a captured image of an object to be detected is generated and a region where the object exists is detected.

Note that the time interval of blinking the backlight is short, and it can be considered that an object to be detected hardly moves between when the backlight is on and when the backlight is off. Consequently, the difference between the output signal of the photosensor in the q-th column and the output signal of the photosensor in the (q+1)th column is hardly affected by movement of the object.

Note that there is a difference corresponding to an interval between columns between the output signal of the photosensor in the q-th column and the output signal of the photosensor in the (q+1)th column. The decrease in the interval between columns can reduce the difference between the output signal of the photosensor in the q-th column and the output signal of the photosensor in the (q+1)th column.

The timing chart in FIG. 6 shows the example in which the photosensors in the q-th column and (q+2)th column concurrently perform the reset operation and the storage operation while the backlight is on and an object to be detected is irradiated with light, and the photosensors in the (q+1)th column and (q+3)th column concurrently perform the reset operation and the storage operation while the backlight is off. However, the present invention is not limited to this example. The timing of turning on and off the backlight may be changed. For example, the photosensors in the q-th column and (q+2)th column may concurrently perform the reset operation and the storage operation while the backlight is off, and the photosensors in the (q+1)th column and (q+3)th column may concurrently perform the reset operation and the storage operation while the backlight is on and an object to be detected is irradiated with light.

The timing chart in FIG. 6 shows the example in which the photosensors in the q-th column and (q+2)th column concurrently perform the reset operation and the storage operation, and the photosensors in the (q+1)th column and (q+3)th column concurrently perform the reset operation and the storage operation; however, the present invention is not limited to this example. In the photosensors arranged in the matrix of m rows and n columns, there may be columns whose timing of the reset operation and the storage operation is different from that in other columns, and the backlight may be turned on or off in the columns whose timing of the reset operation and the storage operation is different. For example, the photosensors in the q-th column and (q+3)th column may concurrently perform the reset operation and the storage operation, and the photosensors in the (q+1)th column and (q+2)th column may concurrently perform the reset operation and the storage operation. In that case, it is possible that the backlight is turned on and an object to be detected is irradiated with light when the photosensors in the q-th column and (q+3)th column perform the reset operation and the storage operation, and the backlight is turned off when the photosensors in the (q+1)th column and (q+2)th column perform the reset operation and the storage operation. Alternatively, it is possible that the backlight is turned off when the photosensors in the q-th column and (q+3)th column perform the reset operation and the storage operation, and the backlight is turned on and an object to be detected is irradiated with light when the photosensors in the (q+1)th column and (q+2)th column perform the reset operation and the storage operation.

The timing chart in FIG. 6 shows the example in which the on state or off state of the backlight is selected even in a period of performing the reset operation; the state of the backlight in a period of performing the reset operation can be any state.

In one embodiment of the present invention, a transistor whose channel is formed in an oxide semiconductor layer is used as the transistor 304 which holds electric charge stored in the photosensor. Thus, noise due to leakage by the off-state current of the transistor can be reduced even in a semiconductor device including photosensors in which the period after the reset operation and storage operation are performed and before the selection operation is started (the charge retention period) varies in length in order to obtain a signal component whose S/N ratio is improved because noise due to external light is cancelled.

In a transistor including an oxide semiconductor layer with a reduced concentration of alkali metal and alkaline earth metal, deterioration of characteristics (e.g., normally-on state of the transistor (negative shift of the threshold voltage) and the decrease in mobility) or variations in characteristics are not much caused. This is because alkali metal and alkaline earth metal are adverse impurities in the oxide semiconductor layer. When an insulating film in contact with the oxide semiconductor layer is an oxide, an alkali metal, in particular, Na diffuses into the oxide and becomes $Na^+$. In addition, Na cuts the bond between a metal and oxygen or enters the bond in the oxide semiconductor layer, which causes deterioration of transistor characteristics (e.g., the transistor becomes normally on (the threshold voltage shifts negatively) or the mobility is decreased). In addition, this also causes variation in the characteristics. Such a problem is significant especially in the case where the hydrogen concentration in the oxide semiconductor layer is sufficiently low. Therefore, when the concentration of an alkali metal element is reduced to the above-described value in the case where the hydrogen concentration in the oxide semiconductor layer is lower than or equal to $5\times10^{19}$ atoms/cm$^3$, particularly lower than or equal to $5\times10^{18}$ atoms/cm$^3$, deterioration and variations in characteristics of a transistor whose channel is formed in the oxide semiconductor layer can be suppressed. By using a transistor whose channel is formed in such an oxide semiconductor layer as the transistor (first transistor) which holds electric charge stored in the photosensor, the reliability of the photosensor can be increased and thus the reliability of the semiconductor device can be increased.

Accordingly, in a semiconductor device including a photosensor, noise due to external light is reduced and noise due to leakage by the off-state current of a transistor is reduced, so that the reliability can be increased.

This embodiment can be freely combined with any of the other embodiments.

Embodiment 4

In this embodiment, a structure of a semiconductor device according to one embodiment of the present invention will be described. This embodiment will explain an example of a structure of a semiconductor device that includes a plurality of display elements arranged in matrix in addition to a plurality of photosensors arranged in matrix. In this embodiment, an example of a semiconductor device having a configuration different from that illustrated in FIG. 4 in Embodiment 2 will be described. Such a semiconductor device is called a touch panel or the like, and a display screen also serves as a data input region. Note that the configuration of the photosensor and the connection relation of the photosensors can be those illustrated in FIG. 5. Further, the operations of the plurality of photosensors arranged in matrix can be similar to those illustrated in FIG. 6 in Embodiment 3.

Figure 7:
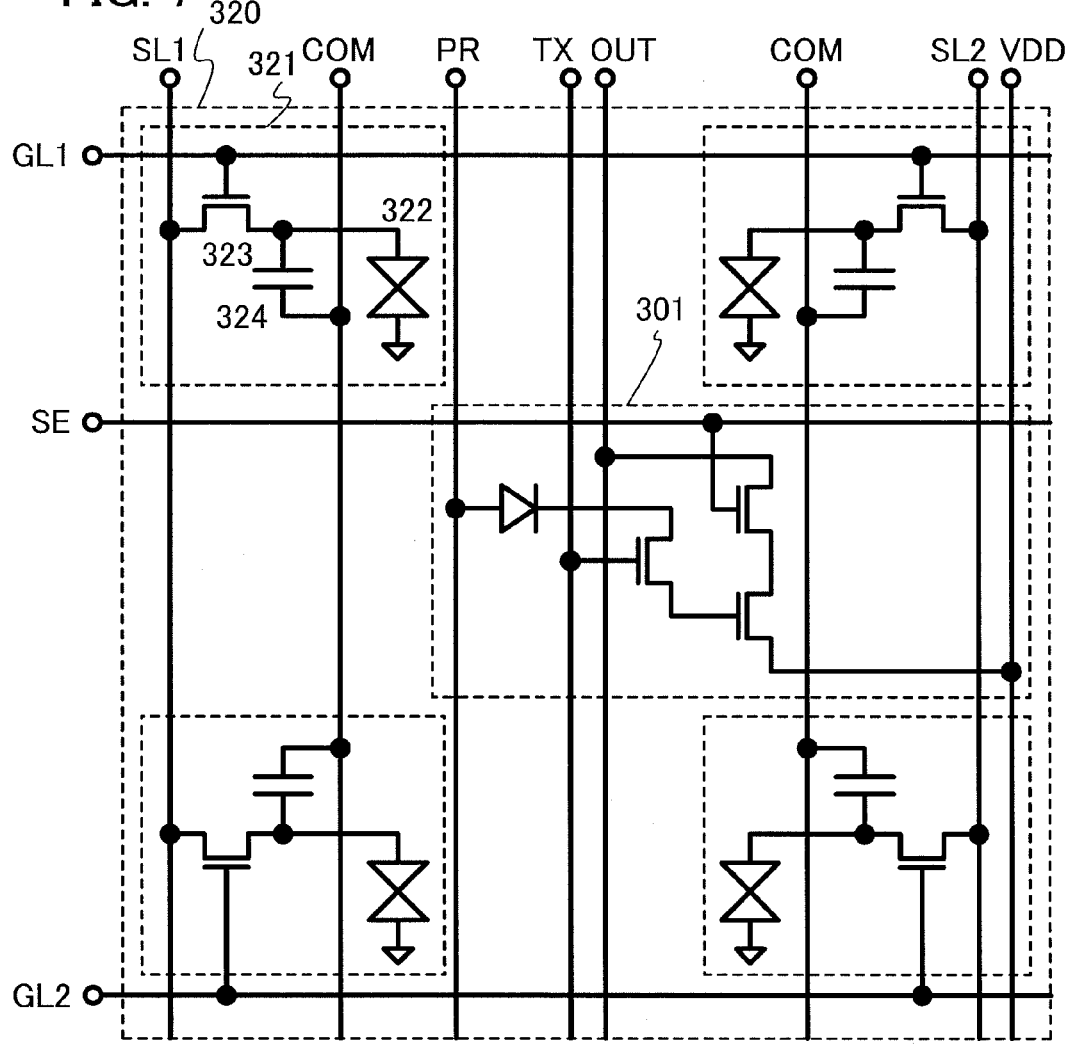
FIG. 7 is a circuit diagram of a semiconductor device including a photosensor and a liquid crystal element.

FIG. 7 is a circuit diagram of part of a structure of a semiconductor device. In FIG. 7, a pixel 320 includes four display elements 321 and one photosensor 301. Using the pixel 320 as a basic configuration, a plurality of pixels 320 are arranged in a matrix of m rows and n columns and form a display screen that also serves as a data input region. FIG. 7 illustrates the case where the photosensor 301 having the configuration in FIG. 1A is used in the pixel 320. Note that the number of display elements 321 and photosensors 301 included in each pixel is not limited to that illustrated in FIG. 7. The density of the plurality of photosensors and that of the plurality of display elements may be the same or different. That is, one photosensor may be provided for one display element; one photosensor may be provided for two or more display elements; or one display element may be provided for two or more photosensors.

FIG. 7 shows the configuration in which the display element 321 includes a liquid crystal element 322. The display element 321 includes the liquid crystal element 322 and a circuit element such as a transistor for controlling the operation of the liquid crystal element 322. Specifically, FIG. 7 illustrates an example in which the display element 321 includes the liquid crystal element 322, a transistor 323 functioning as a switching element, and a capacitor 324. The liquid crystal element 322 includes a pixel electrode, a counter electrode, and a liquid crystal layer to which a voltage is applied by the pixel electrode and the counter electrode.

A gate electrode of the transistor 323 is electrically connected to a scan line GL (GL1 or GL2). A first terminal of the transistor 323 is electrically connected to a signal line SL (SL1 or SL2). A second terminal of the transistor 323 is electrically connected to the pixel electrode of the liquid crystal element 322. One of a pair of electrodes of the capacitor 324 is electrically connected to the pixel electrode of the liquid crystal element 322, and the other thereof is electrically connected to a wiring COM supplied with a fixed potential. The signal line SL is supplied with a potential corresponding to an image to be displayed. When the transistor 323 is turned on with a signal of the scan line GL, the potential of the signal line SL is supplied to one of the pair of the electrodes of the capacitor 324 and the pixel electrode of the liquid crystal element 322. The capacitor 324 holds electric charge corresponding to a voltage applied to the liquid crystal layer. Contrast of light that transmits through the liquid crystal layer (i.e., the gray level) is controlled using a change in the polarization direction of the liquid crystal layer with voltage application, and images are displayed. As light that transmits through the liquid crystal layer, light emitted from the backlight is used.

In the configuration in FIG. 7, the operation of the display elements arranged in matrix can be the same as in a known display device.

Note that a transistor whose channel is formed in an oxide semiconductor layer, described in Embodiment 1 and the like, can be used as the transistor 323, in which case the capacitor 324 can be omitted since the off-state current of the transistor is extremely low.

The transistor 323 may be a transistor whose channel is formed in a layer or a substrate made of a semiconductor material other than an oxide semiconductor. Examples of a semiconductor material other than an oxide semiconductor are silicon and germanium. Note that a layer or a substrate made of a semiconductor material other than an oxide semiconductor may be amorphous, microcrystalline, polycrystalline, or single crystal.

Note that by using the same semiconductor material for active layers of all the transistors in the pixel 320, the manufacturing process of the semiconductor device can be simplified. For example, by using an oxide semiconductor film for the active layers of all the transistors in the display element 321 and the photosensor 301, the manufacturing process of the semiconductor device can be simplified.

When a semiconductor material capable of providing higher mobility than an oxide semiconductor, such as polycrystalline or single crystal silicon, is used for the active layer of the transistor 323, image data can be input to the display element 321 at higher speed.

Note that the display element 321 may further include another circuit element such as a transistor, a diode, a resistor, a capacitor, or an inductor as needed.

Note that although the case where the display element 321 includes the liquid crystal element 322 is described, the display element 321 may include a different element such as a light-emitting element. A light-emitting element is an element whose luminance is controlled by current or voltage. Specific examples are a light-emitting diode and an OLED. When the display element 321 includes a light-emitting element, the light-emitting element may emit light to serve as a backlight.

This embodiment can be freely combined with any of the other embodiments.

Embodiment 5

Figure 8:
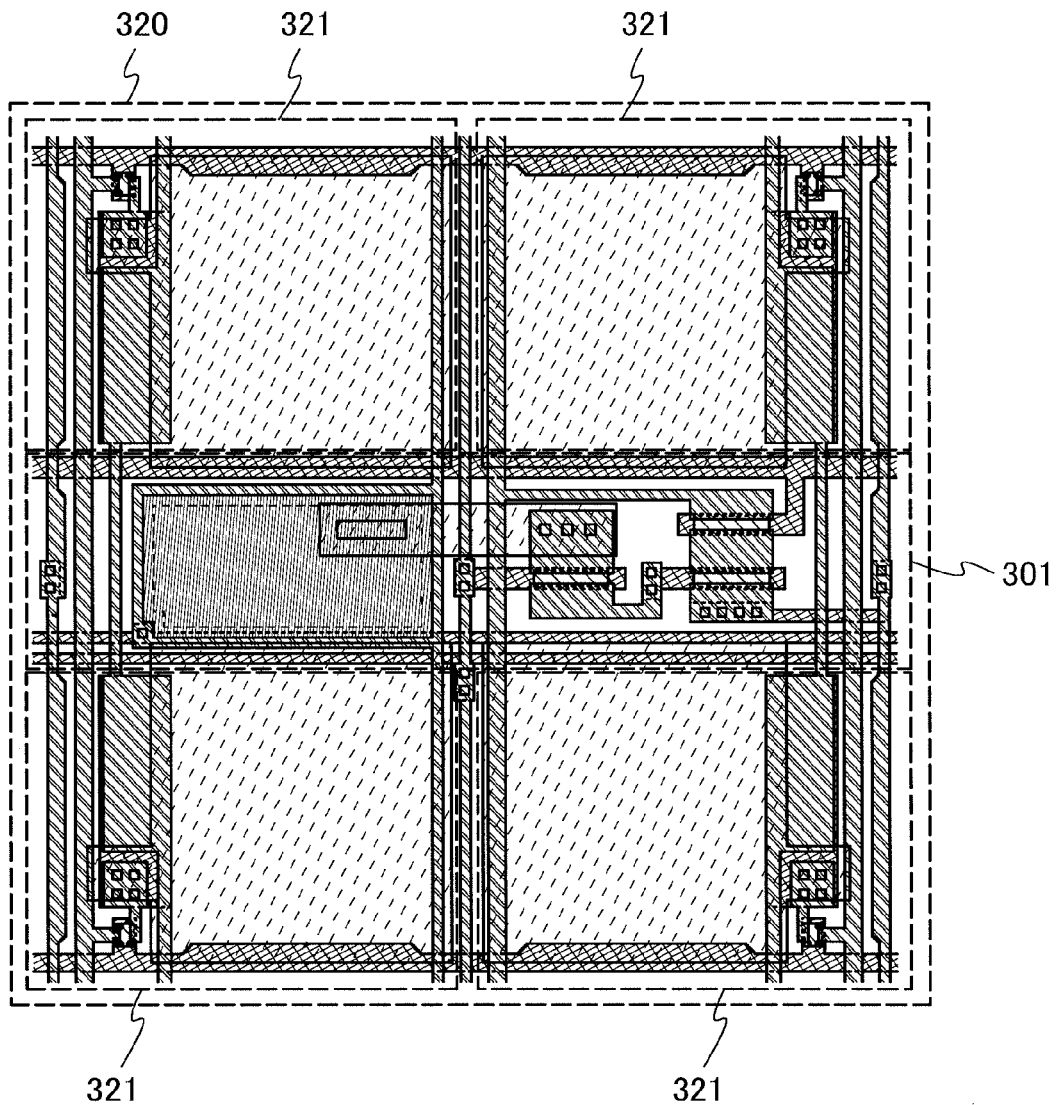
FIG. 8 is a top view of part of a semiconductor device including a photosensor and a liquid crystal element.

FIG. 8 illustrates an example of a top view of the pixel 320 illustrated in FIG. 7. The pixel 320 in FIG. 8 includes one photosensor 301 and four display elements 321 as in FIG. 7.

Figure 9:
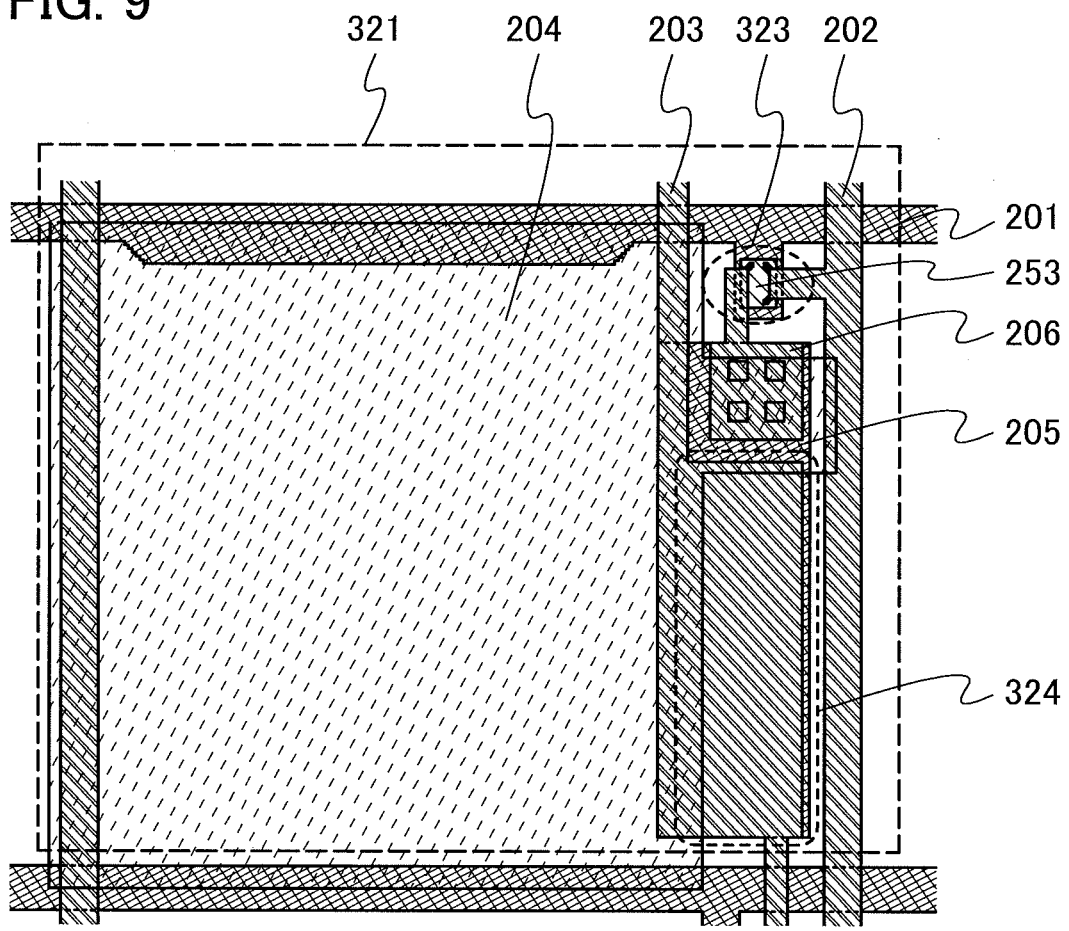
FIG. 9 is a top view of a liquid crystal element.

FIG. 9 is an enlarged view of one of the display elements 321 illustrated in FIG. 8. The display element 321 includes a conductive film 201 functioning as the scan line GL, a conductive film 202 functioning as the signal line SL, and a conductive film 203 functioning as the wiring COM. The conductive film 201 also functions as the gate electrode of the transistor 323. The conductive film 202 also functions as the first terminal of the transistor 323. The display element 321 further includes a pixel electrode 204, a conductive film 205, and a conductive film 206. The conductive film 206 functions as the second terminal of the transistor 323. The conductive film 206 and the pixel electrode 204 are electrically connected to each other.

The conductive film 206 is electrically connected to the conductive film 205. A portion where the conductive film 203 functioning as the wiring COM and the conductive film 205 overlap each other with a gate insulating film placed therebetween functions as the capacitor 324.

Note that various insulating films including the gate insulating film are not shown in FIG. 8 and FIG. 9 for clear illustration of a variety of circuit elements such as the wirings, the transistors, and the capacitors.

The conductive film 201 and the conductive film 205 can be formed by processing one conductive film formed over an insulating surface into a desired shape. The gate insulating film is formed over the conductive films 201 and 205. Furthermore, the conductive film 202, the conductive film 203, and the conductive film 206 can be formed by processing one conductive film formed over the gate insulating film into a desired shape.

Note that in the case where the transistor 323 is a bottom-gate transistor and an active layer 253 of the transistor 323 is formed using an oxide semiconductor, it is preferable to employ a structure in which the active layer 253 is provided over the conductive film 201 functioning as the gate electrode, so as not to extend beyond the conductive film 201 as illustrated in FIG. 9. This structure can prevent the oxide semiconductor in the active layer 253 from deteriorating because of light incident from the substrate side, and can thus prevent deterioration of characteristics such as a shift of the threshold voltage of the transistor 323.

FIG. 10A is an enlarged view of one of the photosensors 301 illustrated in FIG. 8. FIG. 10B is a cross-sectional view along broken line A1-A2 in FIG. 10A.

The photosensor 301 includes a conductive film 210 functioning as the wiring PR, a conductive film 211 functioning as the wiring TX, a conductive film 212 functioning as the wiring SE, a conductive film 213 functioning as the wiring VR, and a conductive film 214 functioning as the wiring OUT.

The photodiode 302 included in the photosensor 301 includes a p-type semiconductor film 215, an i-type semiconductor film 216, and an n-type semiconductor film 217 that are sequentially stacked. The conductive film 210 is electrically connected to the p-type semiconductor film 215 functioning as the anode of the photodiode 302.

A conductive film 218 included in the photosensor 301 functions as the gate electrode of the transistor 304 and is electrically connected to the conductive film 211. A conductive film 219 included in the photosensor 301 functions as the first terminal of the transistor 304. A conductive film 220 included in the photosensor 301 functions as the second terminal of the transistor 304. A conductive film 221 included in the photosensor 301 is electrically connected to the n-type semiconductor film 217 and the conductive film 219. A conductive film 222 included in the photosensor 301 functions as the gate electrode of the transistor 305 and is electrically connected to the conductive film 220.

A conductive film 223 included in the photosensor 301 functions as the first terminal of the transistor 305. A conductive film 224 included in the photosensor 301 functions as the second terminal of the transistor 305 and the first terminal of the transistor 306. The conductive film 214 also functions as the second terminal of the transistor 306. The conductive film 212 also functions as the gate electrode of the transistor 306. The conductive film 225 included in the photosensor 301 is electrically connected to the conductive film 223 and the conductive film 213.

Note that in FIGS. 10A and 10B, a conductive film 226 included in the photosensor 301 is electrically connected to the conductive film 210 functioning as the wiring PR. A conductive film 227 included in the photosensor 301 is electrically connected to the conductive film 211 functioning as the wiring TX.

The conductive film 212, the conductive film 218, the conductive film 222, the conductive film 225, the conductive film 226, and the conductive film 227 can be formed by processing one conductive film formed over an insulating surface into a desired shape. A gate insulating film 228 is formed over the conductive film 212, the conductive film 218, the conductive film 222, the conductive film 225, the conductive film 226, and the conductive film 227. The conductive film 210, the conductive film 211, the conductive film 213, the conductive film 214, the conductive film 219, the conductive film 220, the conductive film 223, and the conductive film 224 can be formed by processing one conductive film faulted over the gate insulating film 228 into a desired shape.

An insulating film 281 and an insulating film 282 are formed over the conductive film 210, the conductive film 211, the conductive film 213, the conductive film 214, the conductive film 219, the conductive film 220, the conductive film 223, and the conductive film 224. The conductive film 221 is formed over the insulating film 281 and the insulating film 282.

Note that the cross-sectional view of the photosensor 301 in FIG. 10B shows a state after the process up to and including the step of forming the conductive film 221. In a semiconductor device that also includes display elements, the display element 321 as well as the photosensor 301 is provided in the pixel 320; in practice, a liquid crystal element is formed after the conductive film 221 is formed.

Note that in the case where an oxide semiconductor is used for an active layer 250 of the transistor 304 and the transistor 304 is a bottom-gate transistor, it is preferable to employ a structure in which the active layer 250 is provided over the conductive film 218 functioning as the gate electrode, so as not to extend beyond the conductive film 218 as illustrated in FIGS. 10A and 10B. This structure can prevent the oxide semiconductor in the active layer 250 from deteriorating because of light incident from a substrate 251 side, and can thus prevent deterioration of characteristics such as a shift of the threshold voltage of the transistor 304. Note that the same effect can be obtained when the transistors 305 and 306 have the above structure.

Here, in the structure where the wiring TX is extended in the row direction as illustrated in FIG. 1C and FIG. 4, the wiring SE is also extended in the row direction and placed in parallel with the wiring TX. Since the wiring SE is electrically connected to the gate electrode of the transistor 306, when part of the wiring SE is used as the gate electrode of the transistor 306, the wiring TX placed in parallel with the wiring SE is generally formed in the layer where the gate electrode of the transistor 306 is formed, using the same material as the gate electrode. Note that in general, a material used for a gate electrode of a transistor has higher resistance than a material used for source and drain electrodes; therefore, the resistance of the wiring TX is increased.

In contrast, in the structure illustrated in FIGS. 10A and 10B, the pixel corresponding to the circuit diagram in FIG. 5 is provided, and the wiring TX is extended in the column direction. Thus, the wiring TX can be formed using a conductive film that is formed in a layer different from that where the wiring SE extended in the row direction is formed. For example, as illustrated in FIGS. 10A and 10B, the wiring TX can be formed using the conductive film 211 which is formed in a layer different from that where the conductive films (the conductive films 212, 218, and 222) forming the gate electrodes of the transistors (the transistors 304, 305, and 306) included in the photosensor. The conductive film 211 can be formed in the layer where the source and drain electrodes of the transistors (the transistors 304, 305, and 306) included in the photosensor are formed, that is, where the conductive films 214, 219, 220, and 224 are formed, using the same material as the source and drain electrodes. Consequently, the resistance of the wiring TX can be decreased.

Figure 11:
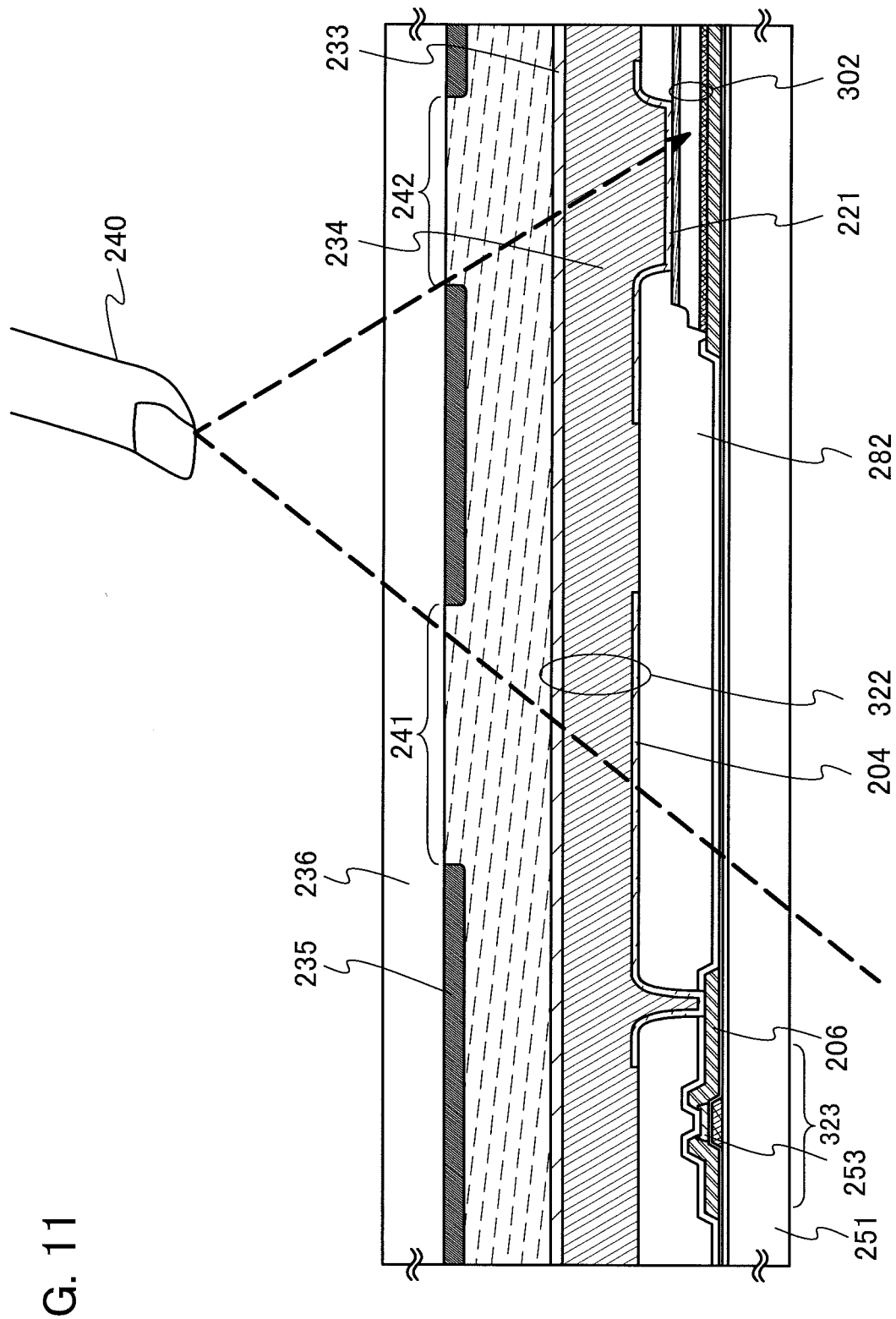
FIG. 11 is a cross-sectional view of a semiconductor device including a photosensor and a liquid crystal element.

FIG. 11 is a cross-sectional view of a pixel and illustrates the transistor 323 in the display element 321 and the photodiode 302 in the photosensor 301. The conductive film 206 functioning as the second terminal of the transistor 323 is electrically connected to the pixel electrode 204. The pixel electrode 204 and the conductive film 221 electrically connected to the photodiode 302 can be formed by processing one conductive film formed over the insulating film 282 covering the transistor 323 and the photodiode 302 into a desired shape.

A substrate 236 is disposed so as to face the substrate 251 provided with the pixel electrode 204. The substrate 236 is provided with a counter electrode 233, and a liquid crystal layer 234 including liquid crystal is provided between the pixel electrode 204 and the counter electrode 233. The liquid crystal element 322 is formed in a portion where the pixel electrode 204, the counter electrode 233, and the liquid crystal layer 234 overlap each other.

Note that an alignment film may be provided as appropriate between the pixel electrode 204 and the liquid crystal layer 234 or between the counter electrode 233 and the liquid crystal layer 234. The alignment film can be formed using an organic resin such as polyimide or polyvinyl alcohol. Alignment treatment such as rubbing has been performed on the surface in order to align liquid crystal molecules in a certain direction. Rubbing can be performed by rolling a roller wrapped with cloth of nylon or the like while being in contact with the alignment film and the surface of the alignment film is rubbed in a certain direction. Note that it is also possible to form an alignment film that has alignment properties with the use of an inorganic material such as silicon oxide by evaporation, without alignment treatment.

Injection of liquid crystal for forming the liquid crystal layer 234 may be performed by a dispenser method (dripping method) or a dipping method (pumping method).

Note that the substrate 236 is provided with a light-blocking film 235 capable of blocking light, in order to prevent a disclination due to disordered orientation of the liquid crystal between pixels or in order to prevent dispersed light from entering a plurality of adjacent pixels at the same time. An organic resin containing black pigment such as carbon black or low-valent titanium oxide having an oxidation number smaller than that of titanium dioxide can be used for the light-blocking film 235. Alternatively, a film of chromium can be used for the light-blocking film.

The light-blocking film 235 is preferably provided for not only the display element 321 but also the photosensor 301. Thus, even when the active layers of the transistors included in the display element 321 and the photosensor 301 are formed using an oxide semiconductor, the light-blocking film 235 shields the active layers from light; therefore, it is possible to prevent photodegradation of the oxide semiconductor, and it is possible to prevent deterioration of characteristics such as a shift of the threshold voltage of the transistors.

Note that in the case where a driver circuit is formed over the substrate 251 by using a transistor, an active layer of the transistor used in the driver circuit is shielded from light by a gate electrode or a light-blocking film, whereby deterioration in characteristics of the transistor, such as a shift of the threshold voltage, can be prevented.

The pixel electrode 204 and the counter electrode 233 can be formed using a light-transmitting conductive material such as indium tin oxide containing silicon oxide (ITSO), indium tin oxide (ITO), zinc oxide (ZnO), indium zinc oxide (IZO), or gallium-doped zinc oxide (GZO), for example.

Examples of a liquid crystal material used for the liquid crystal layer 234 are nematic liquid crystal, cholesteric liquid crystal, smectic liquid crystal, discotic liquid crystal, thermotropic liquid crystal, lyotropic liquid crystal, low-molecular liquid crystal, polymer dispersed liquid crystal (PDLC), ferroelectric liquid crystal, anti-ferroelectric liquid crystal, main-chain liquid crystal, side-chain polymer liquid crystal, and banana-shaped liquid crystal.

The following methods can be used for driving the liquid crystal, for example: a TN (twisted nematic) mode, an STN (super twisted nematic) mode, a VA (vertical alignment) mode, an MVA (multi-domain vertical alignment) mode, an IPS (in-plane-switching) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, and a guest-host mode.

Further, liquid crystal exhibiting a blue phase for which an alignment film is unnecessary may be used for the liquid crystal layer 234. A blue phase is one of liquid crystal phases, which is generated just before a cholesteric phase changes into an isotropic phase while temperature of cholesteric liquid crystal is increased. Since the blue phase is only generated within a narrow range of temperature, a chiral agent or an ultraviolet curable resin is added so that the temperature range is improved. The liquid crystal composition that includes liquid crystal exhibiting a blue phase and a chiral agent is preferable because it has a small response time of 10 μsec to 100 μsec, has optical isotropy, which makes the alignment process unneeded, and has a small viewing angle dependence.

FIG. 11 illustrates the liquid crystal element in which the liquid crystal layer 234 is sandwiched between the pixel electrode 204 and the counter electrode 233, as an example; however, the semiconductor device according to one embodiment of the present invention is not limited to having this structure. A pair of electrodes may be formed over one substrate as in an IPS mode liquid crystal element or a liquid crystal element using a blue phase.

Note that in one embodiment of the present invention, as shown by dashed lines, light of a backlight from the substrate 251 side passes the liquid crystal element 322, and then passes an opening 241 formed in the light-blocking film 235 and transmits the substrate 236. Then, light transmitted through the substrate 236 is reflected from a finger which is an object 240 to be detected, and enters the substrate 236 again. Light entering the substrate 236 passes an opening 242 formed in the light-blocking film 235 and enters the photodiode 302.

FIG. 11 is the cross-sectional view of the pixel including the transmissive liquid crystal element 322; alternatively, the semiconductor device according to one embodiment of the present invention may include a transflective liquid crystal element or a reflective liquid crystal element. In a reflective liquid crystal element, the pixel electrode 204 is formed using a conductive material that reflects external light, for example, a metal having high visible light reflectance, such as aluminum, titanium, silver, rhodium, or nickel or an alloy containing at least one of these metals. Note that when a transflective liquid crystal element or a reflective liquid crystal element is used, unlike in the case of FIG. 11, the conductive film 221 and the pixel electrode 204 are independently formed by processing conductive films of different materials into a desired shape.

Figure 12:
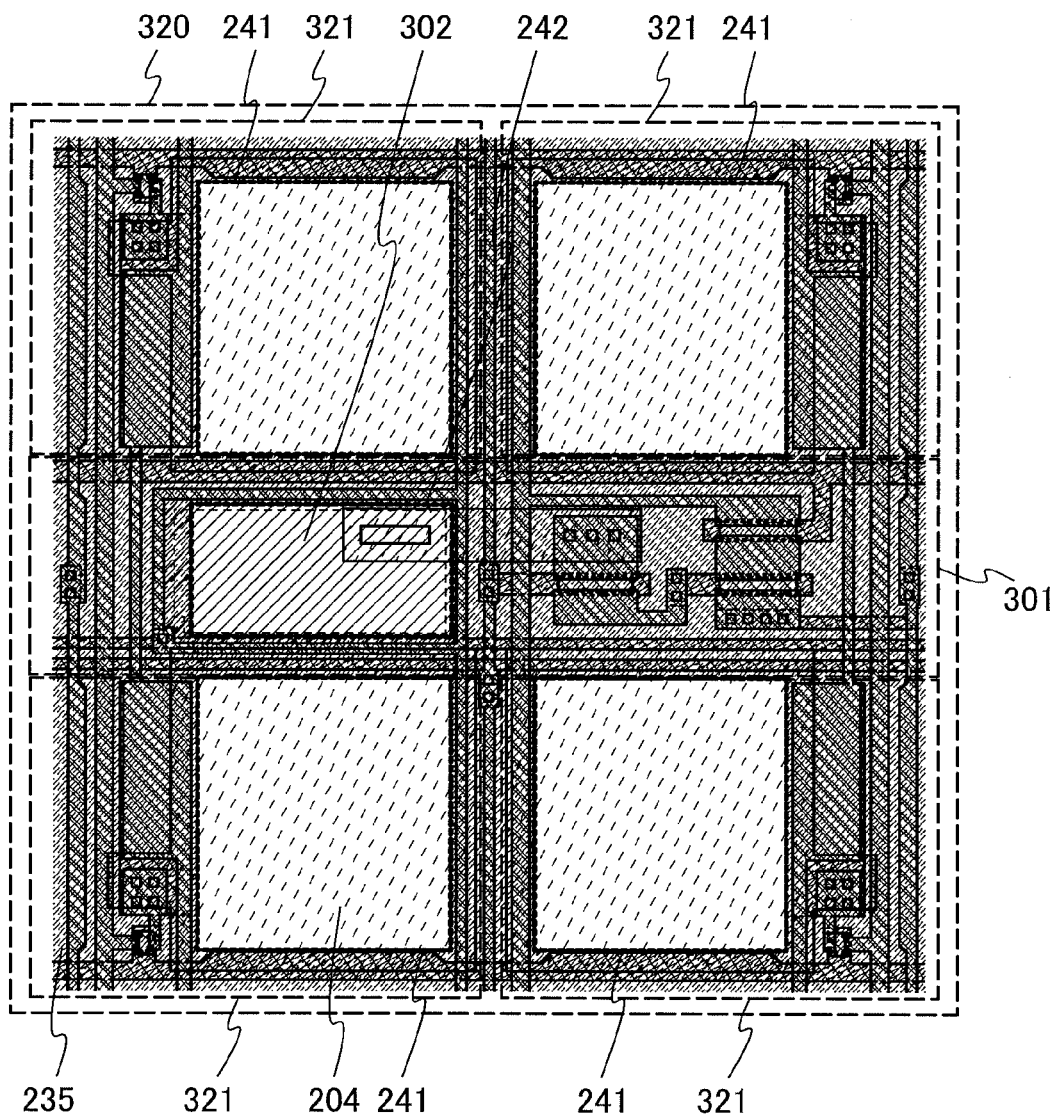
FIG. 12 is a top view of part of a semiconductor device including a photosensor and a liquid crystal element.

FIG. 12 illustrates a state where the light-blocking film 235 overlaps with the pixel 320 illustrated in FIG. 8. In FIG. 12, the light-blocking film 235 has the opening 241 in a region overlapping with the pixel electrode 204 of the display element 321, and the opening 242 in a region overlapping with the photodiode 302 of the photosensor 301.

This embodiment can be freely combined with any of the other embodiments.

Embodiment 6

In this embodiment, the photosensor 301 having a configuration different from the configurations illustrated in FIGS. 1A and 1B will be described.

Figure 13A:
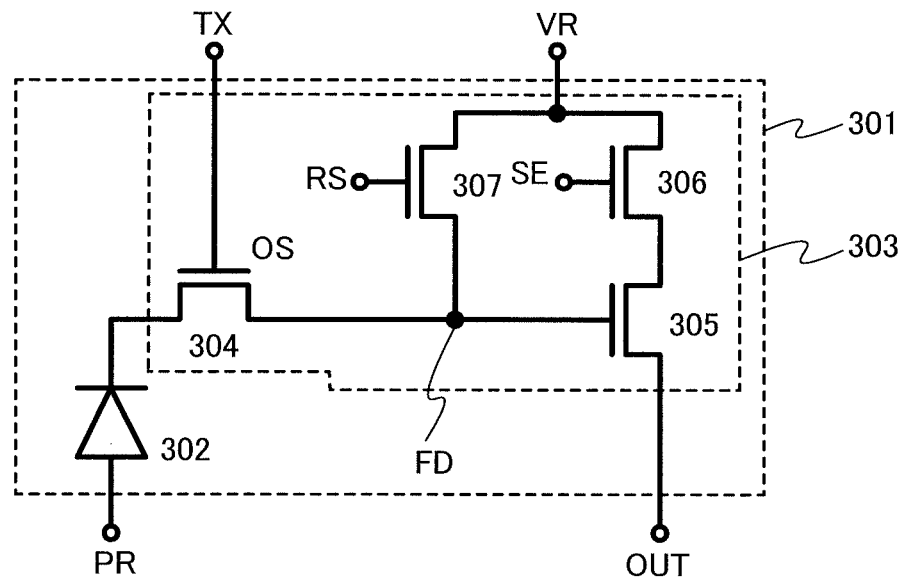
FIGS. 13A and 13B are each a circuit diagram of a photosensor.

FIG. 13A is a circuit diagram of an example of the photosensor 301. The photosensor 301 includes a photodiode 302 and an amplifier circuit 303. The photodiode 302 is a photoelectric conversion element that has properties of generating current when irradiated with light, and the amount of photocurrent flowing therethrough is decided by the intensity of irradiation light. The amplifier circuit 303 stores electric charge corresponding to the photocurrent, and generates an output signal that includes the amount of the electric charge as data.

The amplifier circuit 303 includes a transistor 304 that functions as a switching element for controlling supply of photocurrent in the amplifier circuit 303, a transistor 305 in which the current or the resistance between its first terminal and second terminal is determined in accordance with a potential applied to a second terminal of the transistor 304, a transistor 306 that functions as a switching element for supplying a potential of an output signal determined by the current or the resistance to the wiring OUT, and a transistor 307 that functions as a switching element for supplying the potential of the wiring VR to a gate electrode of the transistor 305. Note that the transistor 304 corresponds to a transistor that holds electric charge corresponding to photocurrent of the photodiode 302.

In FIG. 13A, an anode of the photodiode 302 is electrically connected to the wiring PR. A cathode of the photodiode 302 is electrically connected to a first terminal of the transistor 304. The second terminal of the transistor 304 is electrically connected to a gate of the transistor 305. A gate of the transistor 304 is electrically connected to the wiring TX. The wiring TX is supplied with a potential of a signal for controlling switching of the transistor 304. The first terminal of the transistor 305 is electrically connected to the wiring VR. The wiring VR is supplied with a predetermined potential, for example, a high-level power supply potential VDD. The second terminal of the transistor 305 is electrically connected to a first terminal of the transistor 306. A second terminal of the transistor 306 is electrically connected to the wiring OUT. A gate of the transistor 306 is electrically connected to the wiring SE. The wiring SE is supplied with a potential of a signal for controlling switching of the transistor 306. A first terminal of the transistor 307 is electrically connected to the wiring VR. A second terminal of the transistor 307 is electrically connected to the gate of the transistor 305. A gate of the transistor 307 is connected to a wiring RS. The wiring RS is supplied with a potential of a signal for controlling switching of the transistor 307. The wiring OUT is supplied with a potential of an output signal that is output from the amplifier circuit 303.

Features of the present invention include a transistor whose channel is formed in an oxide semiconductor layer used as the transistor 304. That is, an oxide semiconductor film is used as an active layer of the transistor 304.

For the oxide semiconductor layer, it is possible to use any of the following oxides: In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide which are oxides of four metal elements; In—Ga—Zn-based oxide (also referred to as IGZO), In—Sn—Zn-based oxide, In—Al—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; indium oxide, tin oxide, and zinc oxide. For example, an In—Sn—Ga—Zn-based oxide means a metal oxide containing indium (In), tin (Sn), gallium (Ga), and zinc (Zn), and there is no particular limitation on the composition ratio thereof. The above oxide semiconductor may include silicon.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, an oxide semiconductor expressed by a chemical formula of $InMO_3(ZnO)_m$ (m>0, where m is not an integer) can be used for the oxide semiconductor layer. Here, M represents one or more metal elements selected from Ga, Al, Fe, Mn, and Co. Alternatively, as the oxide semiconductor, a material expressed by a chemical formula of $In_3SnO_5(ZnO)_n$ (n>0, where n is an integer) may be used.

As the oxide semiconductor layer, an oxide semiconductor layer that is highly purified by reduction of impurities such as moisture, hydrogen, and alkali metal elements (e.g., sodium or lithium), which serve as electron donors (donors), is used. The concentration of hydrogen in the highly purified oxide semiconductor layer, which is measured by secondary ion mass spectrometry (SIMS), is less than or equal to $5 \times 10^{19}/cm^3$, preferably less than or equal to $5 \times 10^{18}/cm^3$, further preferably less than or equal to $5 \times 10^{17}/cm^3$, still more preferably less than or equal to $1 \times 10^{16}/cm^3$. The measurement value of the concentration of Na is less than or equal to $5 \times 10^{16}$ atoms/$cm^3$, preferably less than or equal to $1 \times 10^{16}$ atoms/$cm^3$, further preferably less than or equal to $1 \times 10^{15}$ atoms/$cm^3$. The measurement value of the concentration of Li is less than or equal to $5 \times 10^{15}$ atoms/$cm^3$, preferably less than or equal to $1 \times 10^{15}$ atoms/$cm^3$. The measurement value of the concentration of K is less than or equal to $5 \times 10^{15}$ atoms/$cm^3$, preferably less than or equal to $1 \times 10^{15}$ atoms/$cm^3$. In addition, the carrier density of the oxide semiconductor layer, which is measured by Hall effect measurement, is lower than $1 \times 10^{14}/cm^3$, preferably lower than $1 \times 10^{12}/cm^3$, further preferably lower than $1 \times 10^{11}/cm^3$. Further, the band gap of the oxide semiconductor is 2 eV or more, preferably 2.5 eV or more, further preferably 3 eV or more.

Specifically, low off-state current of the transistor whose channel is formed in an oxide semiconductor layer can be proved by various experiments. For example, even when a transistor has a channel width of $1 \times 10^6$ μm and a channel length of 10 μm, the off-state current (drain current at the time when voltage between a gate electrode and a source electrode is 0 V or less) can be less than or equal to the measurement limit of a semiconductor parameter analyzer, that is, less than or equal to $1\times10^{-13}$ A with the voltage between the source electrode and a drain electrode (drain voltage) of 1 V to 10 V. In this case, it can be found that the off-state current density corresponding to a value obtained by dividing the off-state current by the channel width of the transistor is less than or equal to 100 zA/μm. In addition, a capacitor and a transistor are connected to each other and the off-state current density is measured with a circuit in which electric charge flowing into or from the capacitor is controlled by the transistor. In the measurement, an oxide semiconductor layer is used for a channel formation region of the transistor, and the off-state current density of the transistor is measured by a change in the amount of electric charge of the capacitor per unit time. As a result, it is found that in the case where the voltage between the source electrode and the drain electrode of the transistor is 3 V, a lower off-state current density of several tens of yoctoamperes per micrometer (yA/μm) can be obtained. The off-state current density of a transistor whose channel is formed in an oxide semiconductor layer can be less than or equal to 100 yA/μm, preferably less than or equal to 10 yA/μm, further preferably less than or equal to 1 yA/μm depending on the voltage between a source electrode and a drain electrode. Consequently, the transistor whose channel is formed in an oxide semiconductor layer has much lower off-state current than a transistor including crystalline silicon.

In such a manner, the off-state current of the transistor 304 can be extremely low. Since the transistor 304 serves as a switching element for holding electric charge stored in the photosensor 301, leakage of electric charge in a charge retention period can be suppressed. Furthermore, by using a transistor whose channel is formed in an oxide semiconductor layer as the transistor 304 instead of a transistor whose channel is formed with an amorphous semiconductor material, the mobility of the transistor 304 can be increased.

In FIG. 13A, the transistors 305, 306, and 307 included in the amplifier circuit 303 may be a transistor whose channel is formed in an oxide semiconductor layer, or may be a transistor whose channel is formed in a layer or a substrate made of a semiconductor material other than an oxide semiconductor. Examples of a semiconductor material other than an oxide semiconductor are silicon and germanium. Note that a layer or a substrate made of a semiconductor material other than an oxide semiconductor may be amorphous, microcrystalline, polycrystalline, or single crystal.

The use of a transistor whose channel is formed in an oxide semiconductor layer as the transistor 305 can prevent an unnecessary potential from being output to the wiring OUT. Further, in that case, the mobility of the transistor 305 can be increased as compared to the case of using a transistor whose channel is formed in a layer of an amorphous semiconductor material as the transistor 305.

The use of a transistor whose channel is formed in an oxide semiconductor layer as the transistor 306 can prevent an unnecessary potential from being output to the wiring OUT. Further, in that case, the mobility of the transistor 306 can be increased as compared to the case of using a transistor whose channel is formed in a layer of an amorphous semiconductor material as the transistor 306.

Note that by using the same semiconductor material for active layers of all the transistors in the photosensor 301, the manufacturing process of a semiconductor device can be simplified. For example, by using an oxide semiconductor film for the active layers of all the transistors in the photosensor 301, the manufacturing process of a semiconductor device can be simplified.

When a semiconductor material capable of providing higher mobility than an oxide semiconductor, such as polycrystalline or single crystal silicon, is used for the active layers of the transistors 305 and 306, data can be read from the photosensor 301 at high speed.

Note that FIG. 13A illustrates the structure in which the anode of the photodiode 302 is electrically connected to the wiring PR and the cathode of the photodiode 302 is electrically connected to the first terminal of the transistor 304; however, this embodiment is not limited to this structure. The cathode of the photodiode 302 may be electrically connected to the wiring PR and the anode of the photodiode 302 may be electrically connected to the first terminal of the transistor 304.

In addition, FIG. 13A shows the structure in which the transistor 305 and the transistor 306 are electrically connected in series in this order between the wiring VR and the wiring OUT. However, this embodiment is not limited to this structure, and the connection order of the transistors 305 and 306 may be reversed. That is, as illustrated in FIG. 13B, the transistor 306 and the transistor 305 may be electrically connected in series in this order between the wiring VR and the wiring OUT.

Figure 13B:
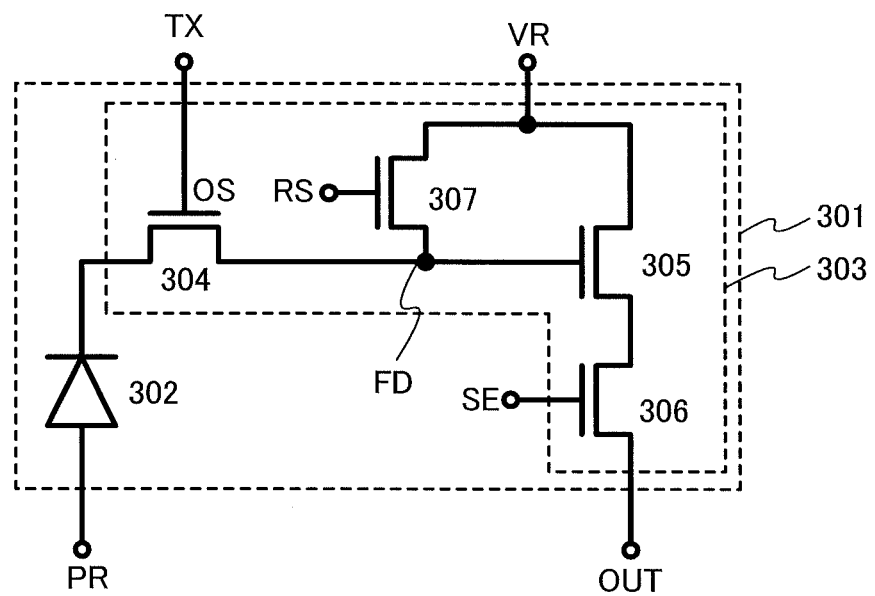

In FIGS. 13A and 13B, a node where the second terminal of the transistor 304, the first transistor of the transistor 307, and the gate electrode of the transistor 305 are connected to each other is denoted by a node FD. The potential of the output signal is decided by the amount of electric charge stored at the node FD. In order to hold electric charge at the node FD more reliably, a capacitor may be electrically connected to the node FD.

Note that although FIGS. 13A and 13B illustrate the configuration of the photosensor 301 in which the amplifier circuit 303 includes only one transistor 304 functioning as a switching element, the present invention is not limited to this configuration. In one embodiment of the present invention, one transistor functions as one switching element; alternatively, a plurality of transistors may function as one switching element. In the case where a plurality of transistors function as one switching element, the plurality of transistors may be connected to each other in parallel, in series, or in a combination of parallel and series connections.

FIGS. 13A and 13B illustrate the case where the transistor 304 includes a gate electrode on one side of the active layer. In the case where the transistor 304 includes a pair of gate electrodes with the active layer placed therebetween, one of the gate electrodes can be supplied with a signal for controlling switching of the transistor 304, and the other of the gate electrodes can be supplied with a predetermined potential. In that case, potentials with the same level may be applied to the pair of gate electrodes, or a fixed potential such as a ground potential may be applied only to the other of the gate electrodes. By controlling the level of a potential applied to the other of the gate electrodes, the threshold voltage of the transistor 304 can be controlled. Note that the other of the gate electrodes may be in a floating state, which is an electrically insulated state, as long as the threshold voltage of the transistor 304 is not adversely affected.

The above is the description of the configuration of the photosensor 301.

Figure 14:
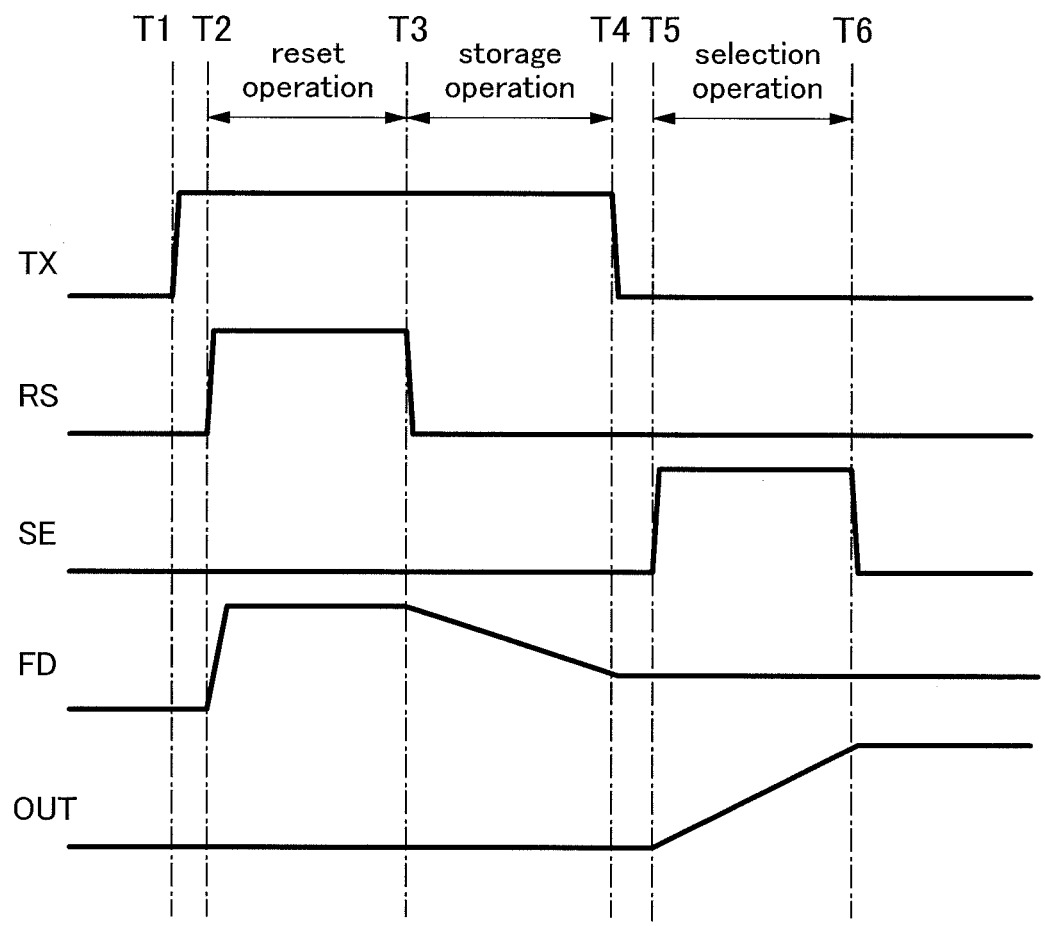
FIG. 14 is a timing chart of the operations of a photosensor.

Next, the operation of the photosensor 301 will be described. FIG. 14 is an example of a timing chart showing changes in potentials of the wirings (the wiring TX, the wiring RS, the wiring SE, and the wiring OUT) and the node FD illustrated in FIGS. 13A and 13B.

Note that in the timing chart illustrated in FIG. 14, for easy understanding of the operation of the photosensor 301, it is assumed that the wiring TX, the wiring RS, and the wiring SE are supplied with a high-level potential or a low-level potential. Specifically, it is assumed that the wiring TX is supplied with a high-level potential HTX and a low-level potential LTX; the wiring SE, a high-level potential HSE and a low-level potential LSE; and the wiring RS, a high-level potential HRS and a low-level potential LRS. The wiring PR is supplied with a predetermined potential, for example, a low-level power supply potential VSS.

Note that the case where all of the transistors 304, 305, 306, and 307 are n-channel transistors is described. However, the present invention is not limited to this example, and one or more of the transistors 304 to 307 may be p-channel transistors. In the case where one or more of the transistors 304 to 307 are p-channel transistors, the potential of each wiring is set so that the on state and off state of the transistors are the same as in the following description.

First, at a time T1, the potential of the wiring TX is changed from the potential LTX to the potential HTX. When the potential of the wiring TX is changed to the potential HTX, the transistor 304 is turned on. Note that at the time T1, the wiring SE is supplied with the potential LSE, and the wiring RS is supplied with the potential LRS.

Next, at a time T2, the potential of the wiring RS is changed from the potential LRS to the potential HRS. When the potential of the wiring RS is changed to the potential HRS, the transistor 307 is turned on. Further, at the time T2, the potential of the wiring TX is kept at the potential HTX, and the potential of the wiring SE is kept at the potential LSE. Accordingly, the power supply potential VDD is supplied to the node FD, so that electric charge held at the node FD is reset. In addition, a reverse bias voltage is applied to the photodiode 302.

Then, at a time T3, the potential of the wiring RS is changed from the potential HRS to the potential LRS. Until shortly before the time T3, the potential of the node FD is kept at the power supply potential VDD. Thus, a reverse bias voltage continues to be applied to the photodiode 302 even after the potential of the wiring RS is changed to the potential LRS. Then, when light enters the photodiode 302 in this state, a photocurrent flows from the cathode toward the anode of the photodiode 302. The value of photocurrent varies in accordance with the intensity of light. That is, as the intensity of light entering the photodiode 302 is higher, the value of photocurrent is higher and the amount of electric charge transferred between the node FD and the photodiode 302 is larger. On the other hand, as the intensity of light entering the photodiode 302 is lower, the value of photocurrent is lower and the amount of electric charge transferred between the node FD and the photodiode 302 is smaller. Thus, the higher the intensity of light becomes, the larger the amount of change in the potential of the node FD becomes; the lower the intensity of light becomes, the smaller the amount of change becomes.

Then, at a time T4, when the potential of the wiring TX is changed from the potential HTX to the potential LTX, the transistor 304 is turned off. Accordingly, the movement of electric charge between the node FD and the photodiode 302 is stopped, so that the potential of the node FD is decided.

Next, at a time T5, when the potential of the wiring SE is changed from the potential LSE to the potential HSE, the transistor 306 is turned on. Then, electric charge is transferred between the wiring VR and the wiring OUT in accordance with the potential of the node FD.

Note that an operation of setting the potential of the wiring OUT to a predetermined potential (precharge operation) is completed before the time T5. FIG. 13A shows the case where the potential of the wiring OUT is precharged to a low-level potential before the time T5 and increased from the time T5 to a time T6 in accordance with the light intensity; however, the present invention is not limited to this case. The potential of the wiring OUT may be precharged to a high-level potential before the time T5 and decreased from the time T5 to the time T6 in accordance with the light intensity.

The precharge operation can be conducted in the following manner, for example: the wiring OUT and a wiring supplied with a predetermined potential are made electrically connected to each other through a switching element such as a transistor and the transistor is turned on. After the precharge operation is completed, the transistor is turned off.

At the time T6, when the potential of the wiring SE is changed from the potential HSE to the potential LSE, the movement of electric charge from the wiring VR to the wiring OUT is stopped and the potential of the wiring OUT is decided. The potential of the wiring OUT corresponds to the potential of the output signal of the photosensor 301. The potential of the output signal includes data on an object to be detected.

The above-described series of operations of the photosensor 301 can be classified into a reset operation, a storage operation, and a selection operation. In other words, the operation from the time T2 to the time T3 corresponds to the reset operation; the operation from the time T3 to the time T4, the storage operation; and the operation from the time T5 to the time T6, the read operation. Furthermore, a period after the storage operation is finished and before the selection operation is started, that is, a period from the time T4 to the time T5 corresponds to a charge retention period in which electric charge is held at the node FD.

This embodiment can be freely combined with any of the other embodiments.

Embodiment 7

This embodiment will explain a method for forming a semiconductor device including a transistor whose channel is formed in a semiconductor film of single crystal silicon or the like and a transistor whose channel is formed in an oxide semiconductor layer.

Figure 15A:
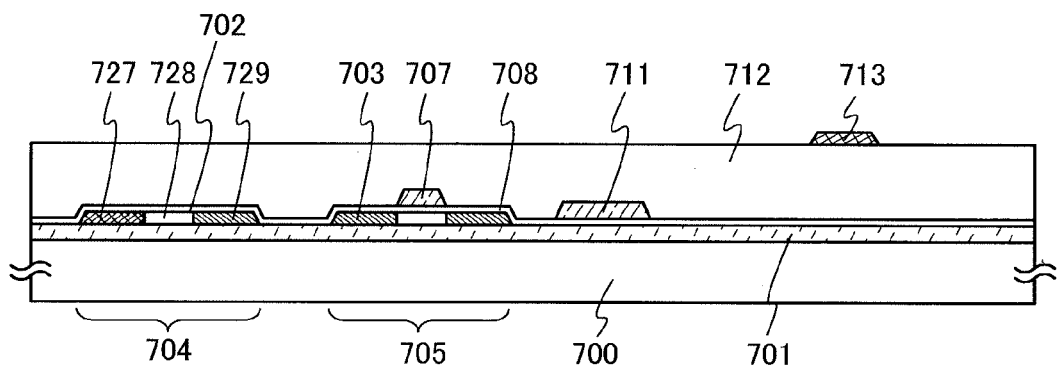
FIGS. 15A to 15C are cross-sectional views illustrating a method for forming a semiconductor device.

As illustrated in FIG. 15A, a photodiode 704 and an n-channel transistor 705 are formed over an insulating surface of a substrate 700 by a known CMOS fabrication method. In this embodiment, the case where the photodiode 704 and the n-channel transistor 705 are formed with a single crystal semiconductor film that is separated from a single crystal semiconductor substrate is given as an example. As the single crystal semiconductor substrate, a silicon substrate can be used, for example.

A specific example of a method for forming the single crystal semiconductor film will be briefly described. First, an ion beam including ions that are accelerated by an electric field enters the single crystal semiconductor substrate, and a fragile layer which is weakened by local disorder of the crystal structure is formed in a region at a certain depth from the surface of the semiconductor substrate. The depth at which the fragile layer is formed can be adjusted by the acceleration energy of the ion beam and the angle at which the ion beam enters. Then, the semiconductor substrate and the substrate 700 over which an insulating film 701 is formed are attached to each other so that the insulating film 701 is sandwiched therebetween. After the semiconductor substrate and the substrate 700 overlap with each other, a pressure of about 1 N/cm$^2$ to 500 N/cm$^2$, preferably about 11 N/cm$^2$ to 20 N/cm$^2$ is applied to part of the semiconductor substrate and the substrate 700 to attach the substrates. When the pressure is applied, bonding between the semiconductor substrate and the insulating film 701 starts from the portion to which the pressure is applied, which results in bonding of the entire surface where the semiconductor substrate and the insulating film 701 are in close contact with each other. Next, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 704 is formed using the island-shaped semiconductor film 702 over the insulating film 701. The n-channel transistor 705 is formed using the island-shaped semiconductor film 703 over the insulating film 701. The photodiode 704 is a lateral junction type photodiode in which a region 727 having p-type conductivity, a region 728 having i-type conductivity, and a region 729 having n-type conductivity are formed in the island-shaped semiconductor film 702. The n-channel transistor 705 includes a gate electrode 707. The n-channel transistor 705 also includes a pair of regions in the island-shaped semiconductor film 703, which has n-type conductivity and is placed so that a region overlapping with the gate electrode 707 is sandwiched therebetween. In addition, the n-channel transistor 705 includes an insulating film 708 between the island-shaped semiconductor film 703 and the gate electrode 707. In the n-channel transistor 705, the insulating film 708 functions as a gate insulating film.

Note that the region 728 having i-type conductivity refers to a region of the semiconductor film which contains an impurity imparting p-type or n-type conductivity at a concentration of $1 \times 10^{20}$ cm$^{-3}$ or less and has photoconductivity 100 or more times as high as dark conductivity. The region 728 having i-type conductivity includes, in its category, a region that contains an impurity element belonging to Group 13 or Group 15 of the periodic table. An i-type semiconductor has weak n-type electric conductivity when an impurity element for controlling valence electrons is not added intentionally. Therefore, the region 728 having i-type conductivity includes, in its category, a region to which an impurity element imparting p-type conductivity is added intentionally or unintentionally at the same time of film formation or after the film formation.

There is no particular limitation on a material used for the substrate 700; a light-transmitting material is used for the substrate 700 in the case of using a transmissive or transflective liquid crystal element. Moreover, the material used for the substrate 700 needs to have heat resistance at least high enough to heat treatment performed later. For example, a glass substrate manufactured by a fusion method or a float method, a quartz substrate, or a ceramic substrate can be used as the substrate 700. As the glass substrate, in the case where the temperature of heat treatment to be performed later is high, a glass substrate having a strain point of 730° C. or higher is preferably used. Although a substrate formed of a flexible synthetic resin such as plastic generally has a lower resistance temperature than the aforementioned substrates, the substrate can be used as long as it can be resistant to a processing temperature during formation steps.

Note that although the case where the photodiode 704 and the n-channel transistor 705 are formed using the single crystal semiconductor film is described as an example in this embodiment, the present invention is not limited to this structure. For example, a polycrystalline or microcrystalline semiconductor film that is formed over the insulating film 701 by vapor deposition may be used. Alternatively, the above semiconductor film may be crystallized with a known technique. Examples of the known technique of crystallization are a laser crystallization method using a laser beam and a crystallization method using a catalytic element. Alternatively, it is possible to use a combination of a crystallization method using a catalytic element and a laser crystallization method. In the case where a heat-resistant substrate such as a quartz substrate is used, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

In FIG. 15A, after a conductive film is formed over the insulating film 708, the conductive film is processed into a desired shape by etching or the like, whereby a wiring 711 is formed together with the gate electrode 707.

Next, as illustrated in FIG. 15A, an insulating film 712 is formed so as to cover the photodiode 704, the n-channel transistor 705, and the wiring 711. Note that although the case where a single-layer insulating film is used as the insulating film 712 is described as an example in this embodiment, the insulating film 712 is not necessarily a single-layer film and may be a stack including two or more insulating films.

The insulating film 712 is formed using a material that can withstand a temperature of heat treatment in a later formation step. Specifically, it is preferable to use silicon oxide, silicon nitride, silicon nitride oxide, silicon oxynitride, aluminum nitride, aluminum oxide, or the like for the insulating film 712.

Note that in this specification, oxynitride refers to a material containing a higher quantity of oxygen than that of nitrogen, and nitride oxide refers to a material containing a higher quantity of nitrogen than that of oxygen.

A surface of the insulating film 712 may be planarized by CMP or the like.

Next, as illustrated in FIG. 15A, a gate electrode 713 is formed over the insulating film 712.

The gate electrode 713 can be formed with a single-layer structure or a stacked structure using a metal material such as molybdenum, titanium, chromium, tantalum, tungsten, neodymium, or scandium; an alloy material that contains any of these metals as a main component; or nitride of any of these metals. Note that aluminum or copper can also be used as the metal material if it can withstand the temperature of heat treatment performed in a later step. Aluminum and copper are preferably used in combination with a refractory metal material so as to avoid problems of heat resistance and corrosion. As the refractory metal material, molybdenum, titanium, chromium, tantalum, tungsten, neodymium, scandium, or the like can be used.

For example, as a two-layer structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 713, the following structure is preferable: a stacked structure in which an aluminum film, an alloy film of aluminum and silicon, an alloy film of aluminum and titanium, or an alloy film of aluminum and neodymium is used as a middle layer and any of a tungsten film, a tungsten nitride film, a titanium nitride film, and a titanium film is used as a top layer and a bottom layer.

Further, a light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like can be used as the gate electrode 713.

The thickness of the gate electrode 713 is in the range of 10 nm to 400 nm, preferably 100 nm to 200 nm. In this embodiment, a 150-nm-thick conductive film for the gate electrode is formed by sputtering using a tungsten target, and then the conductive film is processed (patterned) into a desired shape by etching, whereby the gate electrode 713 is formed. The gate electrode preferably has tapered end portions because coverage of the gate electrode with a gate insulating film stacked thereover is improved. Note that a resist mask may be formed by an inkjet method. Formation of the resist mask by an inkjet method needs no photomask; thus, production costs can be reduced.

Figure 15B:
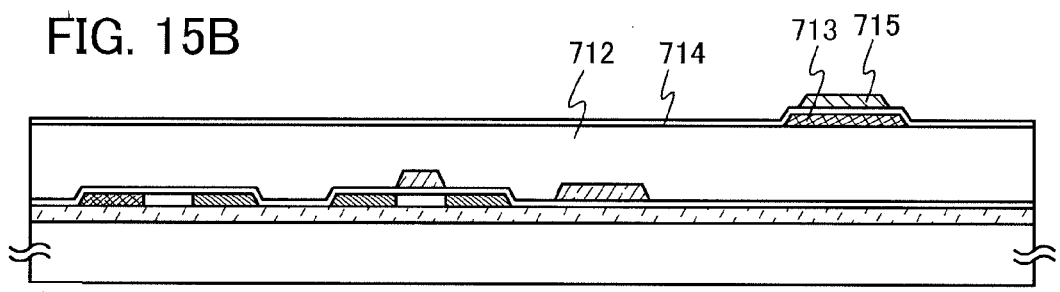

Next, as illustrated in FIG. 15B, a gate insulating film 714 is formed over the gate electrode 713, and after that, an oxide semiconductor layer 715 is formed over the gate insulating film 714 in a position overlapping with the gate electrode 713.

The gate insulating film 714 can be formed with a single-layer structure or a stacked structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film formed by plasma CVD, sputtering, or the like. It is preferable that the gate insulating film 714 contains as little impurities such as moisture, hydrogen, or oxygen as possible. In the case of forming a silicon oxide film by sputtering, a silicon target or a quartz target is used as a target, and oxygen or a mixed gas of oxygen and argon is used as a sputtering gas.

An oxide semiconductor layer that is made to be an i-type or substantially i-type oxide semiconductor layer (an oxide semiconductor layer that is highly purified) by removal of impurities and reduction of oxygen vacancy is extremely sensitive to an interface state and interface electric charge. Therefore, the interface between the oxide semiconductor layer 715 and the gate insulating film 714 is important. Consequently, the gate insulating film 714 that is in contact with the highly purified oxide semiconductor layer 715 needs to have high quality.

For example, high-density plasma-enhanced CVD using microwaves (e.g., a frequency of 2.45 GHz) is preferable because a dense high-quality insulating film having high withstand voltage can be formed. When the oxide semiconductor layer and the high-quality gate insulating film are in close contact with each other, the interface state density can be reduced and favorable interface characteristics can be obtained.

Needless to say, a different film formation method such as sputtering or plasma CVD can be used as long as a high-quality insulating film can be formed as the gate insulating film 714. Alternatively, it is possible to form an insulating film whose film quality and characteristics of the interface with the oxide semiconductor layer 715 are improved by heat treatment performed after deposition. In any case, any insulating film can be used as long as it has a reduced interface state density with the oxide semiconductor layer and can form a favorable interface as well as having a favorable film quality as the gate insulating film.

The gate insulating film 714 may have a structure in which an insulating film formed using a material with high barrier properties and an insulating film with a low nitrogen content, such as a silicon oxide film or a silicon oxynitride film, are stacked. In this case, the insulating film such as a silicon oxide film or a silicon oxynitride film is formed between the insulating film with high barrier properties and the oxide semiconductor layer. Examples of the insulating film with high barrier properties are a silicon nitride film, a silicon nitride oxide film, an aluminum nitride film, and an aluminum nitride oxide film. The use of the insulating film with high barrier properties can prevent impurities in an atmosphere, such as moisture or hydrogen, or impurities in the substrate, such as an alkali metal or a heavy metal, from entering the oxide semiconductor layer, the gate insulating film 714, or the interface between the oxide semiconductor layer and another insulating film and the vicinity thereof. In addition, the insulating film with a low nitrogen content, such as a silicon oxide film or a silicon oxynitride film, is formed so as to be in contact with the oxide semiconductor layer, so that the insulating film with high barrier properties can be prevented from being in direct contact with the oxide semiconductor layer.

For example, a 100-nm-thick gate insulating film 714 may be formed in the following manner a silicon nitride film ($SiN_y$ (y>0)) with a thickness of 50 nm to 200 nm is formed by sputtering as a first gate insulating film, and a silicon oxide film ($SiO_x$ (x>0)) with a thickness of 5 nm to 300 nm is stacked over the first gate insulating film as a second gate insulating film. The thickness of the gate insulating film 714 is set as appropriate depending on characteristics needed for the transistor and may be approximately 350 nm to 400 nm.

In this embodiment, the gate insulating film 714 in which a 100-nm-thick silicon oxide film formed by sputtering is stacked over a 50-nm-thick silicon nitride film formed by sputtering is formed.

Note that the gate insulating film 714 is in contact with the oxide semiconductor layer formed later. Hydrogen contained in the oxide semiconductor adversely affects characteristics of the transistor; therefore, it is preferable that the gate insulating film 714 do not contain hydrogen, a hydroxyl group, and moisture. In order that the gate insulating film 714 contains as little hydrogen, a hydroxyl group, and moisture as possible, it is preferable that impurities adsorbed on the substrate 700, such as moisture or hydrogen, be eliminated and removed by preheating the substrate 700, over which the gate electrode 713 is formed, in a preheating chamber of a sputtering apparatus, as a pretreatment for film formation. The temperature for the preheating is 100° C. to 400° C., preferably 150° C. to 300° C. As an exhaustion unit provided in the preheating chamber, a cryopump is preferably used. Note that this preheating treatment can be omitted.

The oxide semiconductor layer 715 can be formed by processing an oxide semiconductor film formed over the gate insulating film 714 into a desired shape. The thickness of the oxide semiconductor film is 2 nm to 200 nm, preferably 3 nm to 50 nm, further preferably 3 nm to 20 nm. The oxide semiconductor film is formed by sputtering using an oxide semiconductor target. Moreover, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is formed by sputtering, dust attached to a surface of the gate insulating film 714 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As described above, for the oxide semiconductor film, it is possible to use any of the following oxides: In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide which are oxides of four metal elements; In—Ga—Zn-based oxide (also referred to as IGZO), In—Sn—Zn-based oxide, In—Al—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; indium oxide, tin oxide, and zinc oxide. For example, an In—Sn—Ga—Zn-based oxide means a metal oxide containing indium (In), tin (Sn), gallium (Ga), and zinc (Zn), and there is no particular limitation on the composition ratio thereof. The above oxide semiconductor may include silicon.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than the In, Ga, and Zn.

Alternatively, an oxide semiconductor expressed by a chemical formula of $InMO_3(ZnO)_m$ (m>0, where m is not an integer) can be used for the oxide semiconductor layer. Here, M represents one or more metal elements selected from Ga, Al, Fe, Mn, and Co. Alternatively, as the oxide semiconductor, a material expressed by a chemical formula of $In_3SnO_5(ZnO)_n$ (n>0, where n is an integer) may be used.

In this embodiment, an In—Ga—Zn-based oxide semiconductor thin film with a thickness of 30 nm, which is obtained by sputtering using a target including indium (In), gallium (Ga), and zinc (Zn), is used as the oxide semiconductor film. As the target, a target having a composition ratio of In:Ga:Zn=1:1:0.5, In:Ga:Zn=1:1:1, or In:Ga:Zn=1:1:2 can be used, for example. The filling rate of the target including In, Ga, and Zn is 90% or higher and 100% or lower, and preferably 95% or higher and lower than 100%. With the use of the target with high filling rate, a dense oxide semiconductor film is formed.

An In—Sn—Zn-based oxide can be referred to as ITZO. In the case of using ITZO as the oxide semiconductor, an oxide target that has a composition ratio of In:Sn:Zn=1:2:2, 2:1:3, 1:1:1, 20:45:35, or the like in an atomic ratio is used.

In this embodiment, the oxide semiconductor film is formed over the substrate 700 in such a manner that the substrate is held in the treatment chamber kept at reduced pressure, a sputtering gas from which hydrogen and moisture have been removed is introduced into the treatment chamber while residual moisture therein is removed, and the above target is used. The substrate temperature may be 100° C. to 600° C., preferably 200° C. to 400° C. in the film formation. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$) (preferably, a compound containing a carbon atom as well), and the like are removed, whereby the concentration of impurities contained in the oxide semiconductor film formed in the deposition chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferable because dust generated in deposition can be reduced and the film thickness can be made uniform.

In order that the oxide semiconductor film contains as little hydrogen, a hydroxyl group, and moisture as possible, it is preferable that impurities adsorbed on the substrate 700, such as moisture or hydrogen, be eliminated and removed by preheating the substrate 700, over which films up to the gate insulating film 714 are formed, in a preheating chamber of a sputtering apparatus, as a pretreatment for film formation. The temperature for the preheating is 100° C. to 400° C., preferably, 150° C. to 300° C. As an evacuation means in the preheating chamber, a cryopump is preferably provided. Note that this preheating treatment can be omitted. This preheating may be similarly performed on the substrate 700 over which films up to conductive films 720 and 721 are formed, before an insulating film 722 is formed in a later step.

Note that etching for forming the oxide semiconductor layer 715 may be wet etching, dry etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, parallel plate RIE (reactive ion etching) or ICP (inductively coupled plasma) etching can be used. In order to etch the films into desired shapes, the etching conditions (e.g., the amount of electric power applied to a coil-shaped electrode, the amount of electric power applied to an electrode on the substrate side, and the temperature of the electrode on the substrate side) are adjusted as appropriate.

As an etchant used for wet etching, a mixed solution of phosphoric acid, acetic acid, and nitric acid, organic acid such as citric acid or oxalic acid, or the like can be used. In this embodiment, ITO-07N (produced by Kanto Chemical Co., Inc.) is used.

A resist mask used for forming the oxide semiconductor layer 715 may be formed by an inkjet method. Formation of the resist mask by an inkjet method needs no photomask; thus, production costs can be reduced.

Note that it is preferable that reverse sputtering be performed before the formation of a conductive film in a subsequent step to remove a resist residue or the like left over surfaces of the oxide semiconductor layer 715 and the gate insulating film 714.

Note that the oxide semiconductor layer formed by sputtering or the like sometimes contains a large amount of moisture or hydrogen (including a hydroxyl group) as impurities. Moisture and hydrogen easily form a donor level and thus serve as impurities in the oxide semiconductor. In one embodiment of the present invention, in order to reduce impurities such as moisture or hydrogen in the oxide semiconductor layer (perform dehydration or dehydrogenation), the oxide semiconductor layer 715 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, further preferably 10 ppb or less, in the case where measurement is performed by a dew point meter of a cavity ring down laser spectroscopy (CRDS) method).

Heat treatment performed on the oxide semiconductor layer 715 can eliminate moisture or hydrogen in the oxide semiconductor layer 715. Specifically, heat treatment is performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When an RTA method is used for the heat treatment, dehydration or dehydrogenation can be performed in a short time; therefore, treatment can be performed even at a temperature higher than the strain point of a glass substrate.

In this embodiment, an electrical furnace which is one of heat treatment apparatuses is used.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, for example, nitrogen or a rare gas such as argon is used.

Note that it is preferable that in the heat treatment, moisture, hydrogen, or the like be not contained in nitrogen or a rare gas such as helium, neon, or argon. The purity of nitrogen or the rare gas such as helium, neon, or argon which is introduced into a heat treatment apparatus is preferably 6N (99.9999%) or higher, further preferably 7N (99.99999%) or higher (i.e., the impurity concentration is preferably 1 ppm or lower, further preferably 0.1 ppm or lower).

Through the above process, the concentration of hydrogen in the oxide semiconductor layer 715 can be reduced. Accordingly, the oxide semiconductor layer 715 can be stable. In addition, heat treatment at a temperature that is lower than or equal to the glass transition temperature makes it possible to form the oxide semiconductor layer 715 with extremely low carrier density and a wide band gap. Thus, the transistor can be formed using a large-sized substrate, so that the productivity can be increased. Further, by using the oxide semiconductor layer 715 in which the hydrogen concentration is reduced and oxygen vacancies are reduced, a transistor with high withstand voltage and extremely low off-state current can be formed.

Note that in the case where the oxide semiconductor film is heated, depending on a material or heating conditions of the oxide semiconductor film, plate-shaped crystals are sometimes formed on the top surface of the oxide semiconductor film. The plate-shaped crystals are preferably single crystals that are c-axis-oriented in a direction substantially perpendicular to the surface of the oxide semiconductor film. If the plate-shaped crystals are not single crystals, they are preferably polycrystals where a-b planes of the crystals are aligned or the a-axes or the b-axes are aligned in the channel formation region and the crystals are oriented in the c-axis (the direction substantially perpendicular to the surface of the oxide semiconductor layer). Note that in the case where a surface of the layer placed below the oxide semiconductor layer is uneven, the plate-shaped crystals are polycrystals; therefore, the surface of the layer placed below the oxide semiconductor layer is preferably as even as possible.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Figure 15C:
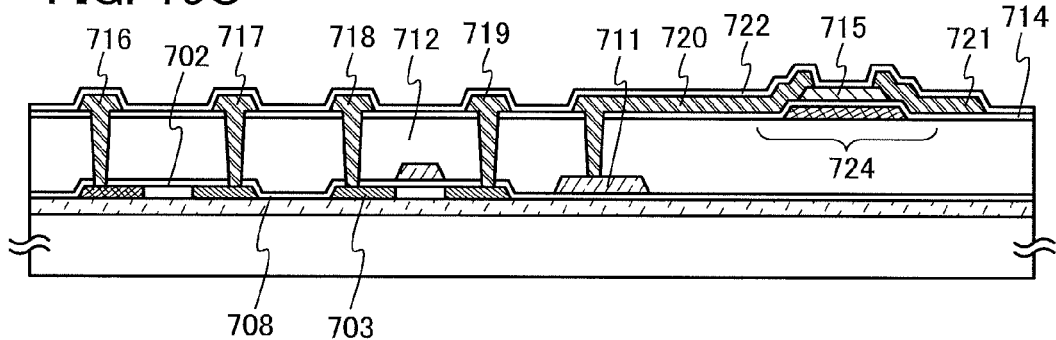

Then, a conductive film is formed so as to cover the oxide semiconductor layer 715 by sputtering or vacuum evaporation. After that, the conductive film is processed by etching or the like, so that conductive films 716, 717, 718, 719, 720, and 721 each of which functions as a source electrode, a drain electrode, or a wiring are formed as illustrated in FIG. 15C.

Note that the conductive films 716 and 717 are in contact with the island-shaped semiconductor film 702. The conductive films 718 and 719 are in contact with the island-shaped semiconductor film 703. The conductive film 720 is in contact with the wiring 711 and the oxide semiconductor layer 715. The conductive film 721 is in contact with the oxide semiconductor layer 715.

As a material of the conductive film for forming the conductive films 716 to 721, any of the following materials can be used, for example: an element selected from aluminum, chromium, copper, tantalum, titanium, molybdenum, or tungsten; an alloy containing any of these elements; and an alloy film containing the above elements in combination. Alternatively, the conductive film may have a structure in which a film of a refractory metal such as chromium, tantalum, titanium, molybdenum, or tungsten is stacked over or below a metal film of aluminum, copper, or the like. Aluminum and copper are preferably used in combination with a refractory metal material in order to avoid problems of heat resistance and corrosion. As the refractory metal material, molybdenum, titanium, chromium, tantalum, tungsten, neodymium, scandium, yttrium, or the like can be used.

The conductive films 716 to 721 may have a single-layer structure or a stacked structure including two or more layers. For example, the conductive films 716 to 721 may have a single-layer structure of an aluminum film containing silicon; a two-layer structure of an aluminum film and a titanium film stacked thereover; or a three-layer structure in which a titanium film, an aluminum film, and a titanium film are stacked in this order.

The conductive film for forming the conductive films 716 to 721 may be formed using a conductive metal oxide. As a conductive metal oxide, indium oxide, tin oxide, zinc oxide, an alloy of indium oxide and tin oxide, an alloy of indium oxide and zinc oxide, or the metal oxide material to which silicon or silicon oxide is added can be used.

In the case where heat treatment is performed after formation of the conductive film, the conductive film preferably has heat resistance high enough to withstand the heat treatment.

Note that the materials and etching conditions are adjusted as appropriate so that the oxide semiconductor layer 715 is not removed as much as possible in etching of the conductive film. Depending on etching conditions, an exposed portion of the oxide semiconductor layer 715 is partly etched and thus a groove (a recessed portion) is formed in some cases.

In this embodiment, a titanium film is used as the conductive film. For that reason, wet etching can be selectively performed on the conductive film by using a solution containing ammonia and hydrogen peroxide water (i.e., ammonia hydrogen peroxide mixture); in this case, the oxide semiconductor layer 715 is partly etched. Specifically, a solution in which oxygenated water of 31 wt %, ammonia water of 28 wt %, and water are mixed at a volume ratio of 5:2:2 is used as the ammonia hydrogen peroxide mixture. Alternatively, dry etching may be performed on the conductive film with the use of a gas containing chlorine ($Cl_2$), boron chloride ($BCl_3$), or the like.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. That is, a resist mask corresponding to at least two kinds of different patterns can be formed by one multi-tone mask. Thus, the number of light-exposure masks can be reduced and the number of corresponding photolithography steps can be also reduced, whereby the process can be simplified.

Next, plasma treatment using a gas such as $N_2O$, $N_2$, or Ar is performed. Through this plasma treatment, water or the like adsorbed on an exposed surface of the oxide semiconductor layer 715 is removed. Plasma treatment may be performed using a mixture gas of oxygen and argon.

After the plasma treatment, as illustrated in FIG. 15C, the insulating film 722 is formed so as to cover the conductive films 716 to 721 and the oxide semiconductor layer 715. The insulating film 722 preferably contains as little impurities such as moisture, hydrogen, and oxygen as possible. The insulating film 722 may be a single-layer insulating film or a stack of a plurality of insulating films. If hydrogen is contained in the insulating film 722, hydrogen might enter the oxide semiconductor layer or extract oxygen from the oxide semiconductor layer, thereby causing reduction in resistance of a back channel portion of the oxide semiconductor layer (making the back channel portion have n-type conductivity), which might result in formation of parasitic channel. Therefore, it is important that a film formation method in which hydrogen is not used be employed in order to form the insulating film 722 containing as little hydrogen as possible. A material with high barrier properties is preferably used for the insulating film 722. For example, as an insulating film with high barrier properties, a silicon nitride film, a silicon nitride oxide film, an aluminum nitride film, an aluminum nitride oxide film, or the like can be used. In the case of using a stack of a plurality of insulating films, an insulating film with a low nitrogen content, such as a silicon oxide film or a silicon oxynitride film, is formed on the side closer to the oxide semiconductor layer 715 than the insulating film with high barrier properties. Then, the insulating film with high barrier properties is formed so as to overlap with the conductive films 716 to 721 and the oxide semiconductor layer 715 with the insulating film with a low nitrogen content sandwiched therebetween. By using the insulating film with high barrier properties, impurities such as moisture or hydrogen can be prevented from entering the oxide semiconductor layer 715, the gate insulating film 714, or the interface between the oxide semiconductor layer 715 and another insulating film and the vicinity thereof. In addition, the insulating film with a low nitrogen content, such as a silicon oxide film or a silicon oxynitride film, is formed so as to be in contact with the oxide semiconductor layer 715, so that the insulating film with high barrier properties can be prevented from being in direct contact with the oxide semiconductor layer 715.

In this embodiment, the insulating film 722 is formed with a structure in which a 100-nm-thick silicon nitride film formed by sputtering is stacked over a 200-nm-thick silicon oxide film formed by sputtering. The substrate temperature in film formation may be higher than or equal to room temperature and lower than or equal to 300° C. and in this embodiment, is 100° C.

After the insulating film 722 is formed, heat treatment may be performed. The heat treatment is performed at preferably 200° C. to 400° C. (e.g., 250° C. to 350° C.) in a nitrogen atmosphere, an atmosphere of ultra-dry air, or a rare gas (e.g., argon or helium) atmosphere. The water content in the gas is preferably 20 ppm or less, more preferably 1 ppm or less, further preferably 10 ppb or less. In this embodiment, for example, heat treatment is performed at 250° C. for one hour in a nitrogen atmosphere. Alternatively, RTA treatment for a short time at a high temperature may be performed before the formation of the conductive films 716 to 721, in a manner similar to that of the previous heat treatment performed on the oxide semiconductor layer for reduction of moisture or hydrogen. Even when oxygen defects are generated in the oxide semiconductor layer 715 because of the previous heat treatment performed on the oxide semiconductor layer, by performing heat treatment after the insulating film 722 containing oxygen is provided, oxygen is supplied to the oxide semiconductor layer 715 from the insulating film 722. By supplying oxygen to the oxide semiconductor layer 715, oxygen defects that serve as donors can be reduced in the oxide semiconductor layer 715. As a result, the oxide semiconductor layer 715 can be made to be substantially i-type and variation in electrical characteristics of the transistor due to oxygen vacancy can be reduced; thus, the electrical characteristics can be improved. There is no particular limitation on the timing of this heat treatment as long as it is after the formation of the insulating film 722. When this heat treatment doubles as another step such as heat treatment for formation of a resin film or heat treatment for reduction of the resistance of a transparent conductive film, the oxide semiconductor layer 715 can be made to be substantially i-type without increase in the number of steps.

Further, oxygen vacancies that serves as donors in the oxide semiconductor layer 715 may be reduced by performing heat treatment on the oxide semiconductor layer 715 in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. The purity of oxygen gas which is introduced into a heat treatment apparatus is preferably 6N (99.9999%) or higher, further preferably 7N (99.99999%) or higher (i.e., the impurity concentration in the oxygen is preferably 1 ppm or lower, further preferably 0.1 ppm or lower).

Alternatively, an ion implantation method, an ion doping method, or the like may be employed to add oxygen to the oxide semiconductor layer 715 so that oxygen vacancies serving as donors are reduced. For example, oxygen which is made into a plasma state with a microwave at 2.45 GHz may be added to the oxide semiconductor layer 715.

Note that a backgate electrode may be formed in a position overlapping with the oxide semiconductor layer 715 by forming a conductive film over the insulating film 722 and then patterning the conductive film. In the case where the backgate electrode is formed, an insulating film is preferably formed to cover the backgate electrode. The backgate electrode can be formed using a material and a structure similar to those of the gate electrode 713 or the conductive films 716 to 721.

The thickness of the backgate electrode is 10 nm to 400 nm, preferably 100 nm to 200 nm. For example, the backgate electrode may be formed in a such a manner that a conductive film in which a titanium film, an aluminum film, and a titanium film are stacked is formed, a resist mask is formed by photolithography or the like, and unnecessary portions are removed by etching so that the conductive film is processed (patterned) into a desired shape.

Through the above steps, a transistor 724 is formed.

The transistor 724 includes the gate electrode 713, the gate insulating film 714 over the gate electrode 713, the oxide semiconductor layer 715 that overlaps the gate electrode 713 with the gate insulating film 714 placed therebetween, and a pair of the conductive films 720 and 721 formed over the oxide semiconductor layer 715. Further, the insulating film 722 may be considered as a component of the transistor 724. The transistor 724 illustrated in FIG. 15C has a channel-etched structure in which part of the oxide semiconductor layer 715, which is placed between the conductive film 720 and the conductive film 721, is etched.

Although the transistor 724 is described as a single-gate transistor, a multi-gate transistor that includes a plurality of gate electrodes 713 electrically connected to each other and thus has a plurality of channel formation regions can be formed, if needed.

Further, an insulating film in contact with the oxide semiconductor layer 715 (which corresponds to the gate insulating film 714 and the insulating film 722 in this embodiment) may be formed using an insulating material containing a Group 13 element and oxygen. Many of oxide semiconductor materials contain elements of Group 13, and an insulating material containing an element of Group 13 is compatible with an oxide semiconductor. Thus, when an insulating material containing an element of Group 13 is used for the insulating film in contact with the oxide semiconductor layer, the state of the interface between the oxide semiconductor layer and the insulating film can be kept favorable.

An insulating material containing a Group 13 element refers to an insulating material containing one or plural kinds of Group 13 elements. Examples of the insulating material containing a Group 13 element are gallium oxide, aluminum oxide, aluminum gallium oxide, and gallium aluminum oxide. Here, aluminum gallium oxide refers to a material in which the aluminum content is higher than that the gallium content in atomic percent (at. %), and gallium aluminum oxide refers to a material in which the gallium content is higher than or equal to the aluminum content in atomic percent (at. %).

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor layer is used for the insulating film. For example, it is effective to form an insulating film with the use of a material containing aluminum oxide. Note that water is not likely to permeate an aluminum oxide; therefore, it is preferable to use a material containing aluminum oxide in terms of preventing entry of water to the oxide semiconductor layer.

The insulating film in contact with the oxide semiconductor layer 715 preferably contains oxygen in a proportion higher than that in the stoichiometric composition by heat treatment in an oxygen atmosphere or by oxygen doping. Oxygen doping refers to addition of oxygen into a bulk. Note that the term "bulk" is used in order to clarify that oxygen is added not only to a surface of a thin film but also to the inside of the thin film. In addition, "oxygen doping" includes oxygen plasma doping by which oxygen plasma is added to a bulk. The oxygen doping may be performed by an ion implantation method or an ion doping method.

For example, in the case where the insulating film in contact with the oxide semiconductor layer 715 is formed using gallium oxide, the composition of gallium oxide can be set to be $Ga_2O_x$ (x=3+α, where 0<α<1) by heat treatment in an oxygen atmosphere or by oxygen doping.

In the case where the insulating film in contact with the oxide semiconductor layer 715 is formed using aluminum oxide, the composition of aluminum oxide can be set to be $Al_2O_x$ (x=3+α, where 0<α<1) by heat treatment in an oxygen atmosphere or by oxygen doping.

Moreover, in the case where the insulating film in contact with the oxide semiconductor layer 715 is formed using gallium aluminum oxide (aluminum gallium oxide), the composition of gallium aluminum oxide (aluminum gallium oxide) can be set to be $Ga_xAl_{2-x}O_{3+\alpha}$ (0<x<2, 0<α<1) by heat treatment in an oxygen atmosphere or by oxygen doping.

By oxygen doping, an insulating film that includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen vacancies in the oxide semiconductor layer or at the interface between the oxide semiconductor layer and the insulating film are reduced. Thus, the oxide semiconductor layer can be an i-type or substantially i-type oxide semiconductor.

The insulating film including a region where the proportion of oxygen is higher than that in the stoichiometric composition may be used as either the insulating film placed above the oxide semiconductor layer 715 or the insulating film placed below the oxide semiconductor layer 715 of the insulating films in contact with the oxide semiconductor layer 715; it is preferably used as both of the insulating films in contact with the oxide semiconductor layer 715. The above-described effect can be enhanced with a structure where the insulating films that include a region where the proportion of oxygen is higher than that in the stoichiometric composition are used as insulating films placed above and below the insulating films in contact with the oxide semiconductor layer 715, in order that the oxide semiconductor layer 715 is sandwiched therebetween.

The insulating films placed above and below the oxide semiconductor layer 715 may contain the same constituent element or different constituent elements. For example, both of the insulating films placed above and below the oxide semiconductor layer 715 may be formed using gallium oxide whose composition is $Ga_2O_x$ (x=3+α, where 0<α<1). Alternatively, one of these insulating films may be formed using gallium oxide whose composition is $Ga_2O_x$ (x=3+α, where 0<α<1) and the other thereof may be formed using aluminum oxide whose composition is $Al_2O_x$ (x=3+α, where 0<α<1).

The insulating film in contact with the oxide semiconductor layer 715 may be a stack of insulating films each of which includes a region where the proportion of oxygen is higher than that in the stoichiometric composition. For example, the insulating film placed above the oxide semiconductor layer 715 may be formed as follows: gallium oxide whose composition is $Ga_2O_x$ (x=3+α, where 0<α<1) is formed and gallium aluminum oxide (aluminum gallium oxide) whose composition is $Ga_xAl_{2-x}O_{3+α}$ (0<x<2, 0<α<1) is formed thereover. Note that it is possible that the insulating film placed below the oxide semiconductor layer 715, or both of the insulating films placed above and below the oxide semiconductor layer 715 may be a stack of insulating films each of which includes a region where the proportion of oxygen is higher than that in the stoichiometric composition.

The photodiode 704 can be used as the photodiode 302 illustrated in FIGS. 1A to 1C, FIGS. 13A and 13B, and the like. The n-channel transistor 705 can be used as the transistors 305, 306, and 307 illustrated in FIGS. 1A to 1C, FIGS. 13A and 13B, and the like and the transistor 323 illustrated in FIG. 4 and FIG. 7. The transistor 724 can be used as the transistor 304 illustrated in FIGS. 1A to 1C, FIGS. 13A and 13B, and the like. Moreover, the transistor 724 may be used as the transistors 305, 306, 307, and 323 illustrated in FIGS. 1A to 1C, FIGS. 13A and 13B, FIG. 4, and FIG. 7.

This embodiment can be implemented in combination with any of the embodiments.

Embodiment 8

In this embodiment, a transistor whose channel is formed in an oxide semiconductor layer and which has a structure different from that in Embodiment 7 will be described.

Figure 16A:
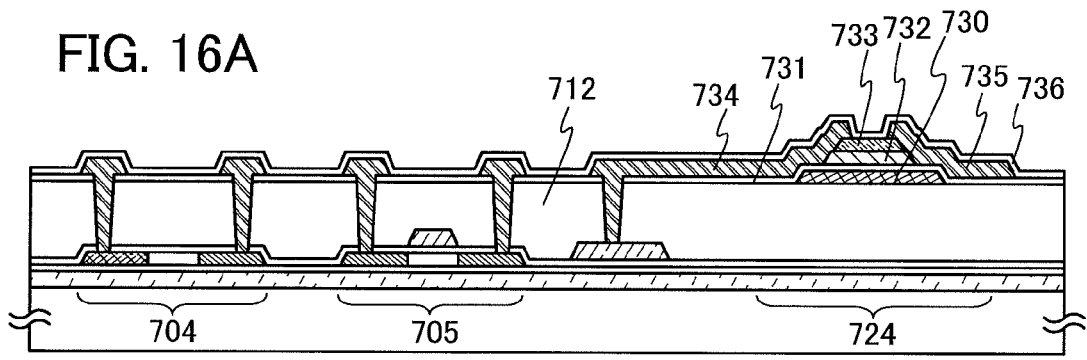
FIGS. 16A to 16D are cross-sectional views illustrating of semiconductor devices.

A semiconductor device illustrated in FIG. 16A includes the photodiode 704 and the n-channel transistor 705 as in Embodiment 7. In addition, in FIG. 16A, a bottom-gate transistor 724 with a channel protective structure is formed over the photodiode 704 and the n-channel transistor 705.

The transistor 724 includes a gate electrode 730 formed over the insulating film 712, a gate insulating film 731 over the gate electrode 730, an oxide semiconductor layer 732 overlapping the gate electrode 730 with the gate insulating film 731 placed therebetween, a channel protective film 733 formed over the oxide semiconductor layer 732 in a position overlapping with the gate electrode 730, and a conductive film 734 and a conductive film 735 formed over the oxide semiconductor layer 732. The transistor 724 may further include, as its component, an insulating film 736 formed over the conductive films 734 and 735 and the channel protective film 733.

The channel protective film 733 can prevent the portion serving as a channel formation region in the oxide semiconductor layer 732 from being damaged in a later step (e.g., from being reduced in thickness due to plasma or an etchant in etching). Thus, the reliability of the transistor 724 can be improved.

The channel protective film 733 can be formed using an inorganic material containing oxygen (e.g., silicon oxide, silicon nitride oxide, silicon oxynitride, aluminum oxide, or aluminum oxynitride). The channel protective film 733 can be formed by vapor deposition such as plasma CVD or thermal CVD, or sputtering. After the deposition, the shape of the channel protective film 733 is processed by etching. Here, the channel protective film 733 is formed in such a manner that a silicon oxide film is formed by sputtering and processed by etching using a mask formed by photolithography.

By using an inorganic material containing oxygen for the channel protective film 733, oxygen can be supplied from the channel protective film 733 to the oxide semiconductor layer 732 and oxygen vacancies serving as donors can be reduced even when oxygen vacancies occur in the oxide semiconductor layer 732 by heat treatment for reducing moisture or hydrogen. Thus, the channel formation region can be made to be close to i-type and a variation in electric characteristics of the transistor 724 due to oxygen vacancies can be reduced, which results in improvement of the electric characteristics.

Figure 16B:
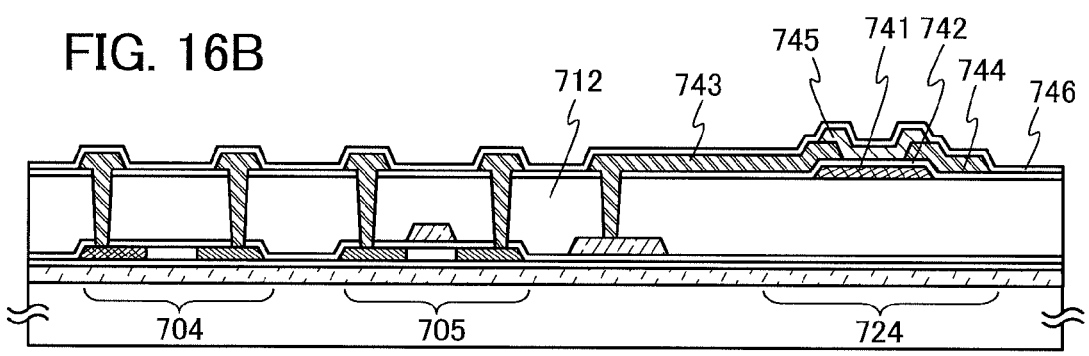

A semiconductor device illustrated in FIG. 16B includes the photodiode 704 and the n-channel transistor 705 as in Embodiment 7. In FIG. 16B, a bottom-contact transistor 724 is formed over the photodiode 704 and the n-channel transistor 705.

The transistor 724 includes a gate electrode 741 formed over the insulating film 712, a gate insulating film 742 over the gate electrode 741, a conductive film 743 and a conductive film 744 over the gate insulating film 742, and an oxide semiconductor layer 745 overlapping the gate electrode 741 with the gate insulating film 742 placed therebetween. Further, the transistor 724 may include an insulating film 746 formed over the oxide semiconductor layer 745, as its component.

Note that the transistor 724 illustrated in FIGS. 16A and 16B may further include a backgate electrode.

Figure 16C:
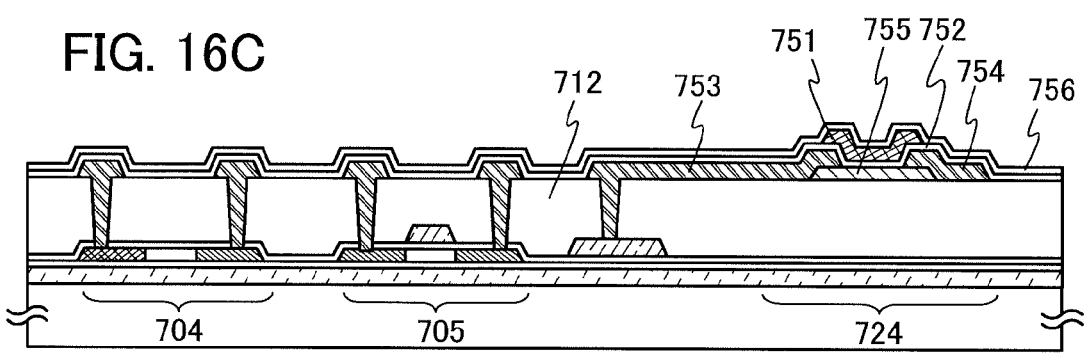

A semiconductor device illustrated in FIG. 16C includes the photodiode 704 and the n-channel transistor 705 as in Embodiment 7. In FIG. 16C, a top-contact transistor 724 is formed over the photodiode 704 and the n-channel transistor 705.

The transistor 724 includes an oxide semiconductor layer 755 formed over the insulating film 712, a conductive film 753 and a conductive film 754 over the oxide semiconductor layer 755, a gate insulating film 752 over the oxide semiconductor layer 755 and the conductive films 753 and 754, and a gate electrode 751 overlapping the oxide semiconductor layer 755 with the gate insulating film 752 placed therebetween. Further, an insulating film 756 formed over the gate electrode 751 may be included as a component of the transistor 724.

Figure 16D:
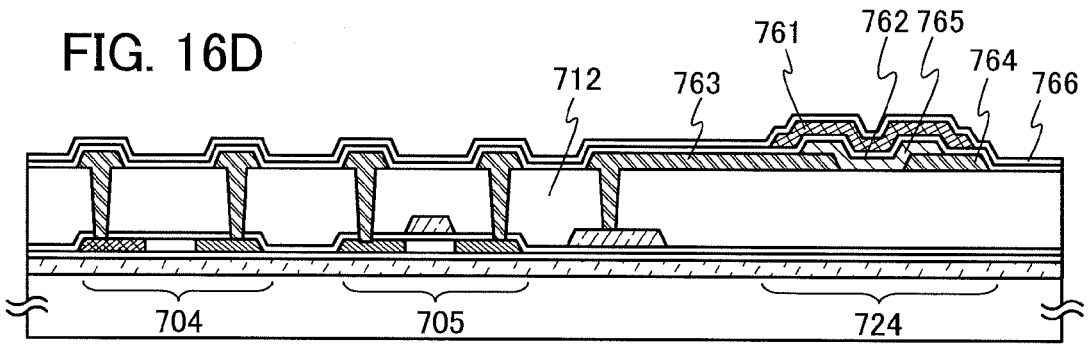

A semiconductor device illustrated in FIG. 16D includes the photodiode 704 and the n-channel transistor 705 as in Embodiment 7. In FIG. 16D, a top-contact transistor 724 is formed over the photodiode 704 and the n-channel transistor 705.

The transistor 724 includes a conductive film 763 and a conductive film 764 formed over the insulating film 712, an oxide semiconductor layer 765 over the conductive films 763 and 764, a gate insulating film 762 over the oxide semiconductor layer 765 and the conductive films 763 and 764, and a gate electrode 761 overlapping the oxide semiconductor layer 765 with the gate insulating film 762 placed therebetween. Further, an insulating film 766 formed over the gate electrode 761 may be included as a component of the transistor 724.

The photodiode 704 can be used as the photodiode 302 illustrated in FIGS. 1A to 1C, FIGS. 13A and 13B, and the like. The n-channel transistor 705 can be used as the transistors 305, 306, and 307 illustrated in FIGS. 1A to 1C, FIGS. 13A and 13B, and the like and the transistor 323 illustrated in FIG. 4 and FIG. 7. The transistor 724 can be used as the transistor 304 illustrated in FIGS. 1A to 1C, FIGS. 13A and 13B, and the like. Moreover, the transistor 724 may be used as the transistors 305, 306, 307, and 323 illustrated in FIGS. 1A to 1C, FIGS. 13A and 13B, FIG. 4, and FIG. 7.

This embodiment can be implemented in combination with any of the embodiments.

Embodiment 9

In this embodiment, an oxide including a crystal with c-axis alignment (also referred to as a c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

Examples of a crystal structure of the CAAC will be described in detail with reference to FIGS. 20A to 20E, FIGS. 21A to 21C, and FIGS. 22A to 22C. In FIGS. 20A to 20E, FIGS. 21A to 21C, and FIGS. 22A to 22C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 20A to 20E, 0 surrounded by a circle represents tetracoordinate O and O surrounded by a double circle represents tricoordinate O.

Figure 20A:
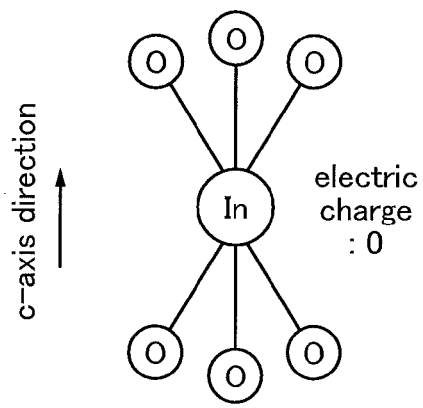
FIGS. 20A to 20E each illustrate a crystal structure of an oxide material.

FIG. 20A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 20A is actually an octahedral structure, but is illustrated as a planar structure for simplicity. Note that three tetracoordinate O atoms exist in each of an upper half and a lower half in FIG. 20A. In the small group illustrated in FIG. 20A, electric charge is 0.

Figure 20D:
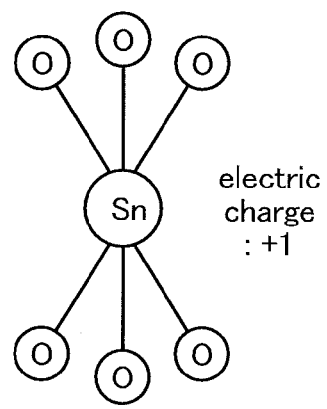
Figure 20B:
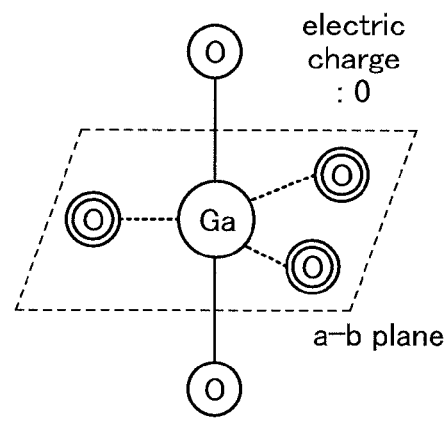

FIG. 20B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 20B. An In atom can also have the structure illustrated in FIG. 20B because an In atom can have five ligands. In the small group illustrated in FIG. 20B, electric charge is 0.

Figure 20E:
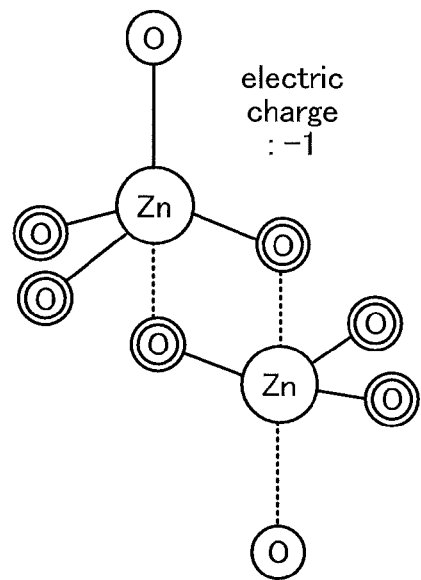
Figure 20C:
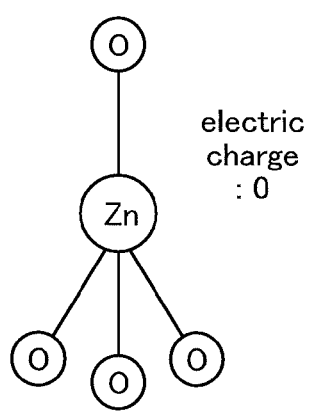

FIG. 20C illustrates a structure including one tetracoordinate Zn atom and four tetracoordinate O atoms proximate to the Zn atom. In FIG. 20C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 20C. In the small group illustrated in FIG. 20C, electric charge is 0.

FIG. 20D illustrates a structure including one hexacoordinate Sn atom and six tetracoordinate O atoms proximate to the Sn atom. In FIG. 20D, three tetracoordinate O atoms exist in each of an upper half and a lower half. In the small group illustrated in FIG. 20D, electric charge is +1.

FIG. 20E illustrates a small group including two Zn atoms. In FIG. 20E, one tetracoordinate O atom exists in each of an upper half and a lower half. In the small group illustrated in FIG. 20E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 20A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms proximate to and above the metal atom is equal to the number of the metal atoms proximate to and below each of the tetracoordinate O atoms. Similarly, the number of the tetracoordinate O atoms proximate to and below the metal atom is equal to the number of the metal atoms proximate to and above each of the tetracoordinate O atoms. Since O atoms contributing the bonding between the small groups are the tetracoordinate O atoms, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

Figure 21A:
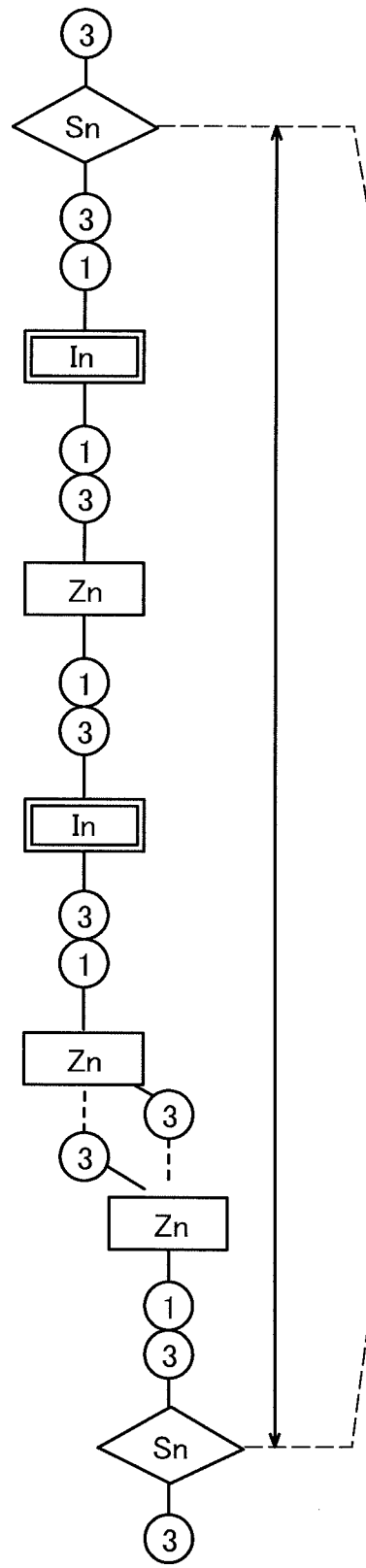
FIGS. 21A to 21C illustrate a crystal structure of an oxide material.
Figure 21B:
Figure 21C:
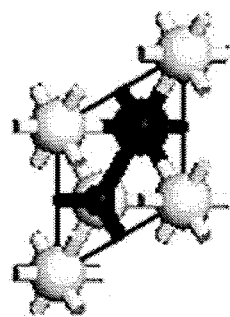

FIG. 21A illustrates a model of a medium group included in a layered structure of an In—Sn—Zn—O-based material. FIG. 21B illustrates a large group including three medium groups. FIG. 21C illustrates an atomic arrangement in the case where the layered structure in FIG. 21B is observed from the c-axis direction.

In FIG. 21A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 21A, one tetracoordinate O atom existing in each of an upper half and a lower half with respect to an In atom is denoted by circled 1. FIG. 21A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 21A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 20E can be given. For example, with one small group including two Zn atoms, electric charge of one small group including a Sn atom can be cancelled, so that the total electric charge of the layered structure can be 0.

When the large group illustrated in FIG. 21B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an oxide of four metal elements, such as an In—Sn—Ga—Zn-based oxide; an oxide of three metal elements, such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide.

Figure 22A:
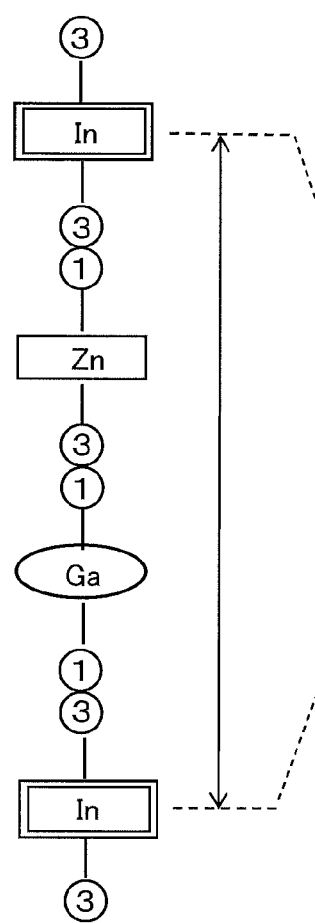
FIGS. 22A to 22C illustrate a crystal structure of an oxide material.

As an example, FIG. 22A illustrates a model of a medium group included in a layered structure of an In—Ga—Zn—O-based material.

In the medium group included in the layered structure of the In—Ga—Zn—O-based material in FIG. 22A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 22B:
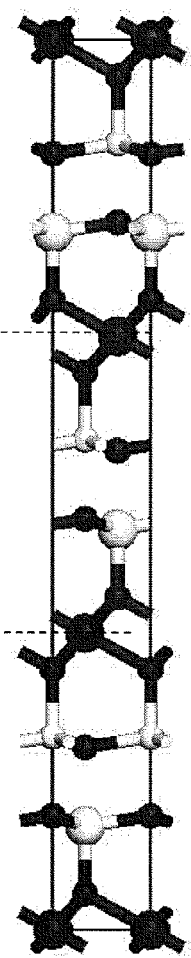
Figure 22C:
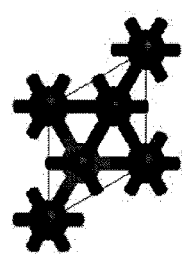

FIG. 22B illustrates a large group including three medium groups. FIG. 22C illustrates an atomic arrangement in the case where the layered structure in FIG. 22B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 22A but also a medium group in which the arrangement of the In atom, the Ga atom, and the Zn atom is different from that in FIG. 22A.

This embodiment can be implemented in combination with any of the embodiments.

Embodiment 10

In this embodiment, the field-effect mobility of a transistor will be described.

The actually measured field-effect mobility of an insulated gate transistor can be lower than its original mobility because of a variety of reasons; this phenomenon occurs not only in the case of using a transistor whose channel is formed in an oxide semiconductor layer. One of the reasons that reduce the mobility is a defect inside a semiconductor or a defect at an interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following Formula 2.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height E of the potential barrier is expressed as the following Formula 3 according to the Levinson model.

$$E = \frac{e^2 N^2}{8\varepsilon n} = \frac{e^2 N^2 t}{8\varepsilon C_{ox} V_g} \quad \text{[Formula 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region is expressed as the following Formula 4.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following Formula 5 is obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^2 N^2 t}{8 k T \varepsilon C_{ox} V_g} \quad \text{[Formula 5]}$$

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, $\mu_0$ can be calculated to be 120 cm²/Vs from Formula 2 and Formula 3. The measured mobility of an In—Sn—Zn oxide including a defect is approximately 40 cm²/Vs. However, assuming that no defect exists inside an oxide semiconductor and at the interface between the oxide semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer adversely affects the transport properties of the transistor. In other words, the mobility $\mu_1$ at a position that is distance x away from the interface between the channel and the gate insulating layer can be expressed as the following Formula 6.

$$\frac{1}{\mu_1} = \frac{1}{\mu_0} + \frac{D}{B} \exp\left(-\frac{x}{l}\right) \quad \text{[Formula 6]}$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Figure 23:
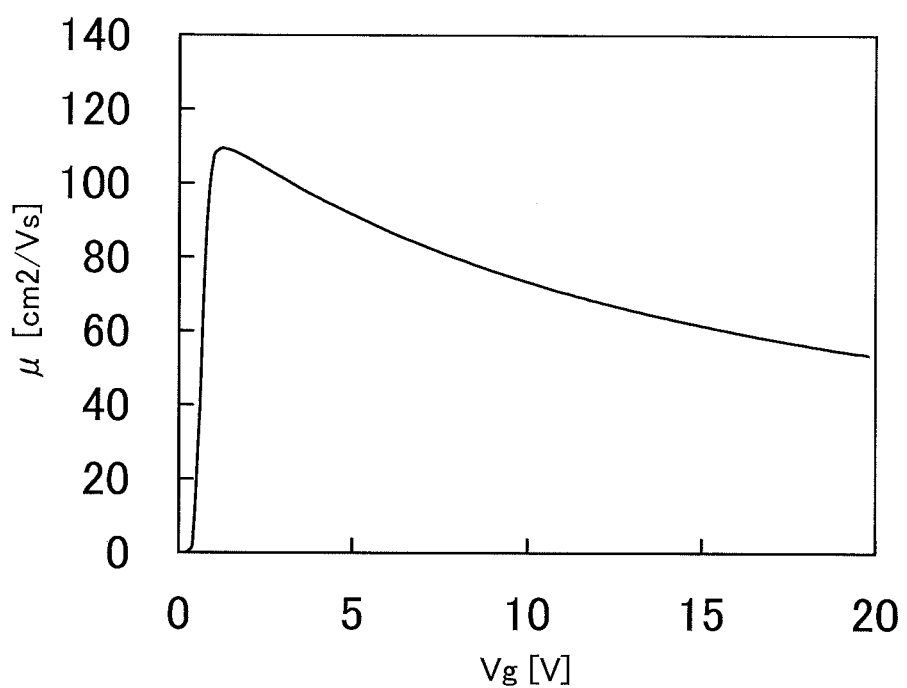
FIG. 23 shows gate voltage dependence of mobility obtained by calculation.

FIG. 23 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 23, the mobility has a peak of more than 100 cm²/Vs at a gate voltage that is a little over 1 V, and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 24A to 24C, FIGS. 25A to 25C, and FIGS. 26A to 26C. FIGS. 27A and 27B illustrate cross-sectional structures of the transistors used for the calculation. The transistors illustrated in FIGS. 27A and 27B each include a semiconductor region 903a and a semiconductor region 903c that have n⁺-type conductivity in an oxide semiconductor layer. The resistivity of the semiconductor regions 903a and 903c is 2×10⁻³ Ωcm.

The transistor in FIG. 27A is formed over a base insulating film 901 and an embedded insulator 902 that is embedded in the base insulating film 901 and formed of aluminum oxide. The transistor includes the semiconductor region 903a, the semiconductor region 903c, an intrinsic semiconductor region 903b that is placed between the semiconductor regions 903a and 903c and serves as a channel formation region, and a gate electrode 905. The width of the gate electrode 905 is 33 nm.

A gate insulating film 904 is formed between the gate electrode 905 and the semiconductor region 903b. A sidewall insulator 906a and a sidewall insulator 906b are formed on both side surfaces of the gate electrode 905, and an insulator 907 is formed over the gate electrode 905 so as to prevent a short circuit between the gate electrode 905 and another wiring. The sidewall insulator has a width of 5 nm. A source electrode 908a and a drain electrode 908b are provided in contact with the semiconductor region 903a and the semiconductor region 903c, respectively. Note that the channel width of this transistor is 40 nm.

The transistor in FIG. 27B is the same as the transistor in FIG. 27A in that it is formed over the base insulating film 901 and the embedded insulator 902 formed of aluminum oxide and that it includes the semiconductor region 903a, the semiconductor region 903c, the intrinsic semiconductor region 903b provided therebetween, the gate electrode 905 having a width of 33 nm, the gate insulating film 904, the sidewall insulator 906a, the sidewall insulator 906b, the insulator 907, the source electrode 908a, and the drain electrode 908b.

The difference between the transistor in FIG. 27A and the transistor in FIG. 27B is the conductivity type of semiconductor regions under the sidewall insulators 906a and 906b. In the transistor in FIG. 27A, the semiconductor regions under the sidewall insulator 906a and the sidewall insulator 906b are part of the semiconductor region 903a having n⁺-type conductivity and part of the semiconductor region 903c having n⁺-type conductivity, whereas in the transistor in FIG. 27B, the semiconductor regions under the sidewall insulator 906a and the sidewall insulator 906b are part of the intrinsic semiconductor region 903b. In other words, in the semiconductor layer of FIG. 27B, a region having a width of $L_{off}$ which overlaps with neither the semiconductor region 903a (the semiconductor region 903c) nor the gate electrode 905 is provided. This region is called an offset region, and the width $L_{off}$ is called an offset length. As is seen from the drawing, the offset length is equal to the width of the sidewall insulator 906a (the sidewall insulator 906b).

Figure 24A:
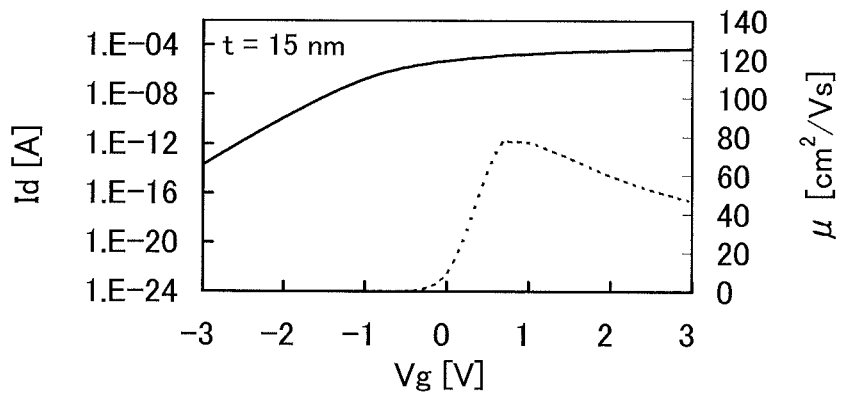
FIGS. 24A to 24C each show gate voltage dependence of drain current and mobility, obtained by calculation.
Figure 24B:
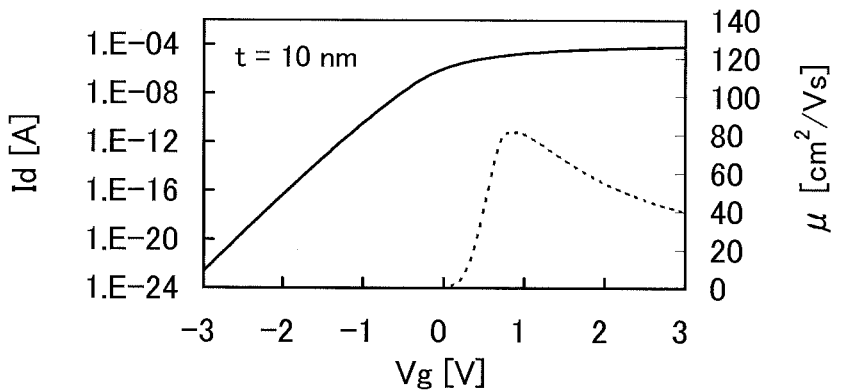
Figure 24C:
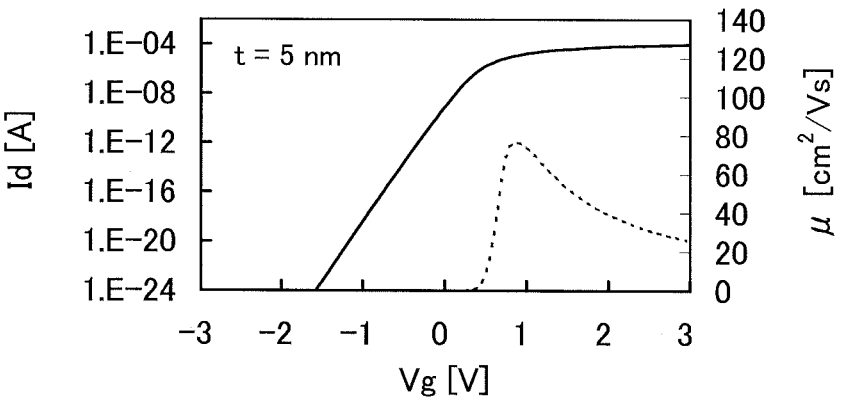

The other parameters used in calculation are as described above. For the calculation, device simulation software Sentaurus Device manufactured by Synopsys, Inc. was used. FIGS. 24A to 24C show the gate voltage ($V_g$: a potential difference between the gate and the source) dependence of the drain current ($I_d$, a solid line) and the mobility (μ, a dotted line) of the transistor having the structure illustrated in FIG. 27A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 24A shows the gate voltage dependence of the transistor in the case where the thickness of the gate insulating film is 15 nm, FIG. 24B shows that of the transistor in the case where the thickness of the gate insulating film is 10 nm, and FIG. 24C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in the peak value of the mobility μ and the drain current $I_d$ in an on state (the on-state current). The graphs show that the drain current exceeds 10 μA at a gate voltage of around 1 V.

Figure 25A:
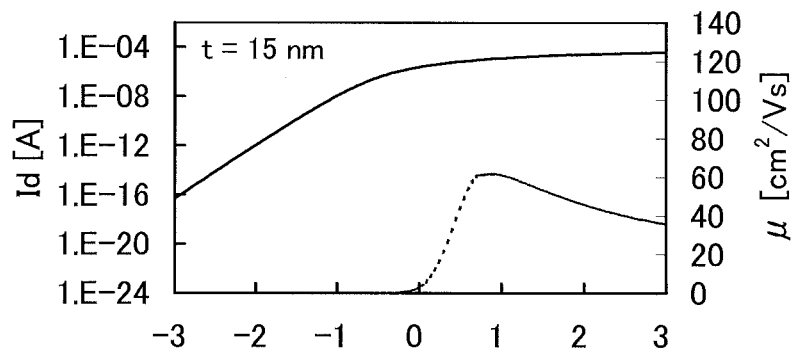
FIGS. 25A to 25C each show gate voltage dependence of drain current and mobility, obtained by calculation.
Figure 25B:
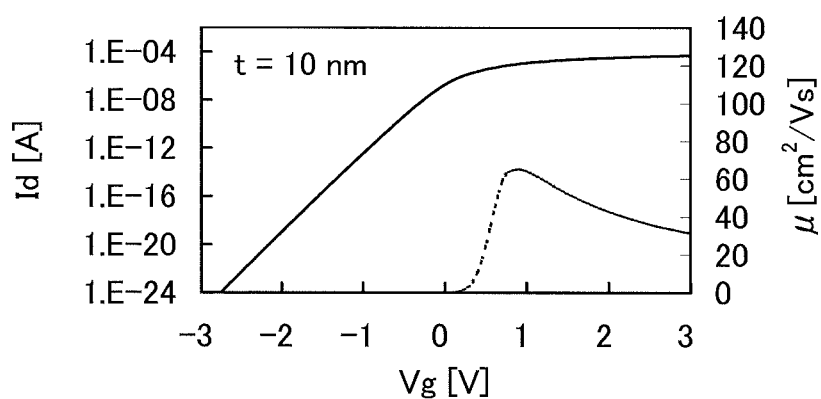
Figure 25C:
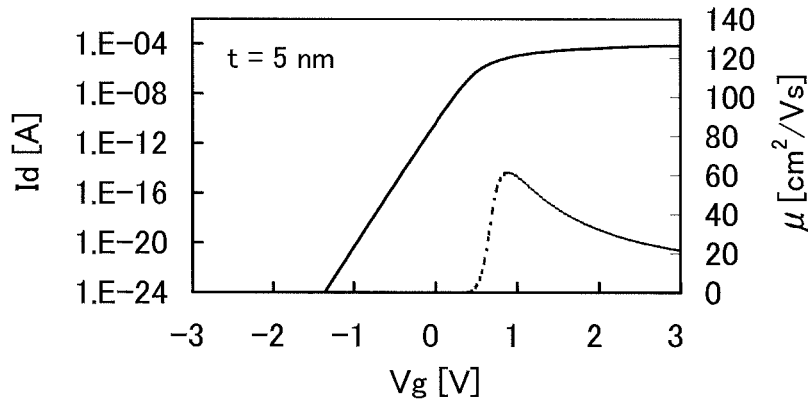

FIGS. 25A to 25C show the gate voltage $V_g$ dependence of the drain current $I_d$ (a solid line) and the mobility μ (a dotted line) of the transistor having the structure in FIG. 27B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 25A shows the gate voltage dependence of the transistor in the case where the thickness of the gate insulating film is 15 nm, FIG. 25B shows that of the transistor in the case where the thickness of the gate insulating film is 10 nm, and FIG. 25C shows that of the transistor in the case where the thickness of the gate insulating film is 5 nm.

Figure 26A:
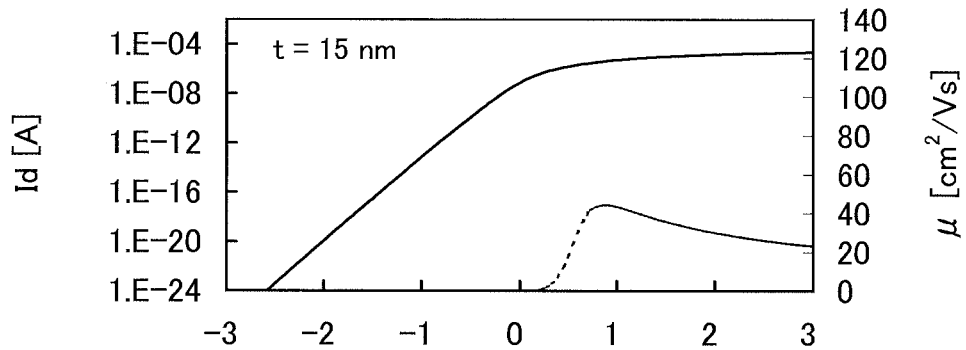
FIGS. 26A to 26C each show gate voltage dependence of drain current and mobility, obtained by calculation.
Figure 26B:
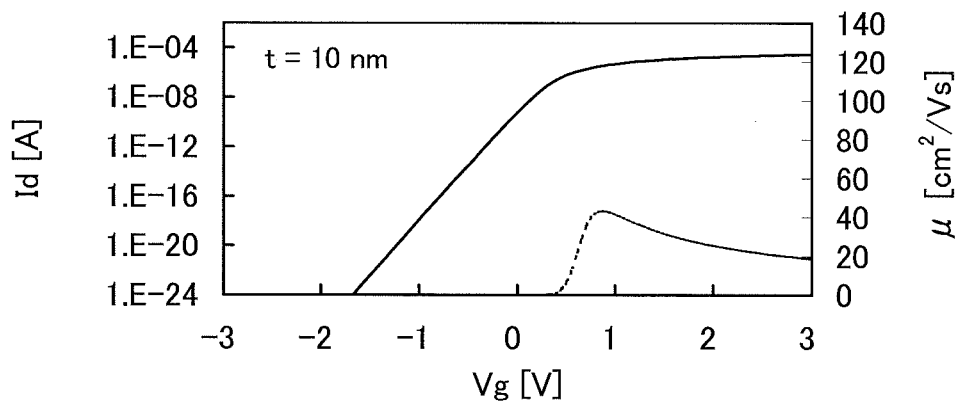
Figure 26C:
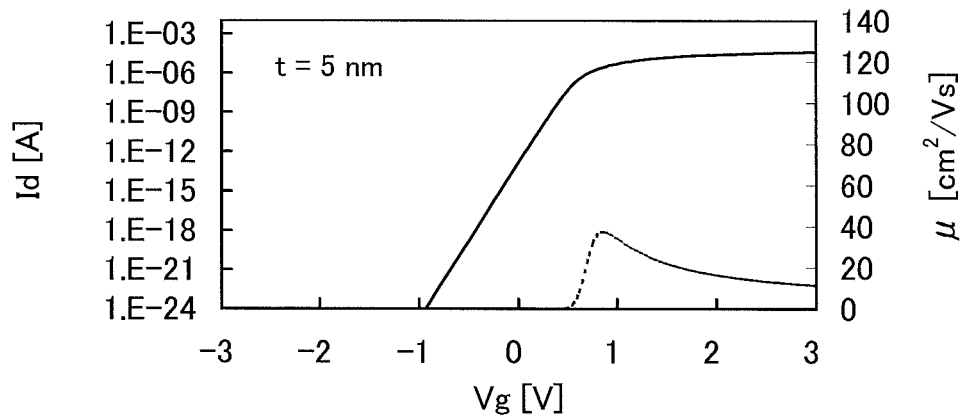
Figure 27A:
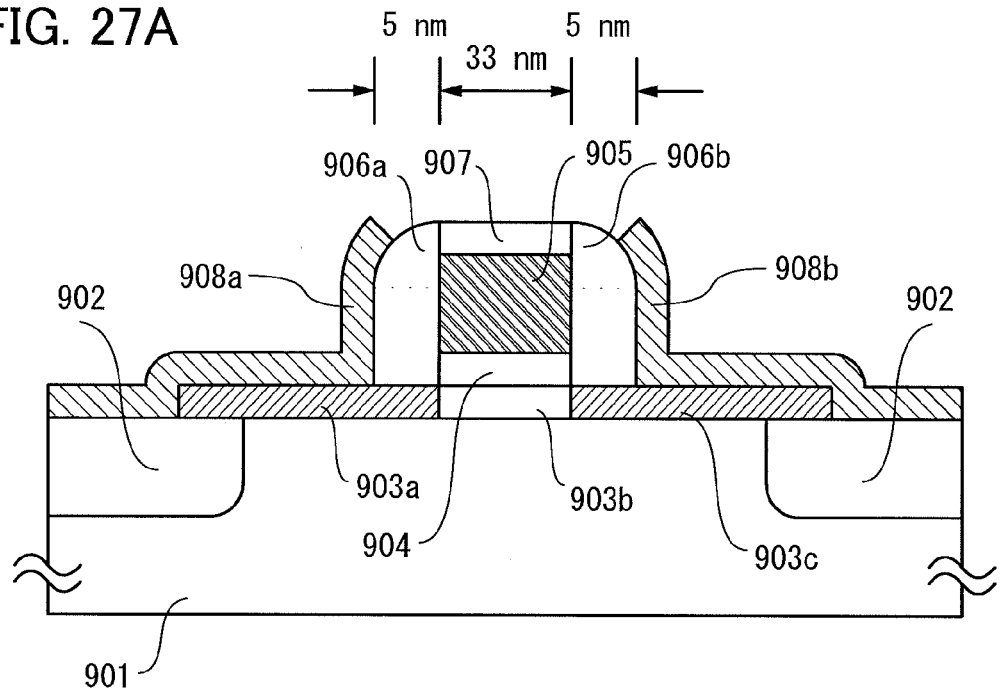
FIGS. 27A and 27B each illustrate a cross-sectional structure of a transistor used in calculation.
Figure 27B:
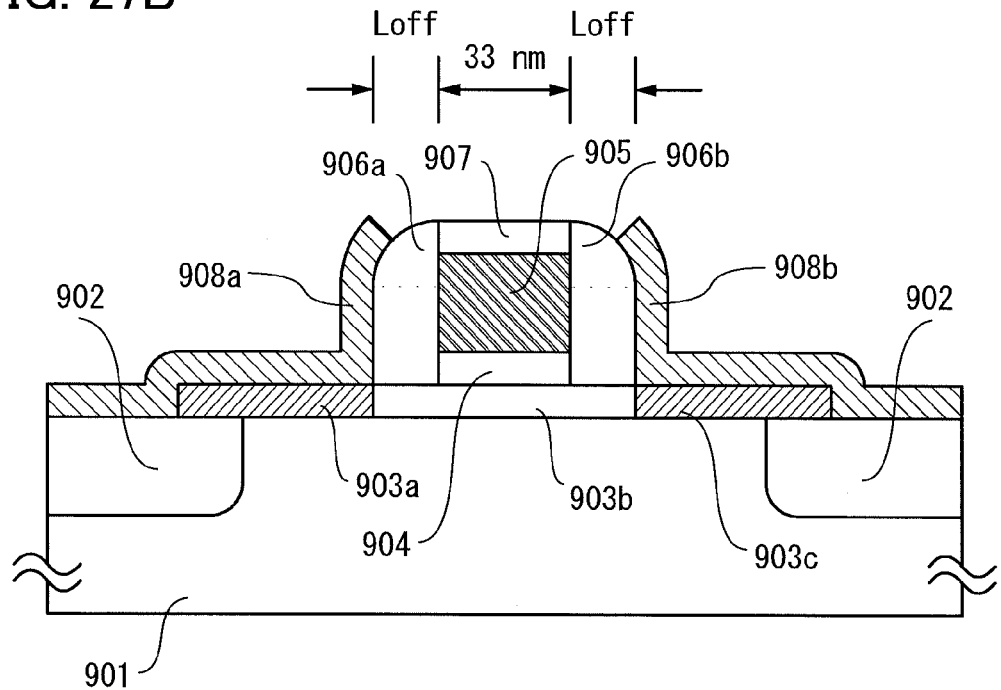

FIGS. 26A to 26C show the gate voltage dependence of the drain current $I_d$ (a solid line) and the mobility μ (a dotted line) of the transistor having the structure in FIG. 27B and an offset length $L_{off}$ of 15 nm. The drain current $I_d$ is obtained by calculation under the assumption that the drain voltage is +1 V and the mobility μ is obtained by calculation under the assumption that the drain voltage is +0.1 V. FIG. 26A shows the gate voltage dependence of the transistor in the case where the thickness of the gate insulating film is 15 nm, FIG. 26B shows that of the transistor in the case where the thickness of the gate insulating film is 10 nm, and FIG. 26C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 24A to 24C, approximately 60 cm²/Vs in FIGS. 25A to 25C, and approximately 40 cm²/Vs in FIGS. 26A to 26C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

This embodiment can be implemented in combination with any of the embodiments.

Embodiment 11

The semiconductor device according to one embodiment of the present invention includes a panel where a plurality of pixels are formed, and a module in which an IC including a driver circuit, a controller, a CPU, a memory, and the like and a backlight are mounted on the panel, in its category. A driver circuit may be formed on the panel.

Figure 18:
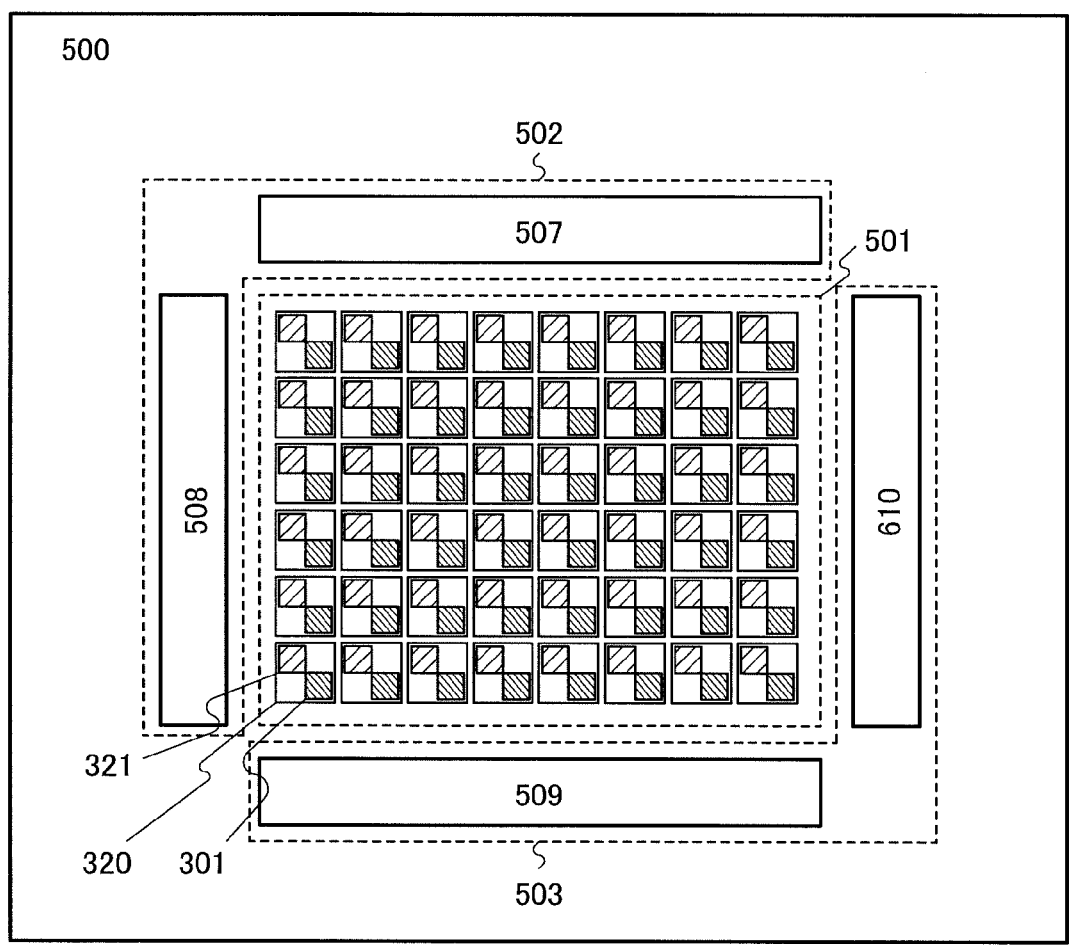
FIG. 18 illustrates a structure of a semiconductor device.

FIG. 18 illustrates an example of a structure of a semiconductor device including a plurality of pixels and a driver circuit for driving the plurality of pixels. FIG. 18 shows a structure in which the pixel 320 includes one photosensor 301 and one display element 321. The configurations of the pixel 320, the photosensor 301, and the display element 321 can be similar to those illustrated in FIGS. 1A to 1C, FIG. 4, FIG. 5, FIG. 7, FIGS. 13A and 13B, and the like.

A semiconductor device 500 includes a pixel circuit 501, a display element control circuit 502, and a photosensor control circuit 503. The pixel circuit 501 includes a plurality of pixels 320 arranged in matrix. Each of the pixels 320 includes the display element 321 and the photosensor 301. The semiconductor device 500 is a touch panel.

The display element control circuit 502 controls the display elements 321 and includes a display element driver circuit 507 and a display element driver circuit 508. The display element driver circuit 507 inputs a signal to the display element 321 through a signal line (also referred to as a source signal line) such as a signal line to which an image signal is input. The display element driver circuit 508 inputs a signal to the display element 321 through a scan line (also referred to as a gate signal line). For example, the display element driver circuit 508 has a function of selecting display elements 321 included in pixels placed in a particular row. The display element driver circuit 507 has a function of supplying a given potential to display elements 321 included in pixels in a selected row.

Here, the structure of the photosensor control circuit 503 is different for the plurality of pixels arranged in matrix illustrated in FIG. 1C and FIG. 4 and the plurality of pixels arranged in matrix illustrated in FIG. 5 and FIG. 7.

The structure of the photosensor control circuit 503 for driving the plurality of pixels arranged in matrix illustrated in FIG. 1C and FIG. 4 will be described.

The photosensor control circuit 503 is a circuit for controlling the photosensors 301 and includes a photosensor driver circuit 509 on the signal line side and a photosensor driver circuit 610 on the scan line side. The photosensor driver circuit 610 on the scan line side generates signals output to the wiring SE, the wiring TX, and the wiring PR. The photosensor driver circuit 509 on the signal line side has a function of taking out an output signal of the photosensors 301 included in the pixels 320 in a selected row from the wiring OUT. The photosensor driver circuit 509 includes a precharge circuit and has a function of setting the potential of the wiring OUT at a given potential. Note that the photosensor driver circuit 509 on the signal line side can have a structure in which an output, which is an analog signal, of the photosensor is extracted as an analog signal to the outside of the semiconductor device 500 with an OP amplifier; or a structure in which the output is converted into a digital signal by an A/D converter circuit and then extracted to the outside of the touch panel.

The structure of the photosensor control circuit 503 for driving the plurality of pixels arranged in matrix illustrated in FIG. 5 and FIG. 7 will be described.

The photosensor control circuit 503 is a circuit for controlling the photosensors 301 and includes the photosensor driver circuit 509 on the signal line side and the photosensor driver circuit 610 on the scan line side. The photosensor driver circuit 610 on the scan line side generates signals output to the wiring SE. The photosensor driver circuit 509 on the signal line side generates signals output to the wiring TX and the wiring PR, and has a function of taking out an output signal of the photosensors 301 included in the pixels 320 in a selected row from the wiring OUT. The photosensor driver circuit 509 includes a precharge circuit and has a function of setting the potential of the wiring OUT at a given potential. Note that the photosensor driver circuit 509 on the signal line side can have a structure in which an output, which is an analog signal, of the photosensor is extracted as an analog signal to the outside of the semiconductor device 500 with an OP amplifier; or a structure in which the output is converted into a digital signal by an A/D converter circuit and then extracted to the outside of the touch panel.

This embodiment can be implemented in combination with any of the embodiments.

Embodiment 12

In this embodiment, the arrangement of a panel and a backlight in the semiconductor device according to one embodiment of the present invention will be described.

Figure 17:
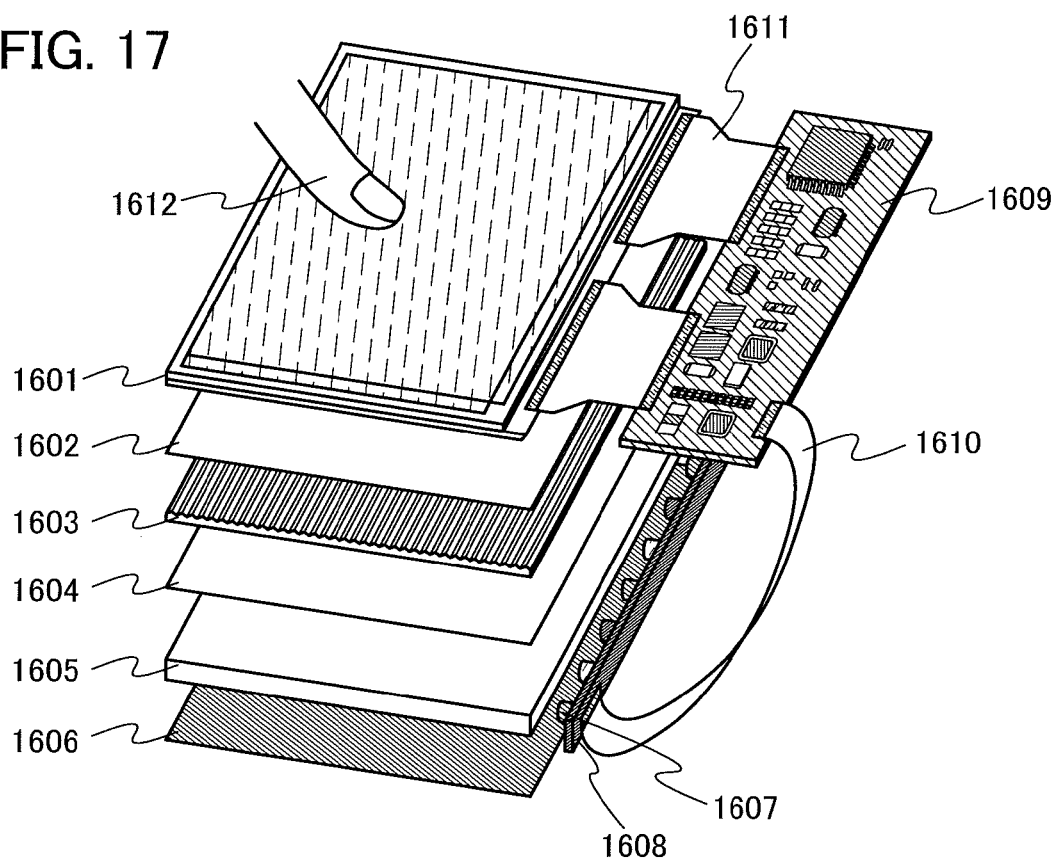
FIG. 17 is a perspective view illustrating a structure of a semiconductor device.

FIG. 17 is an example of a perspective view illustrating a structure of the semiconductor device according to one embodiment of the present invention. The semiconductor device illustrated in FIG. 17 includes a panel 1601 in which a pixel including a display element and a photosensor is formed between a pair of substrates, a first diffuser plate 1602, a prism sheet 1603, a second diffuser plate 1604, a light guide plate 1605, a reflective plate 1606, a backlight 1608 including a plurality of light sources 1607, and a circuit board 1609.

The panel 1601, the first diffuser plate 1602, the prism sheet 1603, the second diffuser plate 1604, the light guide plate 1605, and the reflective plate 1606 are sequentially stacked. The light sources 1607 are provided at an end portion of the light guide plate 1605. Light from the light sources 1607 diffused into the light guide plate 1605 is uniformly emitted to the panel 1601 from the counter substrate side with the first diffuser plate 1602, the prism sheet 1603, and the second diffuser plate 1604.

Although the first diffuser plate 1602 and the second diffuser plate 1604 are used in this embodiment, the number of diffuser plates is not limited to two. The number of diffuser plates may be one or may be three or more. The diffuser plate should be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Further, the cross section of the prism sheet 1603 is not limited to a sawtooth shape illustrated in FIG. 17. The prism sheet 1603 can have any shape as long as light from the light guide plate 1605 can be concentrated on the panel 1601 side.

The circuit board 1609 is provided with a circuit for generating or processing various signals to be input to the panel 1601, a circuit for processing various signals to be output from the panel 1601, and the like. In addition, the circuit board 1609 and the panel 1601 are connected to each other via a flexible printed circuit (FPC) 1611 in FIG. 17. Note that the above circuit may be connected to the panel 1601 by a chip on glass (COG) method, or part of the above circuit may be connected to the FPC 1611 by a chip on film (COF) method.

FIG. 17 illustrates an example in which a control circuit for controlling the driving of the light sources 1607 is provided on the circuit board 1609, and the control circuit and the light sources 1607 are connected to each other via an FPC 1610. Alternatively, the control circuit may be formed over the panel 1601, in which case the panel 1601 and the light sources 1607 are connected to each other via an FPC or the like.

As the light sources 1607, light-emitting elements such as LEDs or OLEDs can be used.

As the light sources 1607, either a light source that emits visible light or a light source that emits infrared light can be used, or both of such light sources can be used.

Infrared light cannot be seen with the human eye. Therefore, in a semiconductor device including both a light source that emits visible light and a light source that emits infrared light as the light sources 1607, only the on/off state of the light source that emits infrared light is selected when the on/off state of the backlight is selected in the driving methods described using the timing charts in FIG. 3 and FIG. 6, whereby a captured image of an object to be detected can be generated and a region where the object exists can be detected without any adverse effect on image display.

FIG. 17 illustrates an edge-lit backlight in which the light sources 1607 are provided at an edge of the panel 1601; alternatively, the semiconductor device according to one embodiment of the present invention may include a direct-lit backlight including the light sources 1607, which is provided directly below the panel 1601.

For example, when a finger 1612 which is an object to be captured gets close to the panel 1601, part of light that is emitted from the backlight 1608 and passes through the panel 1601 is reflected from the finger 1612 and enters the panel 1601 again. Color positional data of the finger 1612, which is the object, can be obtained by sequentially turning on the light sources 1607 that correspond to individual colors and obtaining positional data of each color.

This embodiment can be implemented in combination with any of the embodiments.

Example 1

A transistor whose channel is formed in an oxide semiconductor including In, Sn, and Zn as main components can have favorable characteristics by depositing an oxide semiconductor film to serve as the oxide semiconductor layer while heating a substrate or by performing heat treatment after the oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 28A:
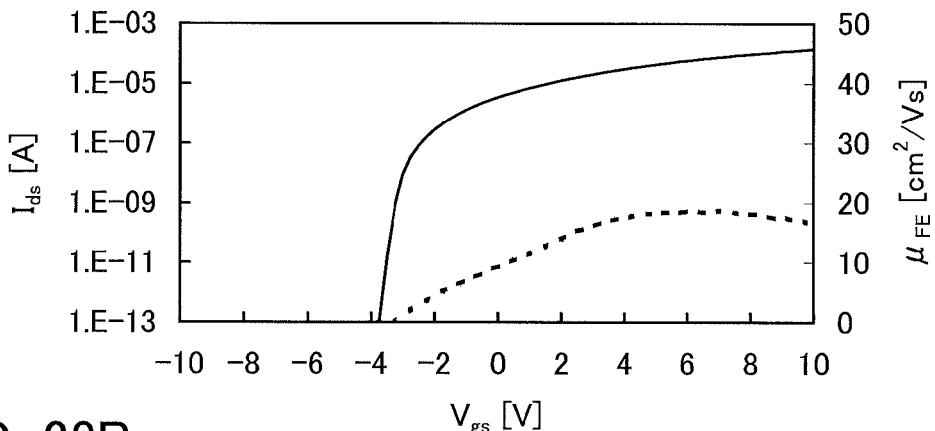
FIGS. 28A to 28C each show $V_{gs}$-$I_{ds}$ characteristics and field-effect mobility of a transistor including an oxide semiconductor film.
Figure 28B:
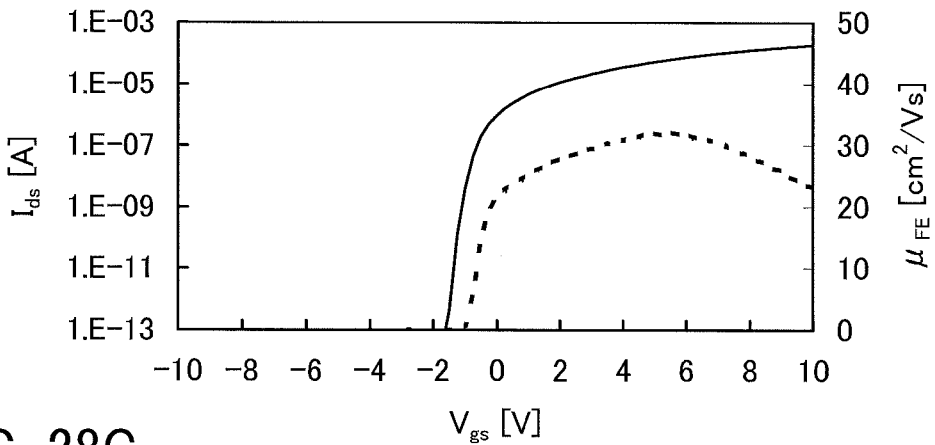
Figure 28C:
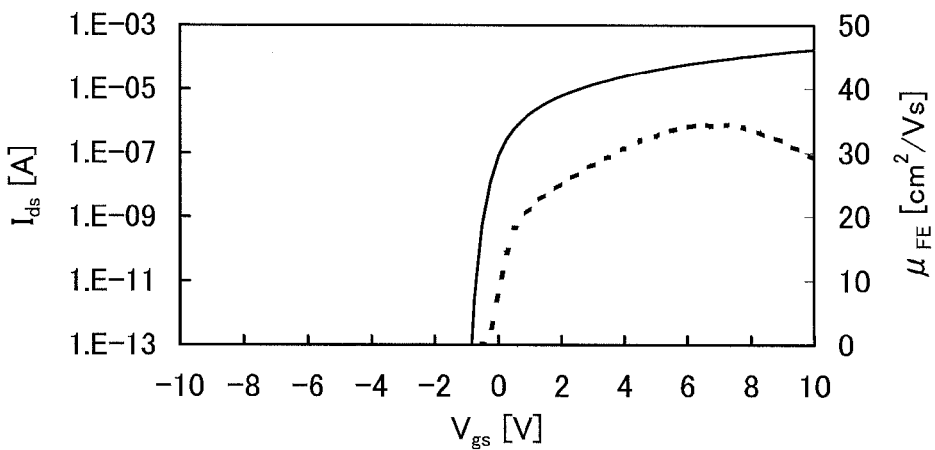

As an example, FIGS. 28A to 28C each show characteristics of a transistor that includes an oxide semiconductor film including In, Sn, and Zn as main components and having a channel length L of 3 μm and a channel width W of 10 μm, and a gate insulating film with a thickness of 100 nm. Note that $V_d$ was set to 10 V.

FIG. 28A shows characteristics of a transistor whose oxide semiconductor film including In, Sn, and Zn as main components was formed by sputtering without heating a substrate intentionally. The peak of the field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 28B shows characteristics of a transistor whose oxide semiconductor film including In, Sn, and Zn as main components was formed while heating a substrate at 200° C. The peak of the field-effect mobility of the transistor is 32.2 cm$^2$/Vsec.

The field-effect mobility can be further improved by performing heat treatment after formation of the oxide semiconductor film including In, Sn, and Zn as main components. FIG. 28C shows characteristics of a transistor whose oxide semiconductor film including In, Sn, and Zn as main components was formed by sputtering at 200° C. and then subjected to heat treatment at 650° C. The peak of the field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 28A and 28B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$-$I_{ds}$ characteristics of the transistors were measured at a substrate temperature of 25° C. and $V_{ds}$ of 10 V. Note that $V_{ds}$ refers to a drain voltage (a potential difference between the drain and the source). Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set at 150° C. and $V_{ds}$ was set to 0.1 V. After that, $V_{gs}$ of −20 V was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 29A:
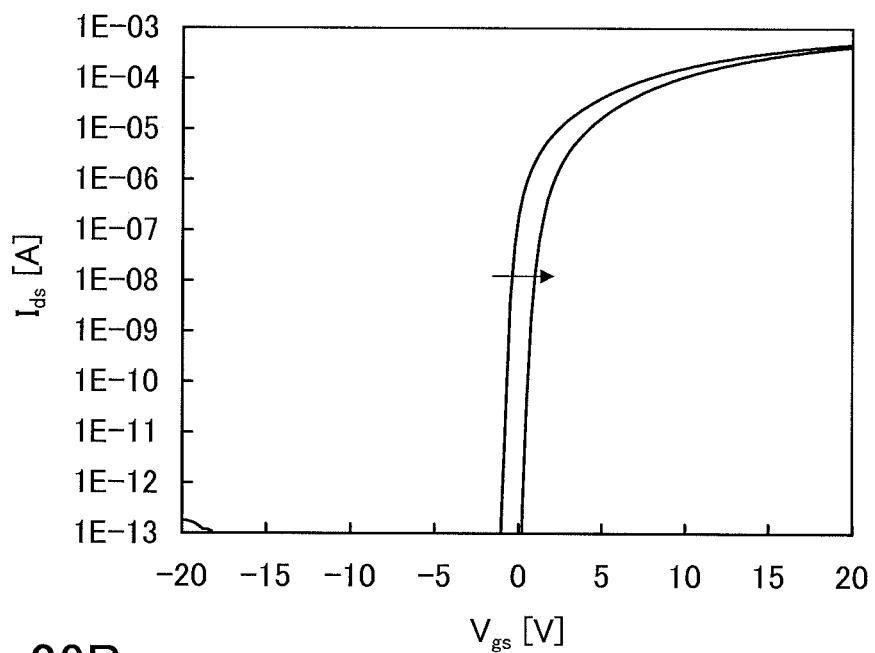
FIGS. 29A and 29B show $V_{gs}$-$I_{ds}$ characteristics after BT tests of a transistor of Sample 1.
Figure 29B:
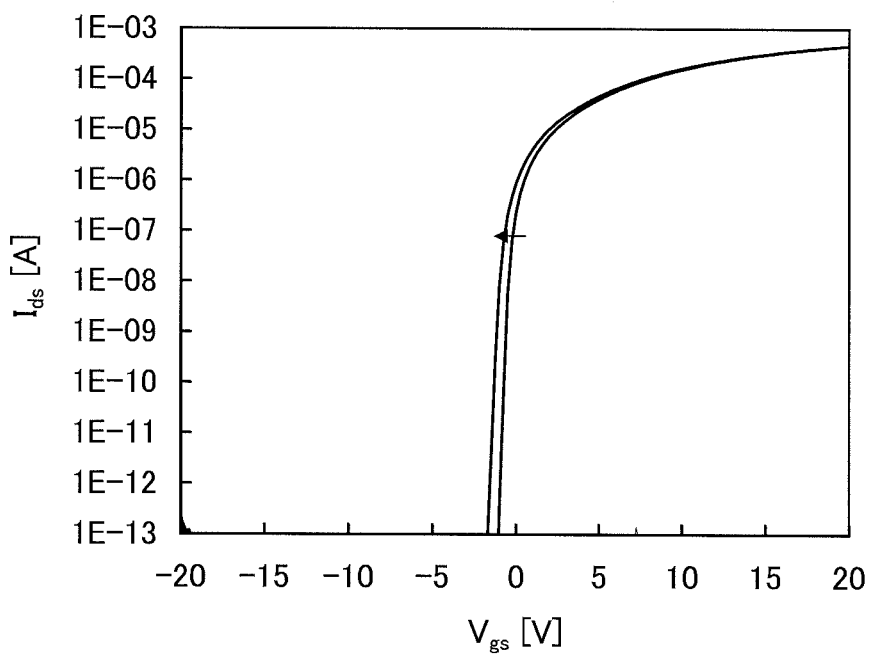
Figure 30A:
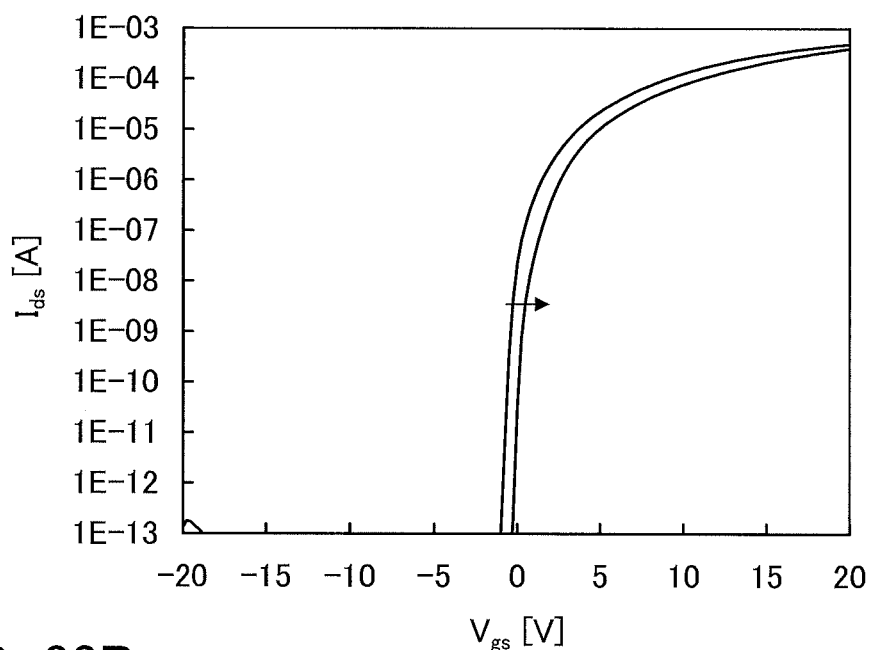
FIGS. 30A and 30B show $V_{gs}$-$I_{ds}$ characteristics after BT tests of a transistor of Sample 2.
Figure 30B:
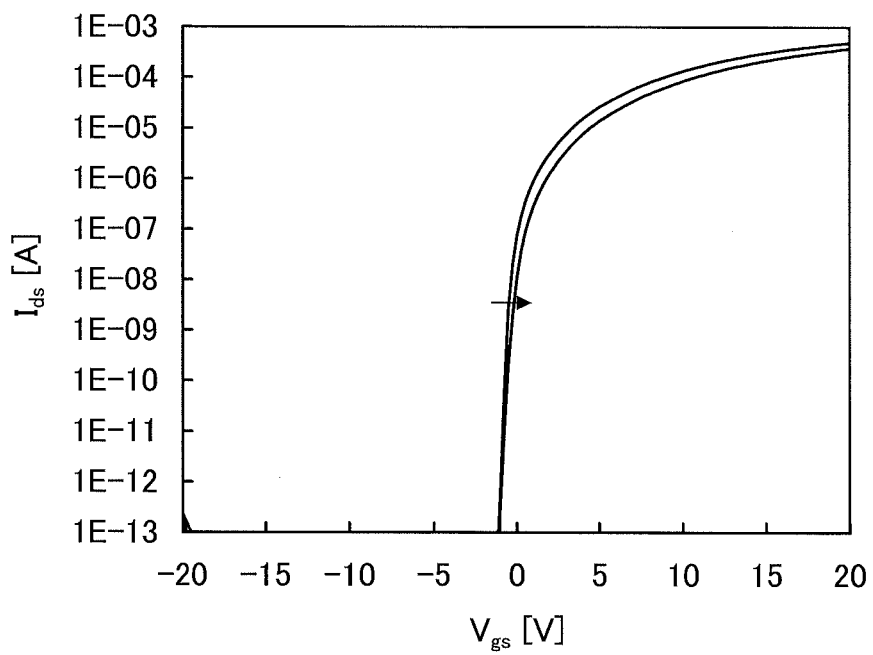

FIGS. 29A and 29B show results of the positive BT test and the negative BT test, respectively, of Sample 1. FIGS. 30A and 30B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface between the oxide semiconductor and a film in contact with the oxide semiconductor; when excess oxygen is included in the oxide semiconductor by the heat treatment, oxygen vacancy caused later can be compensated for with excess oxygen. The excess oxygen is mainly oxygen existing between lattices. When the concentration of oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 31:
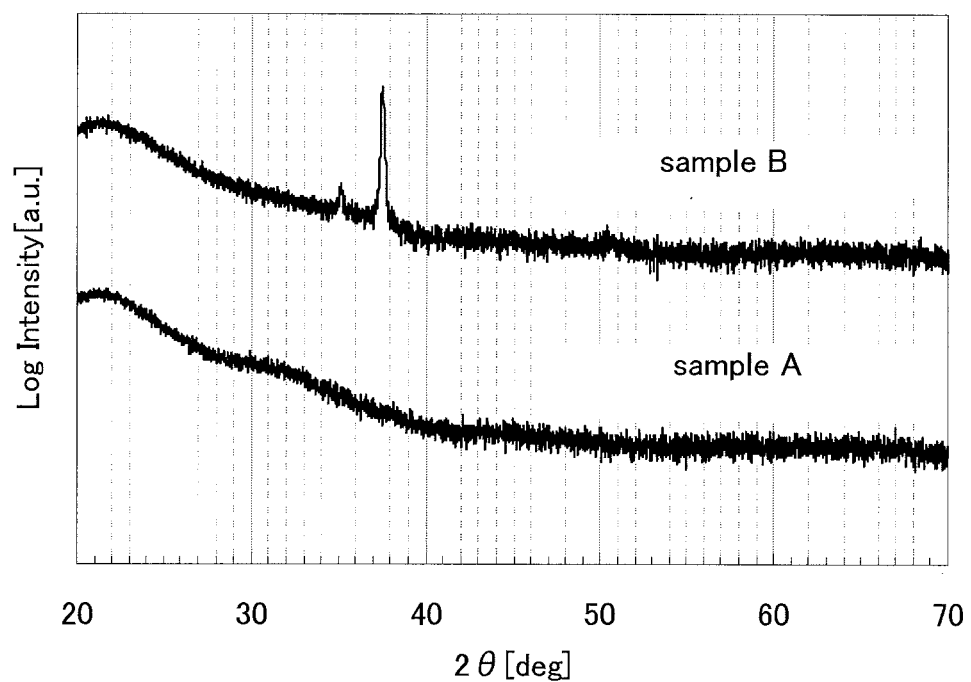
FIG. 31 shows XRD spectra of Sample A and Sample B.

FIG. 31 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 32:
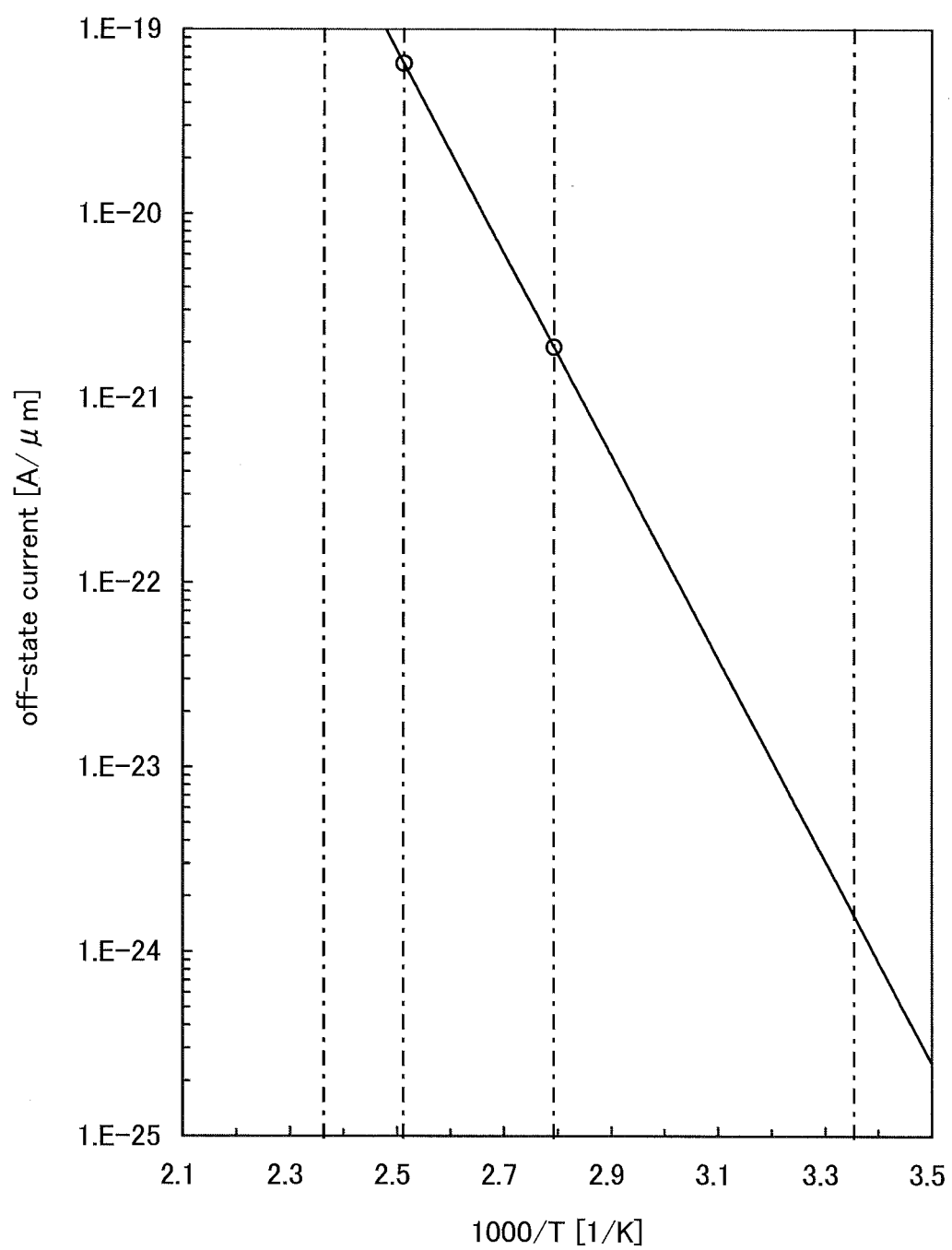
FIG. 32 shows a relation between off-state current of a transistor and substrate temperature in measurement.

FIG. 32 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 32, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation of the film, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 33:
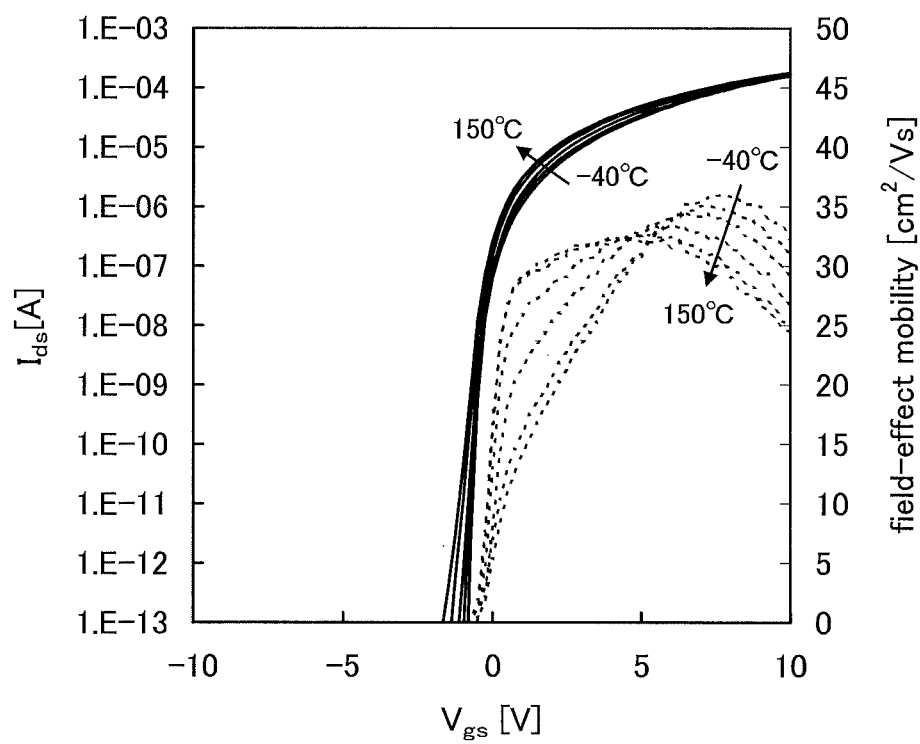
FIG. 33 shows $V_{gs}$ dependence of $I_{ds}$ and field-effect mobility.
Figure 34A:
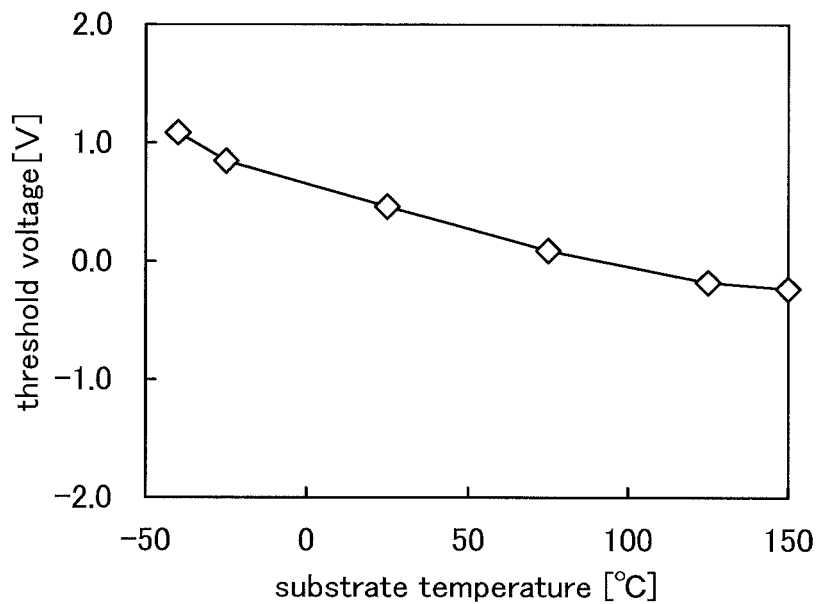
FIG. 34A shows a relation between threshold voltage and substrate temperature.

FIG. 33 shows the $V_{gs}$ dependence of $I_{ds}$ (a solid line) and field-effect mobility (a dotted line). FIG. 34A shows a relation between the substrate temperature and the threshold voltage, and FIG. 34B shows a relation between the substrate temperature and the field-effect mobility.

From FIG. 34A, it is found that the threshold voltage gets lower as the substrate temperature increases. Note that the threshold voltage is decreased from 1.09 V to −0.23 V in the range from −40° C. to 150° C.

Figure 34B:
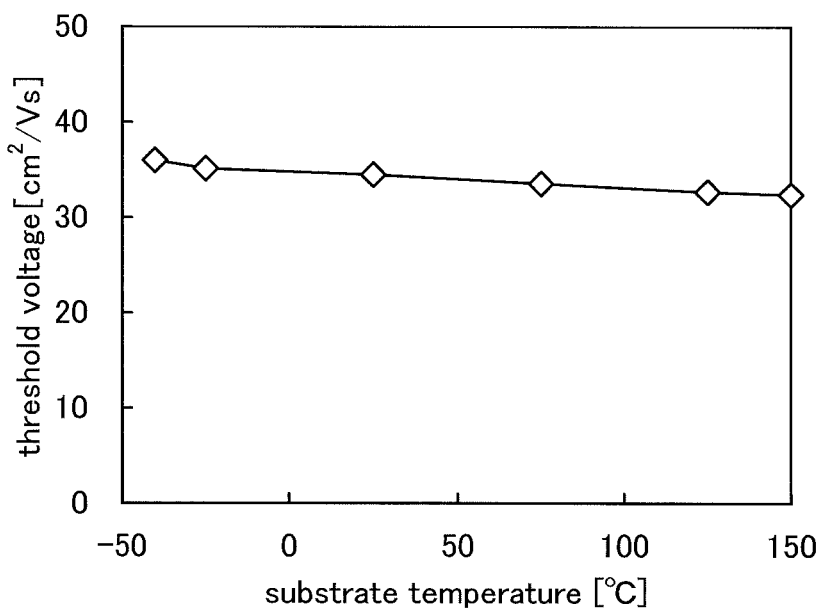
FIG. 34B shows a relation between field-effect mobility and substrate temperature.

From FIG. 34B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor whose channel is formed in such an oxide semiconductor including In, Sn, and Zn as main components, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

This example can be implemented in combination with any of the embodiments and the other examples as appropriate.

Example 2

In this example, an example of a transistor in which an In—Sn—Zn—O film is used as an oxide semiconductor film will be described with reference to FIGS. 35A and 35B.

Figure 35A:
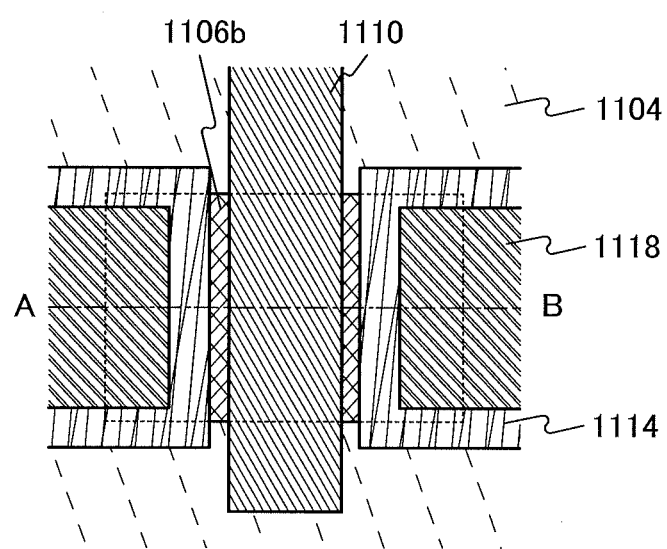
FIGS. 35A and 35B are a top view and a cross-sectional view of a transistor.
Figure 35B:
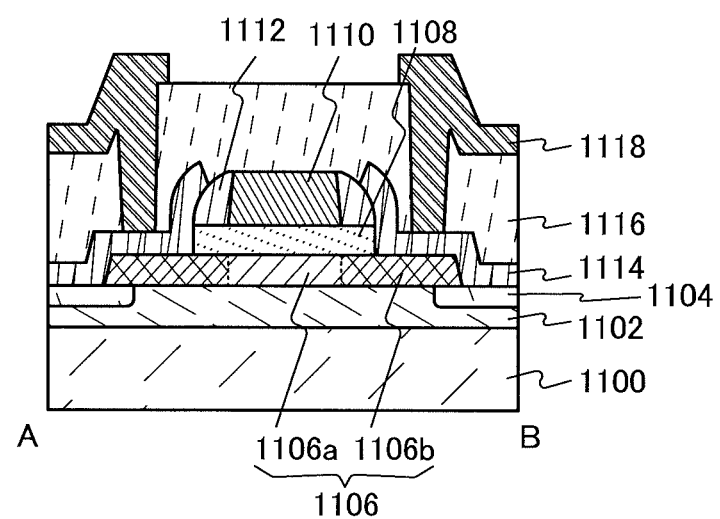

FIGS. 35A and 35B are a top view and a cross-sectional view of a coplanar transistor having a top-gate top-contact structure. FIG. 35A is the top view of the transistor. FIG. 35B illustrates cross section A-B along dashed-dotted line A-B in FIG. 35A.

The transistor illustrated in FIG. 35B includes a substrate 1100; a base insulating film 1102 provided over the substrate 1100; a protective insulating film 1104 provided in the periphery of the base insulating film 1102; an oxide semiconductor film 1106 that is provided over the base insulating film 1102 and the protective insulating film 1104 and includes a high-resistance region 1106a and low-resistance regions 1106b; a gate insulating film 1108 provided over the oxide semiconductor film 1106; a gate electrode 1110 provided to overlap with the oxide semiconductor film 1106 with the gate insulating film 1108 positioned therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced, so that the off-state current of the transistor can be reduced.

This example can be implemented in combination with any of the embodiments and the other examples as appropriate.

Example 3

In this example, another example of a transistor in which an In—Sn—Zn—O film is used as an oxide semiconductor film will be described.

Figure 36A:
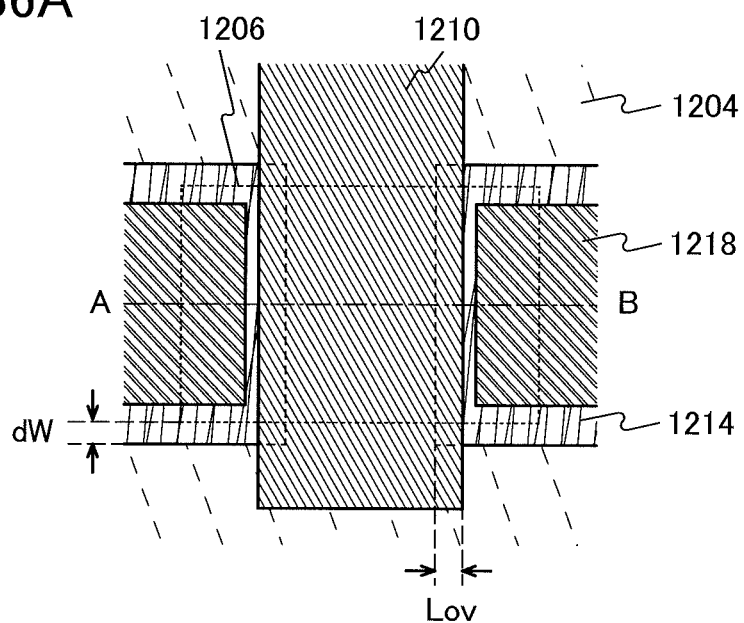
FIGS. 36A and 36B are a top view and a cross-sectional view of a transistor.
Figure 36B:
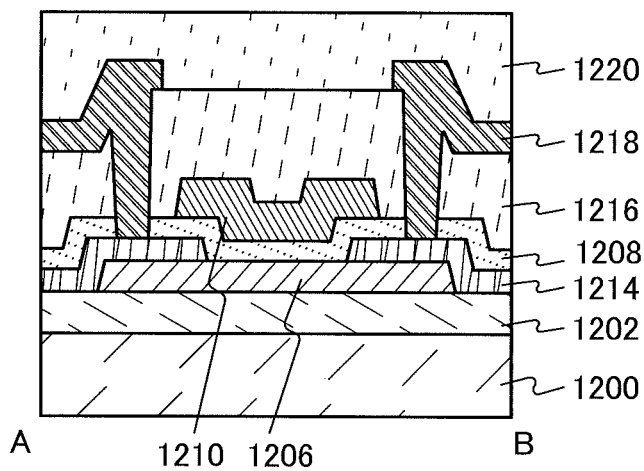

FIGS. 36A and 36B are a top view and a cross-sectional view illustrating a structure of a transistor. FIG. 36A is the top view of the transistor. FIG. 36B is a cross-sectional view along dashed-dotted line A-B in FIG. 36A.

The transistor illustrated in FIG. 36B includes a substrate 1200; a base insulating film 1202 provided over the substrate 1200; an oxide semiconductor film 1206 provided over the base insulating film 1202; a pair of electrodes 1214 in contact with the oxide semiconductor film 1206; a gate insulating film 1208 provided over the oxide semiconductor film 1206 and the pair of electrodes 1214; a gate electrode 1210 provided to overlap with the oxide semiconductor film 1206 with the gate insulating film 1208 positioned therebetween; an interlayer insulating film 1216 provided to cover the gate insulating film 1208 and the gate electrode 1210; wirings 1218 connected to the pair of electrodes 1214 through openings formed in the interlayer insulating film 1216; and a protective film 1220 provided to cover the interlayer insulating film 1216 and the wirings 1218.

As the substrate 1200, a glass substrate was used. As the base insulating film 1202, a silicon oxide film was used. As the oxide semiconductor film 1206, an In—Sn—Zn—O film was used. As the pair of electrodes 1214, a tungsten film was used. As the gate insulating film 1208, a silicon oxide film was used. The gate electrode 1210 had a stacked structure of a tantalum nitride film and a tungsten film. The interlayer insulating film 1216 had a stacked structure of a silicon oxynitride film and a polyimide film. The wirings 1218 had a stacked structure in which a titanium film, an aluminum film, and a titanium film were formed in this order. As the protective film 1220, a polyimide film was used.

Note that in the transistor having the structure illustrated in FIG. 36A, the width of a portion where the gate electrode 1210 overlaps with one of the pair of electrodes 1214 is referred to as Lov. Similarly, the width of a portion of the pair of electrodes 1214, which does not overlap with the oxide semiconductor film 1206, is referred to as dW.

This example can be implemented in combination with any of the embodiments and the other examples as appropriate.

Example 4

One of features of the semiconductor device according to one embodiment of the present invention lies in that the reliability can be improved by the reduction in noise due to external light.

The semiconductor device according to one embodiment of the present invention can be used for display devices, laptops, or image reproducing devices provided with recording media (typically, devices that reproduce the content of recording media such as digital versatile discs (DVDs) and have displays for displaying the reproduced images). Other examples of electronic devices that can include the semiconductor device according to one embodiment of the present invention are mobile phones, portable game machines, personal digital assistants, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 19A to 19D illustrate specific examples of these electronic devices.

Figure 19A:
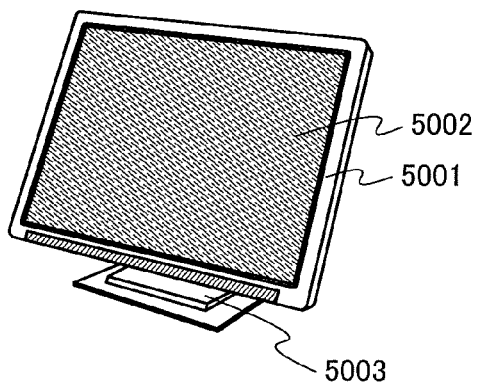
FIGS. 19A to 19D illustrate electronic devices.

FIG. 19A illustrates a display device including a housing 5001, a display portion 5002, a supporting base 5003, and the like. The semiconductor device according to one embodiment of the present invention can be used for the display portion 5002. By using the semiconductor device according to one embodiment of the present invention for the display portion 5002, noise due to external light can be reduced, so that a display device with high reliability can be provided. The display device includes, in its category, any display device for displaying information, such as display devices for personal computers, TV broadcast reception, advertisement, and the like.

Figure 19B:
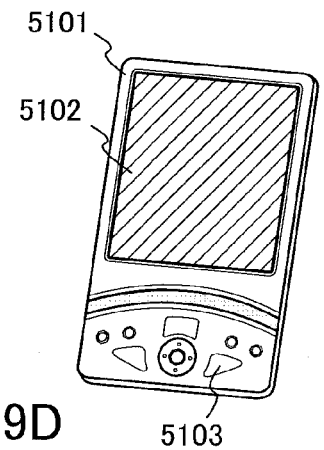

FIG. 19B illustrates a personal digital assistant including a housing 5101, a display portion 5102, operation keys 5103, and the like. The semiconductor device according to one embodiment of the present invention can be used for the display portion 5102. By using the semiconductor device according to one embodiment of the present invention for the display portion 5102, noise due to external light can be reduced, so that a personal digital assistant with high reliability can be provided.

Figure 19C:
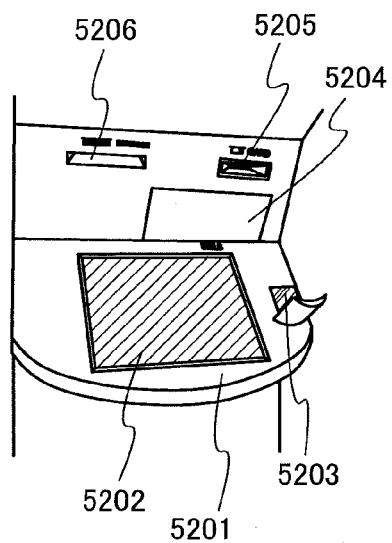

FIG. 19C illustrates an automated teller machine that includes a housing 5201, a display portion 5202, a coin slot 5203, a paper money slot 5204, a card slot 5205, a passbook slot 5206, and the like. The semiconductor device according to one embodiment of the present invention can be used for the display portion 5202. By using the semiconductor device according to one embodiment of the present invention for the display portion 5202, noise due to external light can be reduced, so that an automated teller machine with high reliability can be provided.

Figure 19D:
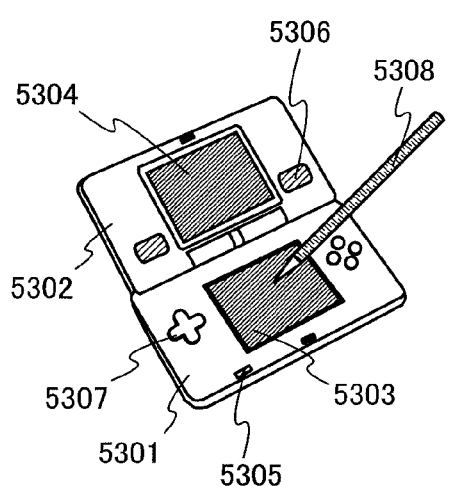

FIG. 19D illustrates a portable game machine that includes a housing 5301, a housing 5302, a display portion 5303, a display portion 5304, a microphone 5305, a speaker 5306, an operation key 5307, a stylus 5308, and the like. The semiconductor device according to one embodiment of the present invention can be used for the display portion 5303 or the display portion 5304. By using the semiconductor device according to one embodiment of the present invention for the display portion 5303 or the display portion 5304, noise due to external light can be reduced, so that a portable game machine with high reliability can be provided. Although the portable game machine in FIG. 19D has the two display portions 5303 and 5304, the number of display portions included in the portable game machine is not limited to two.

This example can be implemented in combination with any of the embodiments and the other examples as appropriate.

This application is based on Japanese Patent Application serial No. 2010-200897 and No. 2011-108192 filed with Japan Patent Office on Sep. 8, 2010 and May 13, 2011, respectively, the entire contents of which are hereby incorporated by reference.

What is claimed is:

1. A semiconductor device comprising:
a first photosensor;
a second photosensor;
a first wiring;
a second wiring;
a third wiring;
a fourth wiring;
a fifth wiring;
a sixth wiring; and
a seventh wiring,
wherein each of the first photosensor and the second photosensor comprises a photoelectric conversion element, a first transistor, a second transistor, and a third transistor,
wherein the first wiring is electrically connected to a first electrode of the photoelectric conversion element of the first photosensor,
wherein the second wiring is electrically connected to a first electrode of the photoelectric conversion element of the second photosensor,
wherein the third wiring is electrically connected to a gate of the first transistor of the first photosensor,
wherein the fourth wiring is electrically connected to a gate of the first transistor of the second photosensor,
wherein the fifth wiring is electrically connected to a gate of the second transistor of the first photosensor,
wherein the sixth wiring is electrically connected to a gate of the second transistor of the second photosensor,
wherein a second electrode of the photoelectric conversion element is electrically connected to a first terminal of the first transistor,
wherein a second terminal of the first transistor is electrically connected to a gate of the third transistor,
wherein a first terminal of the second transistor and a first terminal of the third transistor are electrically connected to each other,
wherein the seventh wiring is electrically connected to a second terminal of the second transistor of the first photosensor and a second terminal of the second transistor of the second photosensor,
wherein the first photosensor is configured to perform a first reset operation by supplying a first potential to the first wiring and a second potential to the third wiring and a first storage operation by supplying a third potential to the first wiring and the second potential to the third wiring when a backlight is turned on,
wherein the second photosensor is configured to perform a second reset operation by supplying the first potential to the second wiring and the second potential to the fourth wiring and a second storage operation by supplying the third potential to the second wiring and the second potential to the fourth wiring when the backlight is turned off,
wherein the first photosensor is configured to perform a first selection operation to output a first output signal to the seventh wiring,
wherein the second photosensor is configured to perform a second selection operation to output a second output signal to the seventh wiring, and wherein the first selection operation and the second selection operation are sequentially performed by sequentially supplying a fourth potential to the fifth wiring and the sixth wiring after the first storage operation and the second storage operation.

2. The semiconductor device according to claim 1, further comprising a display element,
wherein the display element is a liquid crystal element or a light-emitting element.

3. The semiconductor device according to claim 1, further comprising a first display element, a second display element, a third display element, and a fourth display element,
wherein the first photosensor is provided between the first display element and the second display element, and
wherein the first photosensor is provided between the third display element and the fourth display element.

4. A semiconductor device comprising:
a first photosensor;
a second photosensor;
a first wiring;
a second wiring;
a third wiring;
a fourth wiring; and
a fifth wiring,
wherein each of the first photosensor and the second photosensor comprises a photoelectric conversion element, a first transistor, a second transistor, and a third transistor,
wherein the first wiring is electrically connected to a first electrode of the photoelectric conversion element of the first photosensor,
wherein the second wiring is electrically connected to a first electrode of the photoelectric conversion element of the second photosensor,
wherein the third wiring is electrically connected to a gate of the first transistor of the first photosensor,
wherein the fourth wiring is electrically connected to a gate of the first transistor of the second photosensor,
wherein the fifth wiring is electrically connected to a gate of the second transistor of the first photosensor and a gate of the second transistor of the second photosensor,
wherein a second electrode of the photoelectric conversion element is electrically connected to a first terminal of the first transistor,
wherein a second terminal of the first transistor is electrically connected to a gate of the third transistor,
wherein a first terminal of the second transistor and a first terminal of the third transistor are electrically connected to each other,
wherein the first photosensor is configured to perform a first reset operation by supplying a first potential to the first wiring and a second potential to the third wiring and a first storage operation by supplying a third potential to the first wiring and the second potential to the third wiring when a backlight is turned on,
wherein the second photosensor is configured to perform a second reset operation by supplying the first potential to the second wiring and the second potential to the fourth wiring and a second storage operation by supplying the third potential to the second wiring and the second potential to the fourth wiring when the backlight is turned off,
wherein the first photosensor is configured to perform a first selection operation to output a first output signal,
wherein the second photosensor is configured to perform a second selection operation to output a second output signal, and wherein the first selection operation and the second selection operation are concurrently performed by supplying a fourth potential to the fifth wiring after the first storage operation and the second storage operation.

5. The semiconductor device according to claim 4, further comprising a display element,
wherein the display element is a liquid crystal element or a light-emitting element.

6. The semiconductor device according to claim 4, further comprising a first display element, a second display element, a third display element, and a fourth display element,
wherein the first photosensor is provided between the first display element and the second display element, and
wherein the first photosensor is provided between the third display element and the fourth display element.

7. A semiconductor device comprising:
a first photosensor;
a second photosensor;
a first wiring;
a second wiring;
a third wiring;
a fourth wiring;
a fifth wiring;
a sixth wiring; and
a seventh wiring,
wherein each of the first photosensor and the second photosensor comprises a photoelectric conversion element, a first transistor, a second transistor, and a third transistor,
wherein the first wiring is electrically connected to a first electrode of the photoelectric conversion element of the first photosensor,
wherein the second wiring is electrically connected to a first electrode of the photoelectric conversion element of the second photosensor,
wherein the third wiring is electrically connected to a gate of the first transistor of the first photosensor,
wherein the fourth wiring is electrically connected to a gate of the first transistor of the second photosensor,
wherein the fifth wiring is electrically connected to a gate of the second transistor of the first photosensor,
wherein the sixth wiring is electrically connected to a gate of the second transistor of the second photosensor,
wherein a second electrode of the photoelectric conversion element is electrically connected to a first terminal of the first transistor,
wherein a second terminal of the first transistor is electrically connected to a gate of the third transistor,
wherein a first terminal of the second transistor and a first terminal of the third transistor are electrically connected to each other,
wherein the seventh wiring is electrically connected to a second terminal of the second transistor of the first photosensor and a second terminal of the second transistor of the second photosensor,
wherein the first photosensor is configured to perform a first reset operation by supplying a first potential to the first wiring and a second potential to the third wiring and a first storage operation by supplying a third potential to the first wiring and the second potential to the third wiring when a backlight is turned on,
wherein the second photosensor is configured to perform a second reset operation by supplying the first potential to the second wiring and the second potential to the fourth wiring and a second storage operation by supplying the third potential to the second wiring and the second potential to the fourth wiring when the backlight is turned off, wherein the first photosensor is configured to perform a first selection operation to output a first output signal to the seventh wiring, wherein the second photosensor is configured to perform a second selection operation to output a second output signal to the seventh wiring, wherein the first selection operation and the second selection operation are sequentially performed by sequentially supplying a fourth potential to the fifth wiring and the sixth wiring after the first storage operation and the second storage operation, and wherein the first transistor comprises a channel formation region comprising an oxide semiconductor layer.

8. The semiconductor device according to claim 7, wherein the oxide semiconductor layer comprises any one of an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor.

9. The semiconductor device according to claim 7, wherein a hydrogen concentration in the oxide semiconductor layer measured by secondary ion mass spectrometry is less than or equal to $5 \times 10^{19}$ atoms/cm$^3$.

10. The semiconductor device according to claim 7, wherein a sodium concentration in the oxide semiconductor layer measured by secondary ion mass spectrometry is less than or equal to $5 \times 10^{16}$ atoms/cm$^3$.

11. The semiconductor device according to claim 7, wherein the photoelectric conversion element is a photodiode or a phototransistor.

12. The semiconductor device according to claim 7, further comprising a display element,
wherein the display element is a liquid crystal element or a light-emitting element.

13. The semiconductor device according to claim 7, wherein the backlight comprises at least one of a light source emitting visible light and a light source emitting infrared light.

14. A semiconductor device comprising:
a first photosensor;
a second photosensor;
a first wiring;
a second wiring;
a third wiring;
a fourth wiring; and
a fifth wiring,
wherein each of the first photosensor and the second photosensor comprises a photoelectric conversion element, a first transistor, a second transistor, and a third transistor,
wherein the first wiring is electrically connected to a first electrode of the photoelectric conversion element of the first photosensor, wherein the second wiring is electrically connected to a first electrode of the photoelectric conversion element of the second photosensor, wherein the third wiring is electrically connected to a gate of the first transistor of the first photosensor, wherein the fourth wiring is electrically connected to a gate of the first transistor of the second photosensor, wherein the fifth wiring is electrically connected to a gate of the second transistor of the first photosensor and a gate of the second transistor of the second photosensor, wherein a second electrode of the photoelectric conversion element is electrically connected to a first terminal of the first transistor, wherein a second terminal of the first transistor is electrically connected to a gate of the third transistor, wherein a first terminal of the second transistor and a first terminal of the third transistor are electrically connected to each other, wherein the first photosensor is configured to perform a first reset operation by supplying a first potential to the first wiring and a second potential to the third wiring and a first storage operation by supplying a third potential to the first wiring and the second potential to the third wiring when a backlight is turned on, wherein the second photosensor is configured to perform a second reset operation by supplying the first potential to the second wiring and the second potential to the fourth wiring and a second storage operation by supplying the third potential to the second wiring and the second potential to the fourth wiring when the backlight is turned off, wherein the first photosensor is configured to perform a first selection operation to output a first output signal, wherein the second photosensor is configured to perform a second selection operation to output a second output signal, wherein the first selection operation and the second selection operation are concurrently performed by supplying a fourth potential to the fifth wiring after the first storage operation and the second storage operation, and wherein the first transistor comprises a channel formation region comprising an oxide semiconductor layer.

15. The semiconductor device according to claim 14, wherein the oxide semiconductor layer comprises any one of an In—Sn—Ga—Zn—O-based oxide semiconductor, an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor.

16. The semiconductor device according to claim 14, wherein a hydrogen concentration in the oxide semiconductor layer measured by secondary ion mass spectrometry is less than or equal to $5 \times 10^{19}$ atoms/cm$^3$.

17. The semiconductor device according to claim 14, wherein a sodium concentration in the oxide semiconductor layer measured by secondary ion mass spectrometry is less than or equal to $5 \times 10^{16}$ atoms/cm$^3$.

18. The semiconductor device according to claim 14, wherein the photoelectric conversion element is a photodiode or a phototransistor.

19. The semiconductor device according to claim 14, further comprising a display element,
wherein the display element is a liquid crystal element or a light-emitting element.

20. The semiconductor device according to claim 14, wherein the backlight comprises at least one of a light source emitting visible light and a light source emitting infrared light.

* * * * *